(12) United States Patent
Lawrence

(10) Patent No.: US 11,107,003 B2
(45) Date of Patent: Aug. 31, 2021

(54) COMPUTER ARCHITECTURE FOR EMULATING A TRIANGLE LATTICE CORRELITHM OBJECT GENERATOR IN A CORRELITHM OBJECT PROCESSING SYSTEM

(71) Applicant: BANK OF AMERICA CORPORATION, Charlotte, NC (US)

(72) Inventor: Patrick N. Lawrence, Plano, TX (US)

(73) Assignee: Bank of America Corporation, Charlotte, NC (US)

( * ) Notice: Subject to any disclaimer, the term of this patent is extended or adjusted under 35 U.S.C. 154(b) by 349 days.

(21) Appl. No.: 16/381,842

(22) Filed: Apr. 11, 2019

(65) Prior Publication Data

US 2020/0327447 A1    Oct. 15, 2020

(51) Int. Cl.
G06N 20/00    (2019.01)
G06K 9/62    (2006.01)
H03M 7/00    (2006.01)

(52) U.S. Cl.
CPC ........... G06N 20/00 (2019.01); G06K 9/6215 (2013.01); H03M 7/00 (2013.01)

(58) Field of Classification Search
CPC ...... G06N 20/00; G06N 5/022; G06K 9/6215; H03M 7/00
See application file for complete search history.

(56) References Cited

U.S. PATENT DOCUMENTS

| | | | |
|---|---|---|---|
| 5,249,274 A | 9/1993 | Sztipanovits et al. | |
| 5,946,673 A | 8/1999 | Francone et al. | |
| 6,035,057 A | 3/2000 | Hoffman | |
| 6,044,366 A | 3/2000 | Graffe et al. | |
| 6,167,391 A | 12/2000 | Lawrence | |
| 6,278,799 B1 | 8/2001 | Hoffman | |
| 6,553,365 B1 | 4/2003 | Summerlin et al. | |
| 6,809,740 B1 * | 10/2004 | Weed ................... | H04N 1/6019 345/589 |
| 6,941,287 B1 | 9/2005 | Vaidyanathan et al. | |
| 6,943,686 B2 | 9/2005 | Allen | |
| 6,947,913 B1 | 9/2005 | Lawrence | |
| 7,015,835 B2 | 3/2006 | Lawrence et al. | |
| 7,031,969 B2 | 4/2006 | Lawrence et al. | |
| 7,246,129 B2 | 7/2007 | Lawrence et al. | |
| 7,310,622 B2 | 12/2007 | Lawrence et al. | |
| 7,349,928 B2 | 3/2008 | Lawrence et al. | |

(Continued)

OTHER PUBLICATIONS

Hibbard, W. L., et al., "A Lattice Model for Data Display," in Proceedings Visualization '94, Oct. 1994.*

(Continued)

*Primary Examiner* — Xuemei G Chen
(74) *Attorney, Agent, or Firm* — Michael A. Springs

(57) ABSTRACT

A device configured to emulate a triangle lattice correlithm object generator includes multiple processing stages that operate together to output a triangle lattice correlithm object. A triangle lattice correlithm object has a generally triangular shape and is formed by a first sub-lattice correlithm object, a second sub-lattice correlithm object that is some number of bits away from the first sub-lattice correlithm object in n-dimensional space, and a third sub-lattice correlithm object that is some number of bits away from the second sub-lattice correlithm object in n-dimensional space.

28 Claims, 40 Drawing Sheets

(56) References Cited

U.S. PATENT DOCUMENTS

| | | | |
|---|---|---|---|
| 7,418,470 | B2 | 8/2008 | Howard et al. |
| 7,526,461 | B2 | 4/2009 | Srinivasa et al. |
| 7,730,121 | B2 | 7/2010 | Howard et al. |
| 7,941,479 | B2 | 5/2011 | Howard et al. |
| 8,412,651 | B2 | 4/2013 | Paiva et al. |
| 8,521,669 | B2 | 8/2013 | Knoblauch |
| 8,762,130 | B1 | 6/2014 | Diaconescu et al. |
| 9,286,291 | B2 | 3/2016 | Bufe et al. |
| 9,460,075 | B2 | 10/2016 | Mungi et al. |
| 9,495,355 | B2 | 11/2016 | Mungi et al. |
| 9,720,998 | B2 | 8/2017 | Wang et al. |
| 9,721,190 | B2 | 8/2017 | Vijayanarasimhan et al. |
| 9,785,983 | B2 | 10/2017 | Zhao et al. |
| 10,019,650 | B1 | 7/2018 | Lawrence |
| 10,037,478 | B1 | 7/2018 | Lawrence |
| 10,049,305 | B2 | 8/2018 | Vijayanarasimhan et al. |
| 10,169,329 | B2 | 1/2019 | Futrell et al. |
| 10,366,141 | B2* | 7/2019 | Lawrence .................. G06F 7/00 |
| 2003/0158850 | A1 | 8/2003 | Lawrence et al. |
| 2003/0172368 | A1 | 9/2003 | Alumbaugh et al. |
| 2004/0044940 | A1 | 3/2004 | Lawrence et al. |
| 2005/0203947 | A1* | 9/2005 | Matzke .................. G06N 99/00 |
| 2015/0149155 | A1 | 5/2015 | Zadeh |
| 2017/0161606 | A1 | 6/2017 | Duan et al. |
| 2018/0012993 | A1 | 1/2018 | Cheng et al. |
| 2018/0157994 | A1 | 6/2018 | Levy |
| 2019/0164058 | A1* | 5/2019 | Lawrence ............... G06N 20/00 |
| 2020/0311142 | A1* | 10/2020 | Edelman ................ G06F 16/278 |
| 2020/0328905 | A1* | 10/2020 | Yeh ..................... H04L 67/2842 |

OTHER PUBLICATIONS

Lawrence, P. N., "Computer Architecture for Emulating a Bidirectional String Correlithm Object Generator in a Correlithm Object Processing System," U.S. Appl. No. 16/381,926, filed Apr. 11, 2019, 169 pages Lawrence, P. N., "Computer Architecture for Emulating an Irregular Lattice Correlithm Object Generator in a Correlithm Object Processing System," U.S. Appl. No. 16/381,985, filed Apr. 11, 2019, 166 pages.

Lawrence, P. N., "Computer Architecture for Emulating a Quadrilateral Lattice Correlithm Object Generator in a Correlithm Object Processing System," U.S. Appl. No. 16/382,006, filed Apr. 11, 2019, 170 pages.

Lawrence, P. N., "Computer Architecture for Emulating Intersecting Multiple String Correlithm Objects in a Correlithm Object Processing System," U.S. Appl. No. 16/382,035, filed Apr. 11, 2019, 165 pages.

Lawrence, P. N., "Computer Architecture for Emulating a Link Node in a Correlithm Object Processing System," U.S. Appl. No. 16/382,064, filed Apr. 11, 2019, 165 pages.

Meersman, R. et al., "On the Move to Meaningful Internet Systems 2005: CoopIS, DOA and ODBASE," OTM Confederated International Conferences CoopIS, DOA and ODBASE Oct. 2005 Agia Napa, Cyprus, Proceedings, Part I, Oct. 31-Nov. 4, 2005, pp. 763-779.

Lawrence, P. N., "Correlithm Object Technology," Apr. 2004, 229 pages.

* cited by examiner

COMPUTER ARCHITECTURE FOR EMULATING A TRIANGLE LATTICE CORRELITHM OBJECT GENERATOR IN A CORRELITHM OBJECT PROCESSING SYSTEM

TECHNICAL FIELD

The present disclosure relates generally to computer architectures for emulating a processing system, and more specifically to a computer architecture for emulating a triangle lattice correlithm object generator in a correlithm object processing system.

BACKGROUND

Conventional computers are highly attuned to using operations that require manipulating ordinal numbers, especially ordinal binary integers. The value of an ordinal number corresponds with its position in a set of sequentially ordered number values. These computers use ordinal binary integers to represent, manipulate, and store information. These computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations.

Ordinal based number systems only provide information about the sequence order of the numbers themselves based on their numeric values. Ordinal numbers do not provide any information about any other types of relationships for the data being represented by the numeric values such as similarity. For example, when a conventional computer uses ordinal numbers to represent data samples (e.g. images or audio signals), different data samples are represented by different numeric values. The different numeric values do not provide any information about how similar or dissimilar one data sample is from another. Unless there is an exact match in ordinal number values, conventional systems are unable to tell if a data sample matches or is similar to any other data samples. As a result, conventional computers are unable to use ordinal numbers by themselves for comparing different data samples and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system. The ability to compare unknown data samples to known data samples is crucial for many security applications such as facial recognition, voice recognition, and fraud detection.

Thus, it is desirable to provide a solution that allows computing systems to efficiently determine how similar different data samples are to each other and to perform operations based on their similarity.

SUMMARY

Conventional computers are highly attuned to using operations that require manipulating ordinal numbers, especially ordinal binary integers. The value of an ordinal number corresponds with its position in a set of sequentially ordered number values. These computers use ordinal binary integers to represent, manipulate, and store information. These computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations.

Ordinal based number systems only provide information about the sequence order of the numbers themselves based on their numeric values. Ordinal numbers do not provide any information about any other types of relationships for the data being represented by the numeric values such as similarity. For example, when a conventional computer uses ordinal numbers to represent data samples (e.g. images or audio signals), different data samples are represented by different numeric values. The different numeric values do not provide any information about how similar or dissimilar one data sample is from another. Unless there is an exact match in ordinal number values, conventional systems are unable to tell if a data sample matches or is similar to any other data samples. As a result, conventional computers are unable to use ordinal numbers by themselves for comparing different data samples and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system. The ability to compare unknown data samples to known data samples is crucial for many applications such as security application (e.g. face recognition, voice recognition, and fraud detection).

The system described in the present application provides a technical solution that enables the system to efficiently determine how similar different objects are to each other and to perform operations based on their similarity. In contrast to conventional systems, the system uses an unconventional configuration to perform various operations using categorical numbers and geometric objects, also referred to as correlithm objects, instead of ordinal numbers. Using categorical numbers and correlithm objects on a conventional device involves changing the traditional operation of the computer to support representing and manipulating concepts as correlithm objects. A device or system may be configured to implement or emulate a special purpose computing device capable of performing operations using correlithm objects. Implementing or emulating a correlithm object processing system improves the operation of a device by enabling the device to perform non-binary comparisons (i.e. match or no match) between different data samples. This enables the device to quantify a degree of similarity between different data samples. This increases the flexibility of the device to work with data samples having different data types and/or formats, and also increases the speed and performance of the device when performing operations using data samples. These technical advantages and other improvements to the device are described in more detail throughout the disclosure.

In one embodiment, the system is configured to use binary integers as categorical numbers rather than ordinal numbers which enables the system to determine how similar a data sample is to other data samples. Categorical numbers provide information about similar or dissimilar different data samples are from each other. For example, categorical numbers can be used in facial recognition applications to represent different images of faces and/or features of the faces. The system provides a technical advantage by allowing the system to assign correlithm objects represented by categorical numbers to different data samples based on how similar they are to other data samples. As an example, the system is able to assign correlithm objects to different images of people such that the correlithm objects can be directly used to determine how similar the people in the images are to each other. In other words, the system can use correlithm objects in facial recognition applications to quickly determine whether a captured image of a person matches any previously stored images without relying on conventional signal processing techniques.

Correlithm object processing systems use new types of data structures called correlithm objects that improve the way a device operates, for example, by enabling the device to perform non-binary data set comparisons and to quantify the similarity between different data samples. Correlithm objects are data structures designed to improve the way a device stores, retrieves, and compares data samples in memory. Correlithm objects also provide a data structure that is independent of the data type and format of the data samples they represent. Correlithm objects allow data samples to be directly compared regardless of their original data type and/or format.

A correlithm object processing system uses a combination of a sensor table, a node table, and/or an actor table to provide a specific set of rules that improve computer-related technologies by enabling devices to compare and to determine the degree of similarity between different data samples regardless of the data type and/or format of the data sample they represent. The ability to directly compare data samples having different data types and/or formatting is a new functionality that cannot be performed using conventional computing systems and data structures.

In addition, correlithm object processing system uses a combination of a sensor table, a node table, and/or an actor table to provide a particular manner for transforming data samples between ordinal number representations and correlithm objects in a correlithm object domain. Transforming data samples between ordinal number representations and correlithm objects involves fundamentally changing the data type of data samples between an ordinal number system and a categorical number system to achieve the previously described benefits of the correlithm object processing system.

Using correlithm objects allows the system or device to compare data samples (e.g. images) even when the input data sample does not exactly match any known or previously stored input values. For example, an input data sample that is an image may have different lighting conditions than the previously stored images. The differences in lighting conditions can make images of the same person appear different from each other. The device uses an unconventional configuration that implements a correlithm object processing system that uses the distance between the data samples which are represented as correlithm objects and other known data samples to determine whether the input data sample matches or is similar to the other known data samples. Implementing a correlithm object processing system fundamentally changes the device and the traditional data processing paradigm. Implementing the correlithm object processing system improves the operation of the device by enabling the device to perform non-binary comparisons of data samples. In other words, the device can determine how similar the data samples are to each other even when the data samples are not exact matches. In addition, the device can quantify how similar data samples are to one another. The ability to determine how similar data samples are to each other is unique and distinct from conventional computers that can only perform binary comparisons to identify exact matches.

A string correlithm object comprising a series of adjacent sub-string correlithm objects whose cores overlap with each other to permit data values to be correlated with each other in n-dimensional space. The distance between adjacent sub-string correlithm objects can be selected to create a tighter or looser correlation among the elements of the string correlithm object in n-dimensional space. Thus, where data values have a pre-existing relationship with each other in the real-world, those relationships can be maintained in n-dimensional space if they are represented by sub-string correlithm objects of a string correlithm object. In addition, new data values can be represented by sub-string correlithm objects by interpolating the distance between those and other data values and representing that interpolation with sub-string correlithm objects of a string correlithm object in n-dimensional space. The ability to migrate these relationships between data values in the real world to relationships among correlithm objects provides a significant advance in the ability to record, store, and faithfully reproduce data within different computing environments. Furthermore, the use of string correlithm objects significantly reduces the computational burden of comparing time-varying sequences of data, or multi-dimensional data objects, with respect to conventional forms of executing dynamic time warping algorithms. The reduced computational burden results in faster processing speeds and reduced loads on memory structures used to perform the comparison of string correlithm objects.

The problems associated with comparing data sets and identifying matches based on the comparison are problems necessarily rooted in computer technologies. As described above, conventional systems are limited to a binary comparison that can only determine whether an exact match is found. Emulating a correlithm object processing system provides a technical solution that addresses problems associated with comparing data sets and identifying matches. Using correlithm objects to represent data samples fundamentally changes the operation of a device and how the device views data samples. By implementing a correlithm object processing system, the device can determine the distance between the data samples and other known data samples to determine whether the input data sample matches or is similar to the other known data samples. In addition, the device can determine a degree of similarity that quantifies how similar different data samples are to one another.

Certain embodiments of the present disclosure may include some, all, or none of these advantages. These advantages and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

FIGS. 1-5 describe various embodiments of how a correlithm object processing system may be implemented or emulated in hardware, such as a special purpose computer. FIGS. 6-19 describe various embodiments of how a correlithm object processing system can generate and use string correlithm objects to record and faithfully playback data values.

Figure 1:
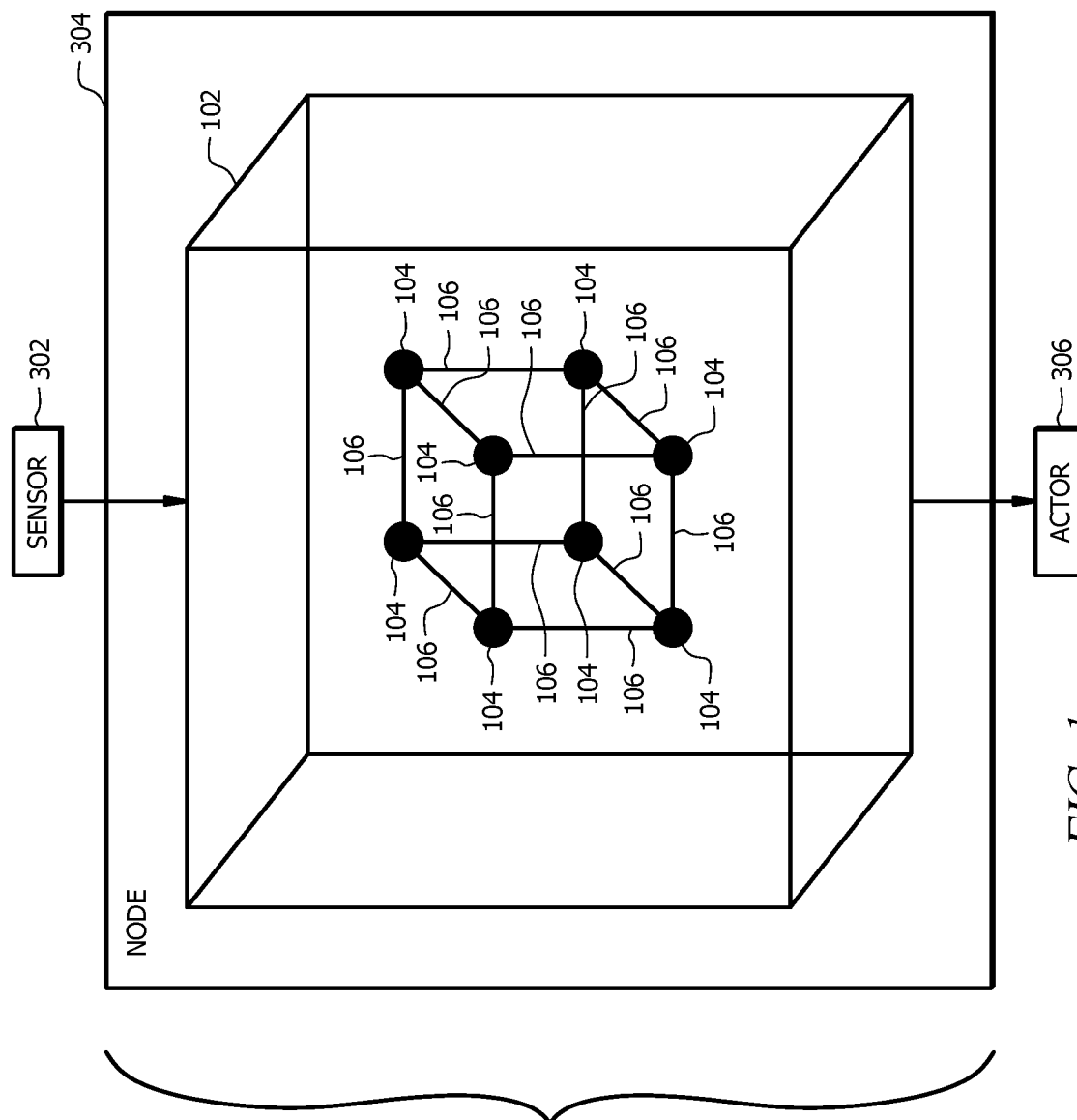
FIG. 1 is a schematic view of an embodiment of a special purpose computer implementing correlithm objects in an n-dimensional space.
Figure 1:
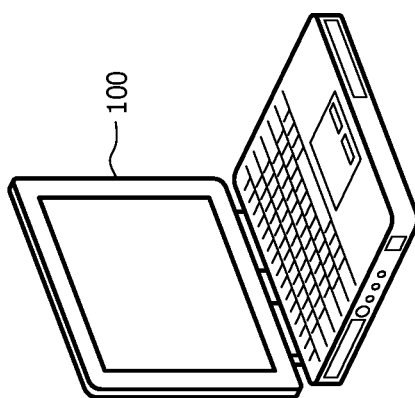

FIG. 1 is a schematic view of an embodiment of a user device 100 implementing correlithm objects 104 in an n-dimensional space 102. Examples of user devices 100 include, but are not limited to, desktop computers, mobile phones, tablet computers, laptop computers, or other special purpose computer platform. The user device 100 is configured to implement or emulate a correlithm object processing system that uses categorical numbers to represent data samples as correlithm objects 104 in a high-dimensional space 102, for example a high-dimensional binary cube. Additional information about the correlithm object processing system is described in FIG. 3. Additional information about configuring the user device 100 to implement or emulate a correlithm object processing system is described in FIG. 5.

Conventional computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations. Ordinal based number systems only provide information about the sequence order of the numbers themselves based on their numeric values. Ordinal numbers do not provide any information about any other types of relationships for the data being represented by the numeric values, such as similarity. For example, when a conventional computer uses ordinal numbers to represent data samples (e.g. images or audio signals), different data samples are represented by different numeric values. The different numeric values do not provide any information about how similar or dissimilar one data sample is from another. In other words, conventional computers are only able to make binary comparisons of data samples which only results in determining whether the data samples match or do not match. Unless there is an exact match in ordinal number values, conventional systems are unable to tell if a data sample matches or is similar to any other data samples. As a result, conventional computers are unable to use ordinal numbers by themselves for determining similarity between different data samples, and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system.

In contrast to conventional systems, the user device 100 operates as a special purpose machine for implementing or emulating a correlithm object processing system. Implementing or emulating a correlithm object processing system improves the operation of the user device 100 by enabling the user device 100 to perform non-binary comparisons (i.e. match or no match) between different data samples. This enables the user device 100 to quantify a degree of similarity between different data samples. This increases the flexibility of the user device 100 to work with data samples having different data types and/or formats, and also increases the speed and performance of the user device 100 when performing operations using data samples. These improvements and other benefits to the user device 100 are described in more detail below and throughout the disclosure.

For example, the user device 100 employs the correlithm object processing system to allow the user device 100 to compare data samples even when the input data sample does not exactly match any known or previously stored input values. Implementing a correlithm object processing system fundamentally changes the user device 100 and the traditional data processing paradigm. Implementing the correlithm object processing system improves the operation of the user device 100 by enabling the user device 100 to perform non-binary comparisons of data samples. In other words, the user device 100 is able to determine how similar the data samples are to each other even when the data samples are not exact matches. In addition, the user device 100 is able to quantify how similar data samples are to one another. The ability to determine how similar data samples are to each other is unique and distinct from conventional computers that can only perform binary comparisons to identify exact matches.

The user device's 100 ability to perform non-binary comparisons of data samples also fundamentally changes traditional data searching paradigms. For example, conventional search engines rely on finding exact matches or exact partial matches of search tokens to identify related data samples. For instance, conventional text-based search engines are limited to finding related data samples that have text that exactly matches other data samples. These search engines only provide a binary result that identifies whether or not an exact match was found based on the search token. Implementing the correlithm object processing system improves the operation of the user device 100 by enabling the user device 100 to identify related data samples based on how similar the search token is to other data sample. These improvements result in increased flexibility and faster search time when using a correlithm object processing system. The ability to identify similarities between data samples expands the capabilities of a search engine to include data samples that may not have an exact match with a search token but are still related and similar in some aspects. The user device 100 is also able to quantify how similar data samples are to each other based on characteristics besides exact matches to the search token. Implementing the correlithm object processing system involves operating the user device 100 in an unconventional manner to achieve these technological improvements as well as other benefits described below for the user device 100.

Computing devices typically rely on the ability to compare data sets (e.g. data samples) to one another for processing. For example, in security or authentication applications a computing device is configured to compare an input of an unknown person to a data set of known people (or biometric information associated with these people). The problems associated with comparing data sets and identifying matches based on the comparison are problems necessarily rooted in computer technologies. As described above, conventional systems are limited to a binary comparison that can only determine whether an exact match is found. As an example, an input data sample that is an image of a person may have different lighting conditions than previously stored images. In this example, different lighting conditions can make images of the same person appear different from each other. Conventional computers are unable to distinguish between two images of the same person with different lighting conditions and two images of two different people without complicated signal processing. In both of these cases, conventional computers can only determine that the images are different. This is because conventional computers rely on manipulating ordinal numbers for processing.

In contrast, the user device 100 uses an unconventional configuration that uses correlithm objects to represent data samples. Using correlithm objects to represent data samples fundamentally changes the operation of the user device 100 and how the device views data samples. By implementing a correlithm object processing system, the user device 100 can determine the distance between the data samples and other known data samples to determine whether the input data sample matches or is similar to the other known data samples, as explained in detail below. Unlike the conventional computers described in the previous example, the user device 100 is able to distinguish between two images of the same person with different lighting conditions and two images of two different people by using correlithm objects 104. Correlithm objects allow the user device 100 to determine whether there are any similarities between data samples, such as between two images that are different from each other in some respects but similar in other respects. For example, the user device 100 is able to determine that despite different lighting conditions, the same person is present in both images.

In addition, the user device 100 is able to determine a degree of similarity that quantifies how similar different data samples are to one another. Implementing a correlithm object processing system in the user device 100 improves the operation of the user device 100 when comparing data sets and identifying matches by allowing the user device 100 to perform non-binary comparisons between data sets and to quantify the similarity between different data samples. In addition, using a correlithm object processing system results in increased flexibility and faster search times when comparing data samples or data sets. Thus, implementing a correlithm object processing system in the user device 100 provides a technical solution to a problem necessarily rooted in computer technologies.

The ability to implement a correlithm object processing system provides a technical advantage by allowing the system to identify and compare data samples regardless of whether an exact match has been previous observed or stored. In other words, using the correlithm object processing system the user device 100 is able to identify similar data samples to an input data sample in the absence of an exact match. This functionality is unique and distinct from conventional computers that can only identify data samples with exact matches.

Examples of data samples include, but are not limited to, images, files, text, audio signals, biometric signals, electric signals, or any other suitable type of data. A correlithm object 104 is a point in the n-dimensional space 102, sometimes called an "n-space." The value of represents the number of dimensions of the space. For example, an n-dimensional space 102 may be a 3-dimensional space, a 50-dimensional space, a 100-dimensional space, or any other suitable dimension space. The number of dimensions depends on its ability to support certain statistical tests, such as the distances between pairs of randomly chosen points in the space approximating a normal distribution. In some embodiments, increasing the number of dimensions in the n-dimensional space 102 modifies the statistical properties of the system to provide improved results. Increasing the number of dimensions increases the probability that a correlithm object 104 is similar to other adjacent correlithm objects 104. In other words, increasing the number of dimensions increases the correlation between how close a pair of correlithm objects 104 are to each other and how similar the correlithm objects 104 are to each other.

Correlithm object processing systems use new types of data structures called correlithm objects 104 that improve the way a device operates, for example, by enabling the device to perform non-binary data set comparisons and to quantify the similarity between different data samples. Correlithm objects 104 are data structures designed to improve the way a device stores, retrieves, and compares data samples in memory. Unlike conventional data structures, correlithm objects 104 are data structures where objects can be expressed in a high-dimensional space such that distance 106 between points in the space represent the similarity between different objects or data samples. In other words, the distance 106 between a pair of correlithm objects 104 in the n-dimensional space 102 indicates how similar the correlithm objects 104 are from each other and the data samples they represent. Correlithm objects 104 that are close to each other are more similar to each other than correlithm objects 104 that are further apart from each other. For example, in a facial recognition application, correlithm objects 104 used to represent images of different types of glasses may be relatively close to each other compared to correlithm objects 104 used to represent images of other features such as facial hair. An exact match between two data samples occurs when their corresponding correlithm objects 104 are the same or have no distance between them. When two data samples are not exact matches but are similar, the distance between their correlithm objects 104 can be used to indicate their similarities. In other words, the distance 106 between correlithm objects 104 can be used to identify both data samples that exactly match each other as well as data samples that do not match but are similar. This feature is unique to a correlithm processing system and is unlike conventional computers that are unable to detect when data samples are different but similar in some aspects.

Correlithm objects 104 also provide a data structure that is independent of the data type and format of the data samples they represent. Correlithm objects 104 allow data samples to be directly compared regardless of their original data type and/or format. In some instances, comparing data samples as correlithm objects 104 is computationally more efficient and faster than comparing data samples in their original format. For example, comparing images using conventional data structures involves significant amounts of image processing which is time consuming and consumes processing resources. Thus, using correlithm objects 104 to represent data samples provides increased flexibility and improved performance compared to using other conventional data structures.

In one embodiment, correlithm objects 104 may be represented using categorical binary strings. The number of bits used to represent the correlithm object 104 corresponds with the number of dimensions of the n-dimensional space 102 where the correlithm object 102 is located. For example, each correlithm object 104 may be uniquely identified using a 64-bit string in a 64-dimensional space 102. As another example, each correlithm object 104 may be uniquely identified using a 10-bit string in a 10-dimensional space 102. In other examples, correlithm objects 104 can be identified using any other suitable number of bits in a string that corresponds with the number of dimensions in the n-dimensional space 102.

In this configuration, the distance 106 between two correlithm objects 104 can be determined based on the differences between the bits of the two correlithm objects 104. In other words, the distance 106 between two correlithm objects can be determined based on how many individual bits differ between the correlithm objects 104. The distance 106 between two correlithm objects 104 can be computed using Hamming distance, anti-Hamming distance or any other suitable technique.

As an example, using a 10-dimensional space 102, a first correlithm object 104 is represented by a first 10-bit string (1001011011) and a second correlithm object 104 is represented by a second 10-bit string (1000011011). The Hamming distance corresponds with the number of bits that differ between the first correlithm object 104 and the second correlithm object 104. Conversely, the anti-Hamming distance corresponds with the number of bits that are alike between the first correlithm object 104 and the second correlithm object 104. Thus, the Hamming distance between the first correlithm object 104 and the second correlithm object 104 can be computed as follows:

$$\begin{array}{r}1001011011\\ \underline{1000011011}\\ 0001000000\end{array}$$

In this example, the Hamming distance is equal to one because only one bit differs between the first correlithm object 104 and the second correlithm object. Conversely, the anti-Hamming distance is nine because nine bits are the same between the first and second correlithm objects 104. As another example, a third correlithm object 104 is represented by a third 10-bit string (0110100100). In this example, the Hamming distance between the first correlithm object 104 and the third correlithm object 104 can be computed as follows:

$$\begin{array}{r}1001011011\\ \underline{0110100100}\\ 1111111111\end{array}$$

The Hamming distance is equal to ten because all of the bits are different between the first correlithm object 104 and the third correlithm object 104. Conversely, the anti-Hamming distance is zero because none of the bits are the same between the first and third correlithm objects 104. In the previous example, a Hamming distance equal to one indicates that the first correlithm object 104 and the second correlithm object 104 are close to each other in the n-dimensional space 102, which means they are similar to each other. Similarly, an anti-Hamming distance equal to nine also indicates that the first and second correlithm objects are close to each other in n-dimensional space 102, which also means they are similar to each other. In the second example, a Hamming distance equal to ten indicates that the first correlithm object 104 and the third correlithm object 104 are further from each other in the n-dimensional space 102 and are less similar to each other than the first correlithm object 104 and the second correlithm object 104. Similarly, an anti-Hamming distance equal to zero also indicates that that the first and third correlithm objects 104 are further from each other in n-dimensional space 102 and are less similar to each other than the first and second correlithm objects 104. In other words, the similarity between a pair of correlithm objects can be readily determined based on the distance between the pair correlithm objects, as represented by either Hamming distances or anti-Hamming distances.

As another example, the distance between a pair of correlithm objects 104 can be determined by performing an XOR operation between the pair of correlithm objects 104 and counting the number of logical high values in the binary string. The number of logical high values indicates the number of bits that are different between the pair of correlithm objects 104 which also corresponds with the Hamming distance between the pair of correlithm objects 104.

In another embodiment, the distance 106 between two correlithm objects 104 can be determined using a Minkowski distance such as the Euclidean or "straight-line" distance between the correlithm objects 104. For example, the distance 106 between a pair of correlithm objects 104 may be determined by calculating the square root of the sum of squares of the coordinate difference in each dimension.

The user device 100 is configured to implement or emulate a correlithm object processing system that comprises one or more sensors 302, nodes 304, and/or actors 306 in order to convert data samples between real-world values or representations and to correlithm objects 104 in a correlithm object domain. Sensors 302 are generally configured to convert real-world data samples to the correlithm object domain. Nodes 304 are generally configured to process or perform various operations on correlithm objects in the correlithm object domain. Actors 306 are generally configured to convert correlithm objects 104 into real-world values or representations. Additional information about sensors 302, nodes 304, and actors 306 is described in FIG. 3.

Performing operations using correlithm objects 104 in a correlithm object domain allows the user device 100 to identify relationships between data samples that cannot be identified using conventional data processing systems. For example, in the correlithm object domain, the user device 100 is able to identify not only data samples that exactly match an input data sample, but also other data samples that have similar characteristics or features as the input data samples. Conventional computers are unable to identify these types of relationships readily. Using correlithm objects 104 improves the operation of the user device 100 by enabling the user device 100 to efficiently process data samples and identify relationships between data samples without relying on signal processing techniques that require a significant amount of processing resources. These benefits allow the user device 100 to operate more efficiently than conventional computers by reducing the amount of processing power and resources that are needed to perform various operations.

Figure 2:
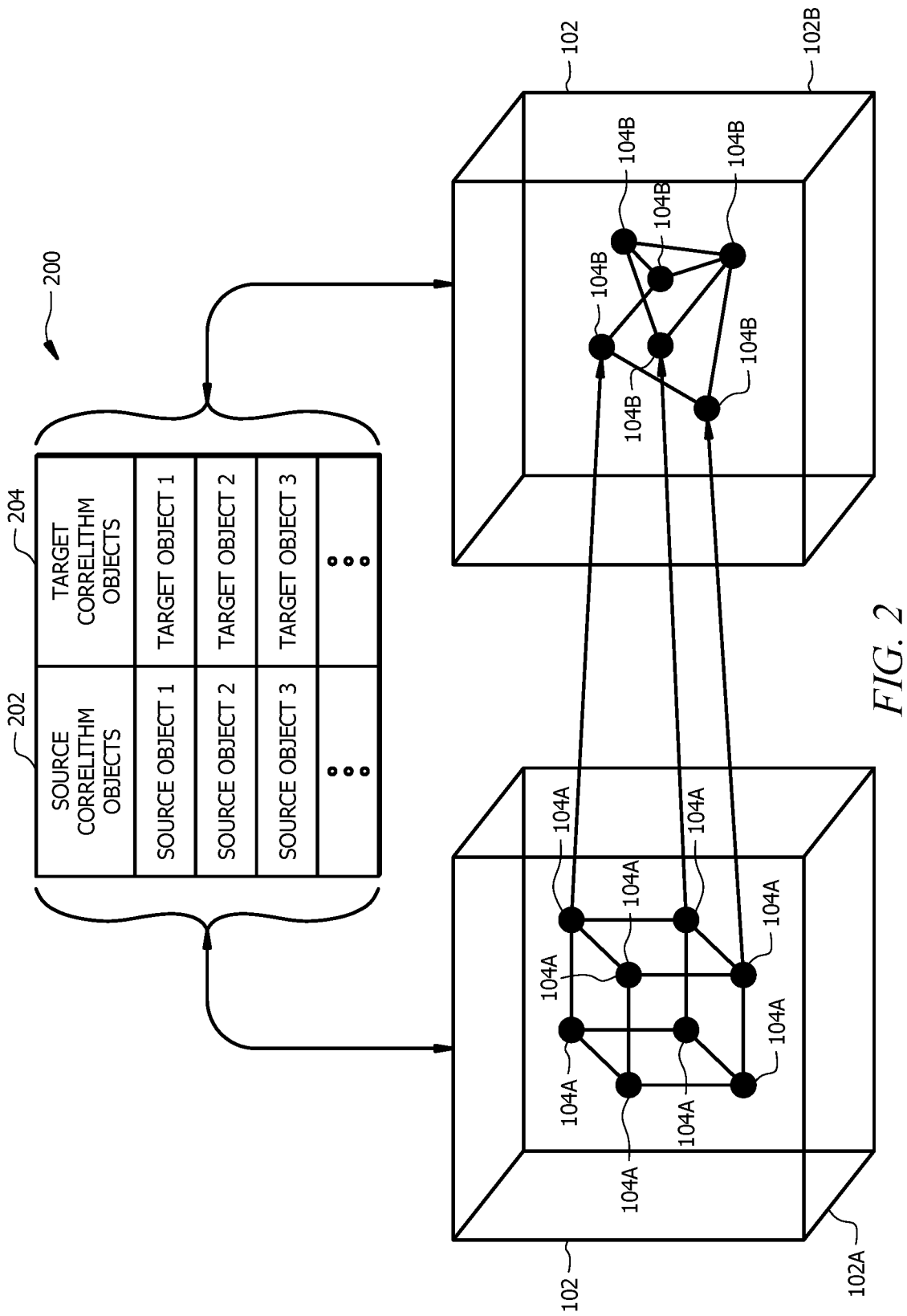
FIG. 2 is a perspective view of an embodiment of a mapping between correlithm objects in different n-dimensional spaces.

FIG. 2 is a schematic view of an embodiment of a mapping between correlithm objects 104 in different n-dimensional spaces 102. When implementing a correlithm object processing system, the user device 100 performs operations within the correlithm object domain using correlithm objects 104 in different n-dimensional spaces 102. As an example, the user device 100 may convert different types of data samples having real-world values into correlithm objects 104 in different n-dimensional spaces 102. For instance, the user device 100 may convert data samples of text into a first set of correlithm objects 104 in a first n-dimensional space 102 and data samples of audio samples as a second set of correlithm objects 104 in a second n-dimensional space 102. Conventional systems require data samples to be of the same type and/or format to perform any kind of operation on the data samples. In some instances, some types of data samples cannot be compared because there is no common format available. For example, conventional computers are unable to compare data samples of images and data samples of audio samples because there is no common format. In contrast, the user device 100 implementing a correlithm object processing system is able to compare and perform operations using correlithm objects 104 in the correlithm object domain regardless of the type or format of the original data samples.

In FIG. 2, a first set of correlithm objects 104A are defined within a first n-dimensional space 102A and a second set of correlithm objects 104B are defined within a second n-dimensional space 102B. The n-dimensional spaces may have the same number of dimensions or a different number of dimensions. For example, the first n-dimensional space 102A and the second n-dimensional space 102B may both be three dimensional spaces. As another example, the first n-dimensional space 102A may be a three-dimensional space and the second n-dimensional space 102B may be a nine-dimensional space. Correlithm objects 104 in the first n-dimensional space 102A and second n-dimensional space 102B are mapped to each other. In other words, a correlithm object 104A in the first n-dimensional space 102A may reference or be linked with a particular correlithm object 104B in the second n-dimensional space 102B. The correlithm objects 104 may also be linked with and referenced with other correlithm objects 104 in other n-dimensional spaces 102.

In one embodiment, a data structure such as table 200 may be used to map or link correlithm objects 104 in different n-dimensional spaces 102. In some instances, table 200 is referred to as a node table. Table 200 is generally configured to identify a first plurality of correlithm objects 104 in a first n-dimensional space 102 and a second plurality of correlithm objects 104 in a second n-dimensional space 102. Each correlithm object 104 in the first n-dimensional space 102 is linked with a correlithm object 104 is the second n-dimensional space 102. For example, table 200 may be configured with a first column 202 that lists correlithm objects 104A as source correlithm objects and a second column 204 that lists corresponding correlithm objects 104B as target correlithm objects. In other examples, table 200 may be configured in any other suitable manner or may be implemented using any other suitable data structure. In some embodiments, one or more mapping functions may be used to convert between a correlithm object 104 in a first n-dimensional space and a correlithm object 104 is a second n-dimensional space.

Figure 3:
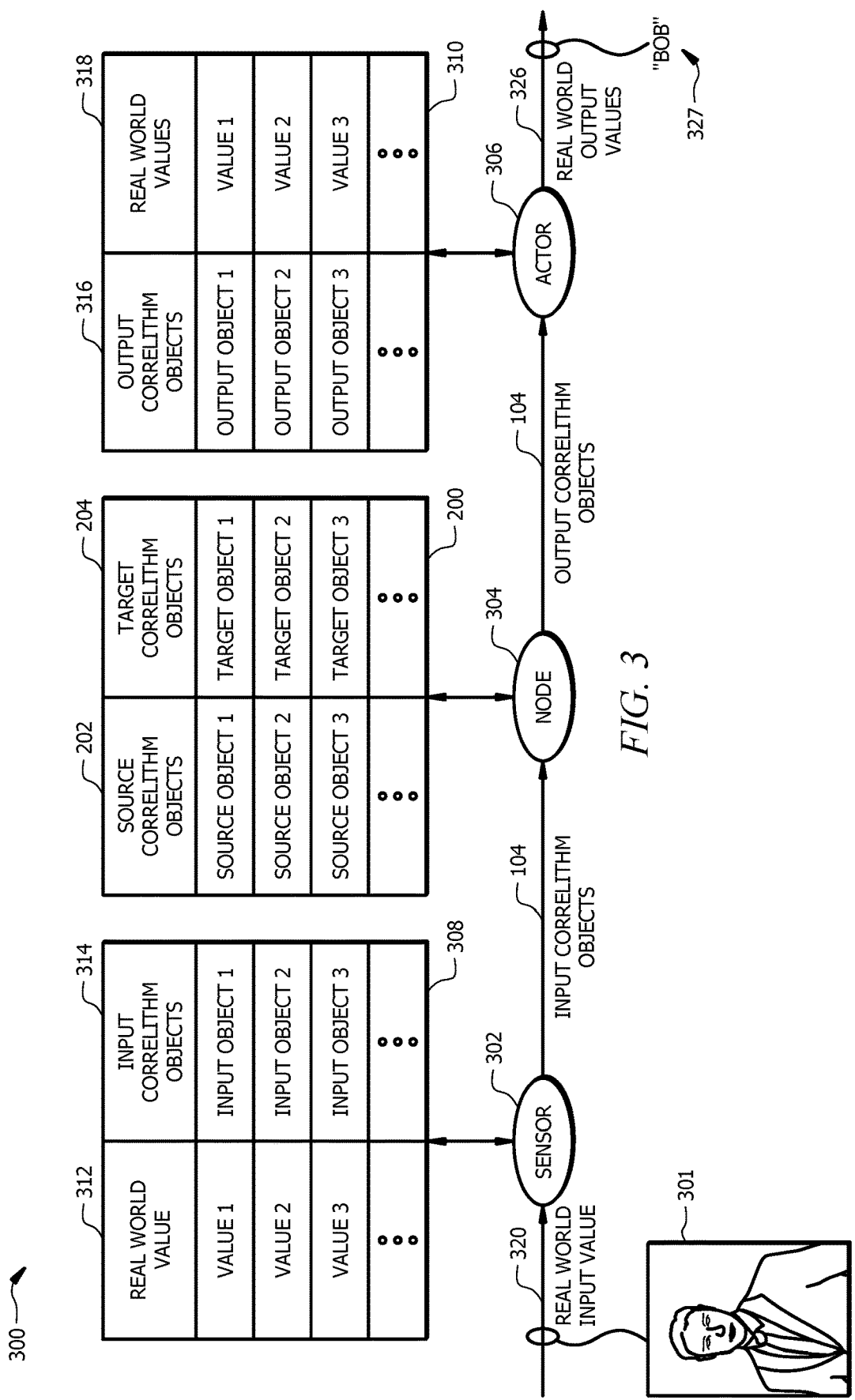
FIG. 3 is a schematic view of an embodiment of a correlithm object processing system.

FIG. 3 is a schematic view of an embodiment of a correlithm object processing system 300 that is implemented by a user device 100 to perform operations using correlithm objects 104. The system 300 generally comprises a sensor 302, a node 304, and an actor 306. The system 300 may be configured with any suitable number and/or configuration of sensors 302, nodes 304, and actors 306. An example of the system 300 in operation is described in FIG. 4. In one embodiment, a sensor 302, a node 304, and an actor 306 may all be implemented on the same device (e.g. user device 100). In other embodiments, a sensor 302, a node 304, and an actor 306 may each be implemented on different devices in signal communication with each other for example over a network. In other embodiments, different devices may be configured to implement any combination of sensors 302, nodes 304, and actors 306.

Sensors 302 serve as interfaces that allow a user device 100 to convert real-world data samples into correlithm objects 104 that can be used in the correlithm object domain. Sensors 302 enable the user device 100 to compare and perform operations using correlithm objects 104 regardless of the data type or format of the original data sample. Sensors 302 are configured to receive a real-world value 320 representing a data sample as an input, to determine a correlithm object 104 based on the real-world value 320, and to output the correlithm object 104. For example, the sensor 302 may receive an image 301 of a person and output a correlithm object 322 to the node 304 or actor 306. In one embodiment, sensors 302 are configured to use sensor tables 308 that link a plurality of real-world values with a plurality of correlithm objects 104 in an n-dimensional space 102. Real-world values are any type of signal, value, or representation of data samples. Examples of real-world values include, but are not limited to, images, pixel values, text, audio signals, electrical signals, and biometric signals. As an example, a sensor table 308 may be configured with a first column 312 that lists real-world value entries corresponding with different images and a second column 314 that lists corresponding correlithm objects 104 as input correlithm objects. In other examples, sensor tables 308 may be configured in any other suitable manner or may be implemented using any other suitable data structure. In some embodiments, one or more mapping functions may be used to translate between a real-world value 320 and a correlithm object 104 in an n-dimensional space. Additional information for implementing or emulating a sensor 302 in hardware is described in FIG. 5.

Nodes 304 are configured to receive a correlithm object 104 (e.g. an input correlithm object 104), to determine another correlithm object 104 based on the received correlithm object 104, and to output the identified correlithm object 104 (e.g. an output correlithm object 104). In one embodiment, nodes 304 are configured to use node tables 200 that link a plurality of correlithm objects 104 from a first n-dimensional space 102 with a plurality of correlithm objects 104 in a second n-dimensional space 102. A node table 200 may be configured similar to the table 200 described in FIG. 2. Additional information for implementing or emulating a node 304 in hardware is described in FIG. 5.

Actors 306 serve as interfaces that allow a user device 100 to convert correlithm objects 104 in the correlithm object domain back to real-world values or data samples. Actors 306 enable the user device 100 to convert from correlithm objects 104 into any suitable type of real-world value. Actors 306 are configured to receive a correlithm object 104 (e.g. an output correlithm object 104), to determine a real-world output value 326 based on the received correlithm object 104, and to output the real-world output value 326. The real-world output value 326 may be a different data type or representation of the original data sample. As an example, the real-world input value 320 may be an image 301 of a person and the resulting real-world output value 326 may be text 327 and/or an audio signal identifying the person. In one embodiment, actors 306 are configured to use actor tables 310 that link a plurality of correlithm objects 104 in an n-dimensional space 102 with a plurality of real-world values. As an example, an actor table 310 may be configured with a first column 316 that lists correlithm objects 104 as output correlithm objects and a second column 318 that lists real-world values. In other examples, actor tables 310 may be configured in any other suitable manner or may be implemented using any other suitable data structure. In some embodiments, one or more mapping functions may be employed to translate between a correlithm object 104 in an n-dimensional space and a real-world output value 326. Additional information for implementing or emulating an actor 306 in hardware is described in FIG. 5.

A correlithm object processing system 300 uses a combination of a sensor table 308, a node table 200, and/or an actor table 310 to provide a specific set of rules that improve computer-related technologies by enabling devices to compare and to determine the degree of similarity between different data samples regardless of the data type and/or format of the data sample they represent. The ability to directly compare data samples having different data types and/or formatting is a new functionality that cannot be performed using conventional computing systems and data structures. Conventional systems require data samples to be of the same type and/or format in order to perform any kind of operation on the data samples. In some instances, some types of data samples are incompatible with each other and cannot be compared because there is no common format available. For example, conventional computers are unable to compare data samples of images with data samples of audio samples because there is no common format available. In contrast, a device implementing a correlithm object processing system uses a combination of a sensor table 308, a node table 200, and/or an actor table 310 to compare and perform operations using correlithm objects 104 in the correlithm object domain regardless of the type or format of the original data samples. The correlithm object processing system 300 uses a combination of a sensor table 308, a node table 200, and/or an actor table 310 as a specific set of rules that provides a particular solution to dealing with different types of data samples and allows devices to perform operations on different types of data samples using correlithm objects 104 in the correlithm object domain. In some instances, comparing data samples as correlithm objects 104 is computationally more efficient and faster than comparing data samples in their original format. Thus, using correlithm objects 104 to represent data samples provides increased flexibility and improved performance compared to using other conventional data structures. The specific set of rules used by the correlithm object processing system 300 go beyond simply using routine and conventional activities in order to achieve this new functionality and performance improvements.

In addition, correlithm object processing system 300 uses a combination of a sensor table 308, a node table 200, and/or an actor table 310 to provide a particular manner for transforming data samples between ordinal number representations and correlithm objects 104 in a correlithm object domain. For example, the correlithm object processing system 300 may be configured to transform a representation of a data sample into a correlithm object 104, to perform various operations using the correlithm object 104 in the correlithm object domain, and to transform a resulting correlithm object 104 into another representation of a data sample. Transforming data samples between ordinal number representations and correlithm objects 104 involves fundamentally changing the data type of data samples between an ordinal number system and a categorical number system to achieve the previously described benefits of the correlithm object processing system 300.

Figure 4:
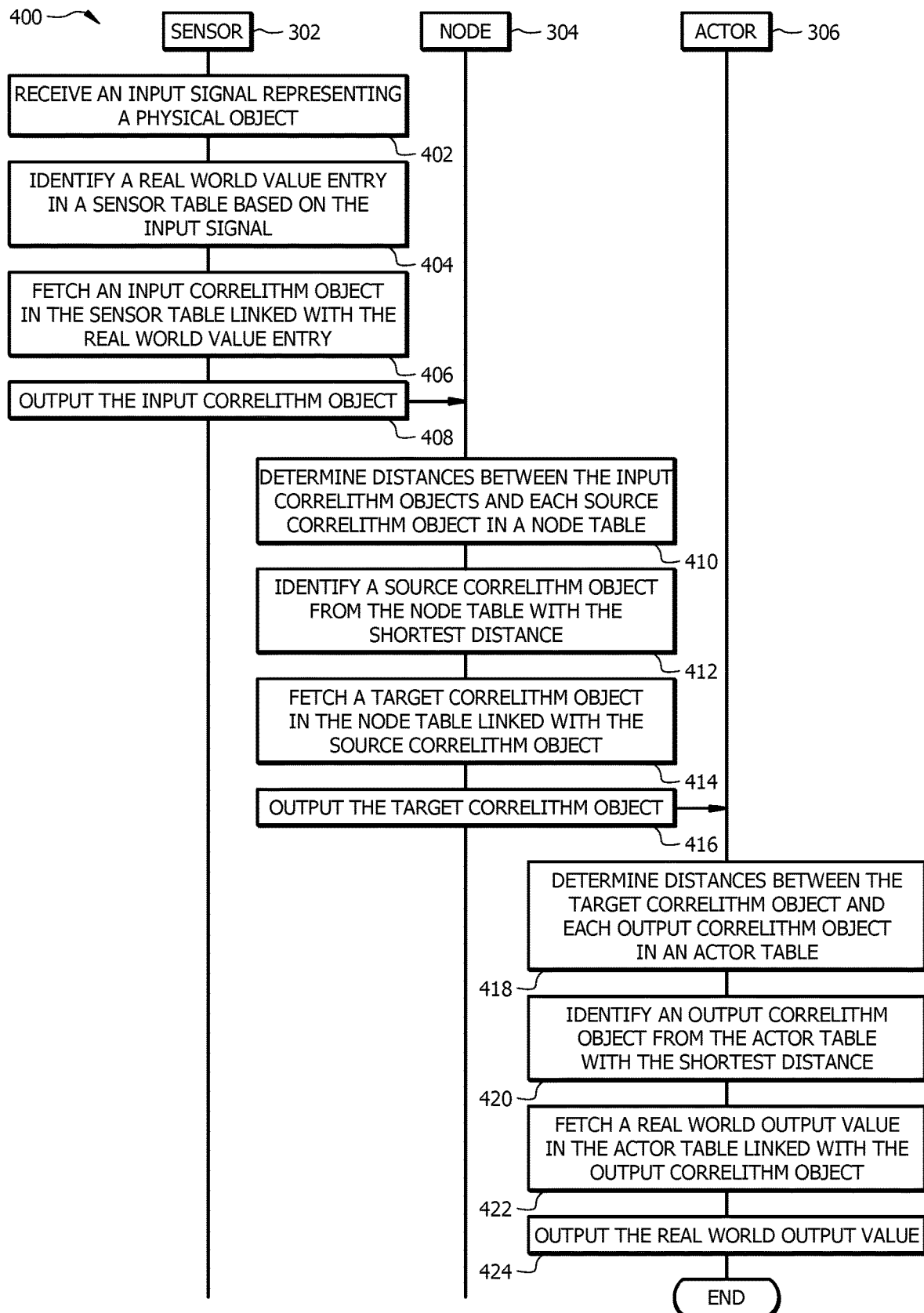
FIG. 4 is a protocol diagram of an embodiment of a correlithm object process flow.

FIG. 4 is a protocol diagram of an embodiment of a correlithm object process flow 400. A user device 100 implements process flow 400 to emulate a correlithm object processing system 300 to perform operations using correlithm object 104 such as facial recognition. The user device 100 implements process flow 400 to compare different data samples (e.g. images, voice signals, or text) to each other and to identify other objects based on the comparison. Process flow 400 provides instructions that allows user devices 100 to achieve the improved technical benefits of a correlithm object processing system 300.

Conventional systems are configured to use ordinal numbers for identifying different data samples. Ordinal based number systems only provide information about the sequence order of numbers based on their numeric values, and do not provide any information about any other types of relationships for the data samples being represented by the numeric values such as similarity. In contrast, a user device 100 can implement or emulate the correlithm object processing system 300 which provides an unconventional solution that uses categorical numbers and correlithm objects 104 to represent data samples. For example, the system 300 may be configured to use binary integers as categorical numbers to generate correlithm objects 104 which enables the user device 100 to perform operations directly based on similarities between different data samples. Categorical numbers provide information about how similar different data sample are from each other. Correlithm objects 104 generated using categorical numbers can be used directly by the system 300 for determining how similar different data samples are from each other without relying on exact matches, having a common data type or format, or conventional signal processing techniques.

A non-limiting example is provided to illustrate how the user device 100 implements process flow 400 to emulate a correlithm object processing system 300 to perform facial recognition on an image to determine the identity of the person in the image. In other examples, the user device 100 may implement process flow 400 to emulate a correlithm object processing system 300 to perform voice recognition, text recognition, or any other operation that compares different objects.

At step 402, a sensor 302 receives an input signal representing a data sample. For example, the sensor 302 receives an image of person's face as a real-world input value 320. The input signal may be in any suitable data type or format. In one embodiment, the sensor 302 may obtain the input signal in real-time from a peripheral device (e.g. a camera). In another embodiment, the sensor 302 may obtain the input signal from a memory or database.

At step 404, the sensor 302 identifies a real-world value entry in a sensor table 308 based on the input signal. In one embodiment, the system 300 identifies a real-world value entry in the sensor table 308 that matches the input signal.

For example, the real-world value entries may comprise previously stored images. The sensor 302 may compare the received image to the previously stored images to identify a real-world value entry that matches the received image. In one embodiment, when the sensor 302 does not find an exact match, the sensor 302 finds a real-world value entry that closest matches the received image.

At step 406, the sensor 302 identifies and fetches an input correlithm object 104 in the sensor table 308 linked with the real-world value entry. At step 408, the sensor 302 sends the identified input correlithm object 104 to the node 304. In one embodiment, the identified input correlithm object 104 is represented in the sensor table 308 using a categorical binary integer string. The sensor 302 sends the binary string representing to the identified input correlithm object 104 to the node 304.

At step 410, the node 304 receives the input correlithm object 104 and determines distances 106 between the input correlithm object 104 and each source correlithm object 104 in a node table 200. In one embodiment, the distance 106 between two correlithm objects 104 can be determined based on the differences between the bits of the two correlithm objects 104. In other words, the distance 106 between two correlithm objects can be determined based on how many individual bits differ between a pair of correlithm objects 104. The distance 106 between two correlithm objects 104 can be computed using Hamming distance or any other suitable technique. In another embodiment, the distance 106 between two correlithm objects 104 can be determined using a Minkowski distance such as the Euclidean or "straight-line" distance between the correlithm objects 104. For example, the distance 106 between a pair of correlithm objects 104 may be determined by calculating the square root of the sum of squares of the coordinate difference in each dimension.

At step 412, the node 304 identifies a source correlithm object 104 from the node table 200 with the shortest distance 106. A source correlithm object 104 with the shortest distance from the input correlithm object 104 is a correlithm object 104 either matches or most closely matches the received input correlithm object 104.

At step 414, the node 304 identifies and fetches a target correlithm object 104 in the node table 200 linked with the source correlithm object 104. At step 416, the node 304 outputs the identified target correlithm object 104 to the actor 306. In this example, the identified target correlithm object 104 is represented in the node table 200 using a categorical binary integer string. The node 304 sends the binary string representing to the identified target correlithm object 104 to the actor 306.

At step 418, the actor 306 receives the target correlithm object 104 and determines distances between the target correlithm object 104 and each output correlithm object 104 in an actor table 310. The actor 306 may compute the distances between the target correlithm object 104 and each output correlithm object 104 in an actor table 310 using a process similar to the process described in step 410.

At step 420, the actor 306 identifies an output correlithm object 104 from the actor table 310 with the shortest distance 106. An output correlithm object 104 with the shortest distance from the target correlithm object 104 is a correlithm object 104 either matches or most closely matches the received target correlithm object 104.

At step 422, the actor 306 identifies and fetches a real-world output value in the actor table 310 linked with the output correlithm object 104. The real-world output value may be any suitable type of data sample that corresponds with the original input signal. For example, the real-world output value may be text that indicates the name of the person in the image or some other identifier associated with the person in the image. As another example, the real-world output value may be an audio signal or sample of the name of the person in the image. In other examples, the real-world output value may be any other suitable real-world signal or value that corresponds with the original input signal. The real-world output value may be in any suitable data type or format.

At step 424, the actor 306 outputs the identified real-world output value. In one embodiment, the actor 306 may output the real-world output value in real-time to a peripheral device (e.g. a display or a speaker). In one embodiment, the actor 306 may output the real-world output value to a memory or database. In one embodiment, the real-world output value is sent to another sensor 302. For example, the real-world output value may be sent to another sensor 302 as an input for another process.

Figure 5:
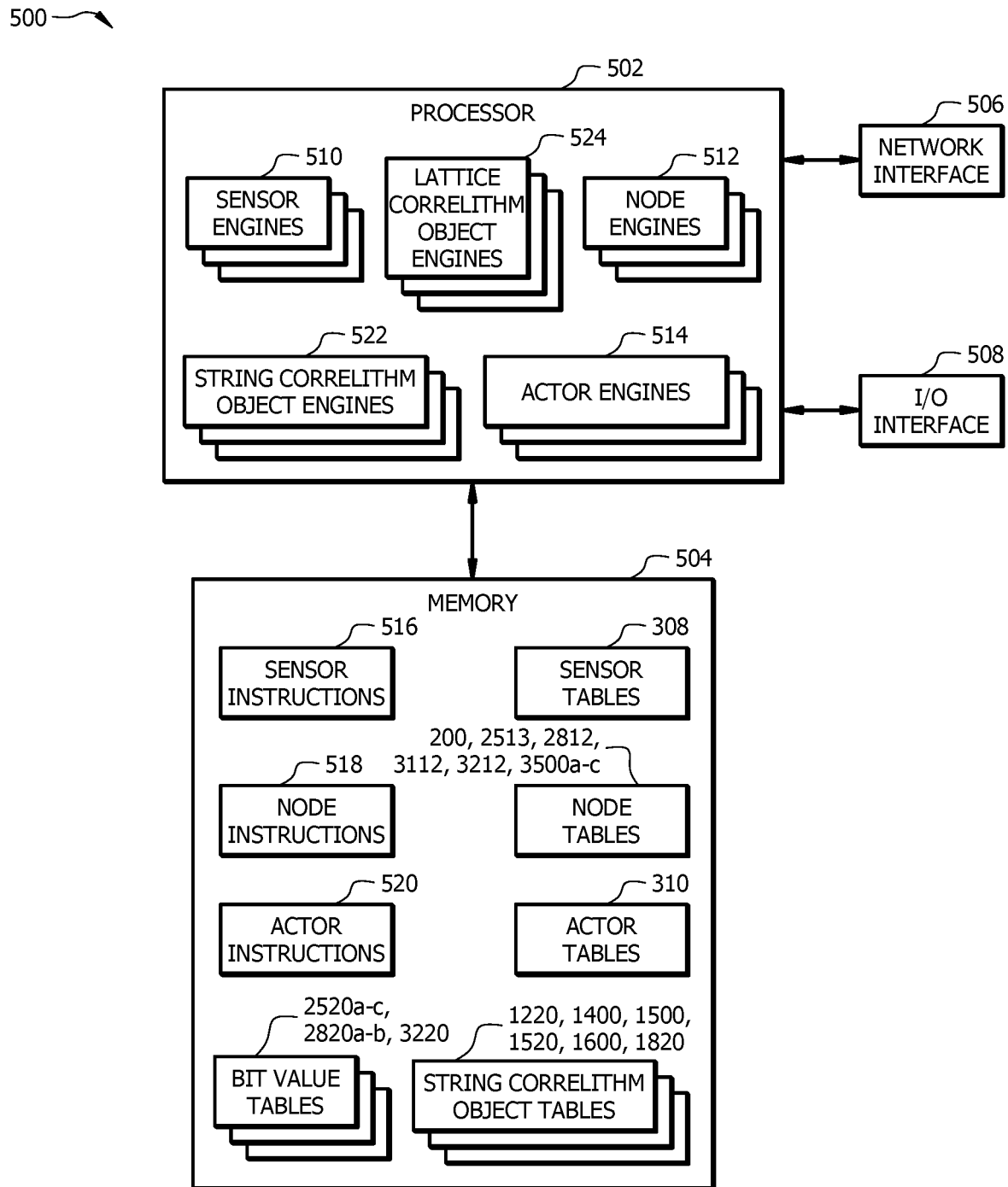
FIG. 5 is a schematic diagram of an embodiment a computer architecture for emulating a correlithm object processing system.

FIG. 5 is a schematic diagram of an embodiment of a computer architecture 500 for emulating a correlithm object processing system 300 in a user device 100. The computer architecture 500 comprises a processor 502, a memory 504, a network interface 506, and an input-output (I/O) interface 508. The computer architecture 500 may be configured as shown or in any other suitable configuration.

The processor 502 comprises one or more processors operably coupled to the memory 504. The processor 502 is any electronic circuitry including, but not limited to, state machines, one or more central processing unit (CPU) chips, logic units, cores (e.g. a multi-core processor), field-programmable gate array (FPGAs), application specific integrated circuits (ASICs), graphics processing units (GPUs), or digital signal processors (DSPs). The processor 502 may be a programmable logic device, a microcontroller, a microprocessor, or any suitable combination of the preceding. The processor 502 is communicatively coupled to and in signal communication with the memory 204. The one or more processors are configured to process data and may be implemented in hardware or software. For example, the processor 502 may be 8-bit, 16-bit, 32-bit, 64-bit or of any other suitable architecture. The processor 502 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components.

The one or more processors are configured to implement various instructions. For example, the one or more processors are configured to execute instructions to implement sensor engines 510, node engines 512, actor engines 514, string correlithm object engine 522, and lattice correlithm object engine 524. In an embodiment, the sensor engines 510, the node engines 512, the actor engines 514, the string correlithm object engine 522, and the lattice correlithm object engine 524 are implemented using logic units, FPGAs, ASICs, DSPs, or any other suitable hardware. The sensor engines 510, the node engines 512, the actor engines 514, the string correlithm object engine 522, and the lattice correlithm object engine 524 are each configured to implement a specific set of rules or processes that provides an improved technological result.

In one embodiment, the sensor engine 510 is configured implement sensors 302 that receive a real-world value 320 as an input, determine a correlithm object 104 based on the real-world value 320, and output the correlithm object 104. An example operation of a sensor 302 implemented by a sensor engine 510 is described in FIG. 4.

In one embodiment, the node engine 512 is configured to implement nodes 304 that receive a correlithm object 104 (e.g. an input correlithm object 104), determine another correlithm object 104 based on the received correlithm object 104, and output the identified correlithm object 104 (e.g. an output correlithm object 104). A node 304 implemented by a node engine 512 is also configured to compute distances between pairs of correlithm objects 104. An example operation of a node 304 implemented by a node engine 512 is described in FIG. 4.

In one embodiment, the actor engine 514 is configured to implement actors 306 that receive a correlithm object 104 (e.g. an output correlithm object 104), determine a real-world output value 326 based on the received correlithm object 104, and output the real-world output value 326. An example operation of an actor 306 implemented by an actor engine 514 is described in FIG. 4.

Figure 31A:
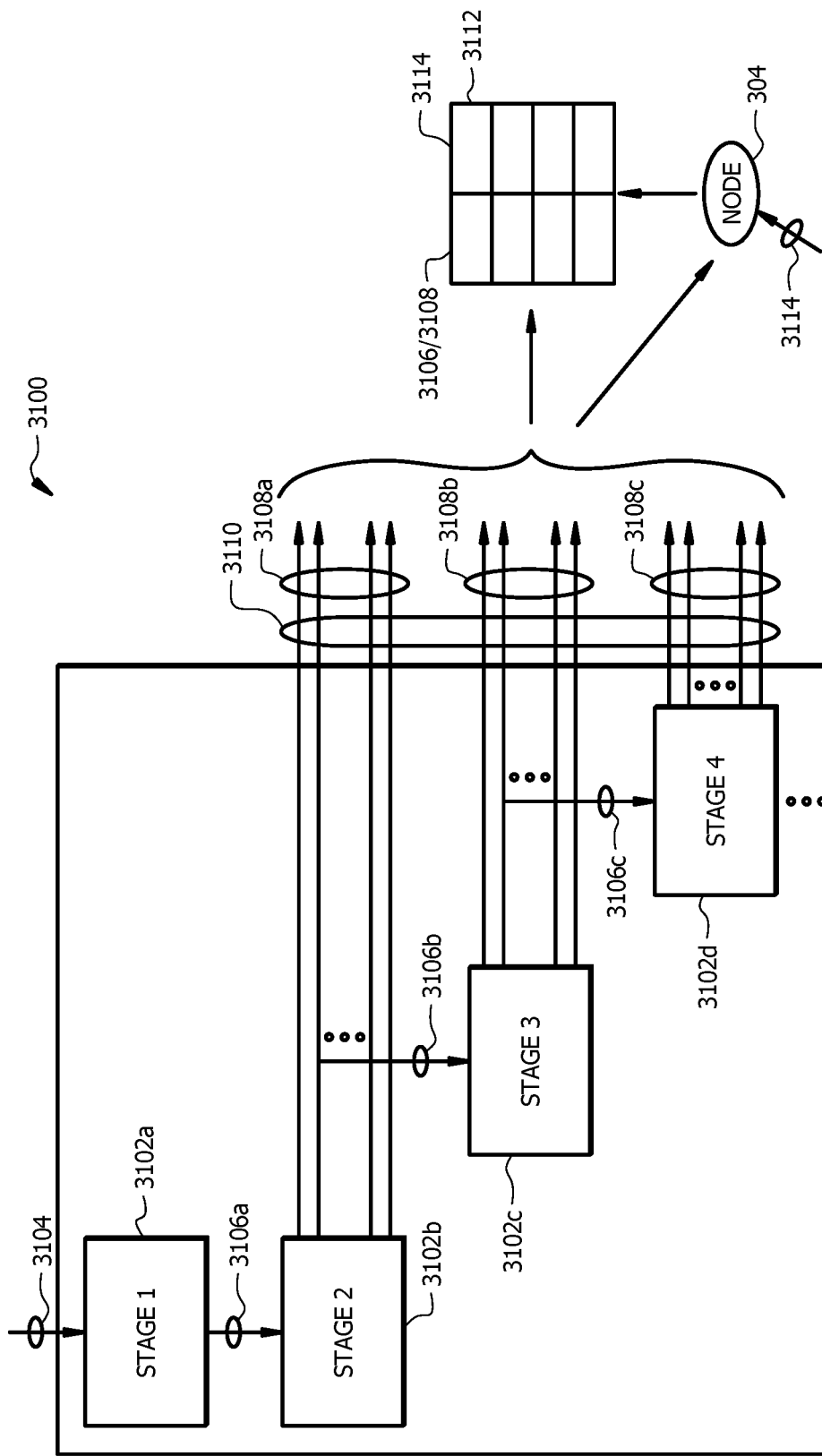
FIG. 31A illustrates one embodiment of an irregular lattice correlithm object generator.
Figure 32A:
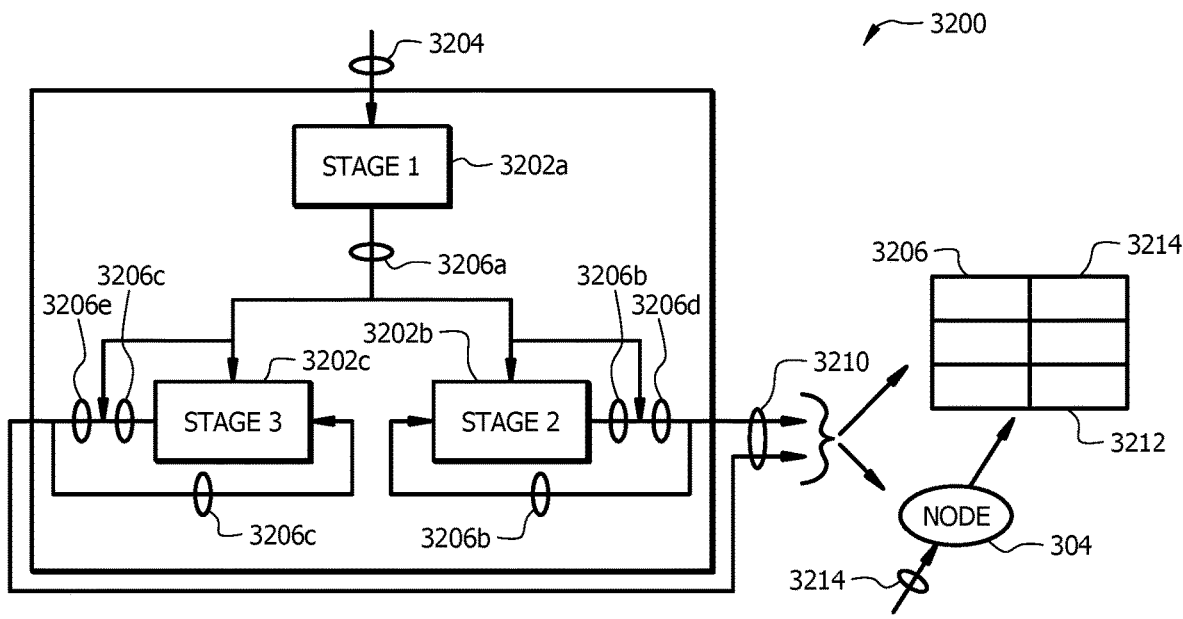
FIG. 32A illustrates one embodiment of a bidirectional string correlithm object generator.

In one embodiment, string correlithm object engine 522 is configured to implement a string correlithm object generator 1200 and otherwise process string correlithm objects 602 as described, for example, in conjunction with FIGS. 12-24; and a bidirectional string correlithm object generator 3200 as described, for example, in conjunction with FIG. 32A. In one embodiment, lattice correlithm object engine 524 is configured to implement a lattice correlithm object generators 2500, 2800, and 3100 as described, for example, in conjunction with FIGS. 25, 28, and 31A, respectively.

The memory 504 comprises one or more non-transitory disks, tape drives, or solid-state drives, and may be used as an over-flow data storage device, to store programs when such programs are selected for execution, and to store instructions and data that are read during program execution. The memory 504 may be volatile or non-volatile and may comprise read-only memory (ROM), random-access memory (RAM), ternary content-addressable memory (TCAM), dynamic random-access memory (DRAM), and static random-access memory (SRAM). The memory 504 is operable to store sensor instructions 516, node instructions 518, actor instructions 520, sensor tables 308, node tables 200, actor tables 310, string correlithm object tables 1220, 1400, 1500, 1520, 1600, and 1820, and/or any other data or instructions. Memory 504 further stores bit value tables 2520a-c, 2820a-b, and 3220 as described, for example, in conjunction with FIGS. 26A-C, 29A-B, and 32B; and node tables 2513, 2812, 3112, 3212, and 3500a-c as described, for example, in conjunction with FIGS. 25, 28, 31A, 32A, and 35. The sensor instructions 516, the node instructions 518, and the actor instructions 520 comprise any suitable set of instructions, logic, rules, or code operable to execute the sensor engine 510, node engine 512, and the actor engine 514, respectively.

The sensor tables 308, the node tables 200, and the actor tables 310 may be configured similar to the sensor tables 308, the node tables 200, and the actor tables 310 described in FIG. 3, respectively.

The network interface 506 is configured to enable wired and/or wireless communications. The network interface 506 is configured to communicate data with any other device or system. For example, the network interface 506 may be configured for communication with a modem, a switch, a router, a bridge, a server, or a client. The processor 502 is configured to send and receive data using the network interface 506.

The I/O interface 508 may comprise ports, transmitters, receivers, transceivers, or any other devices for transmitting and/or receiving data with peripheral devices as would be appreciated by one of ordinary skill in the art upon viewing this disclosure. For example, the I/O interface 508 may be configured to communicate data between the processor 502 and peripheral hardware such as a graphical user interface, a display, a mouse, a keyboard, a key pad, and a touch sensor (e.g. a touch screen).

Figure 6:
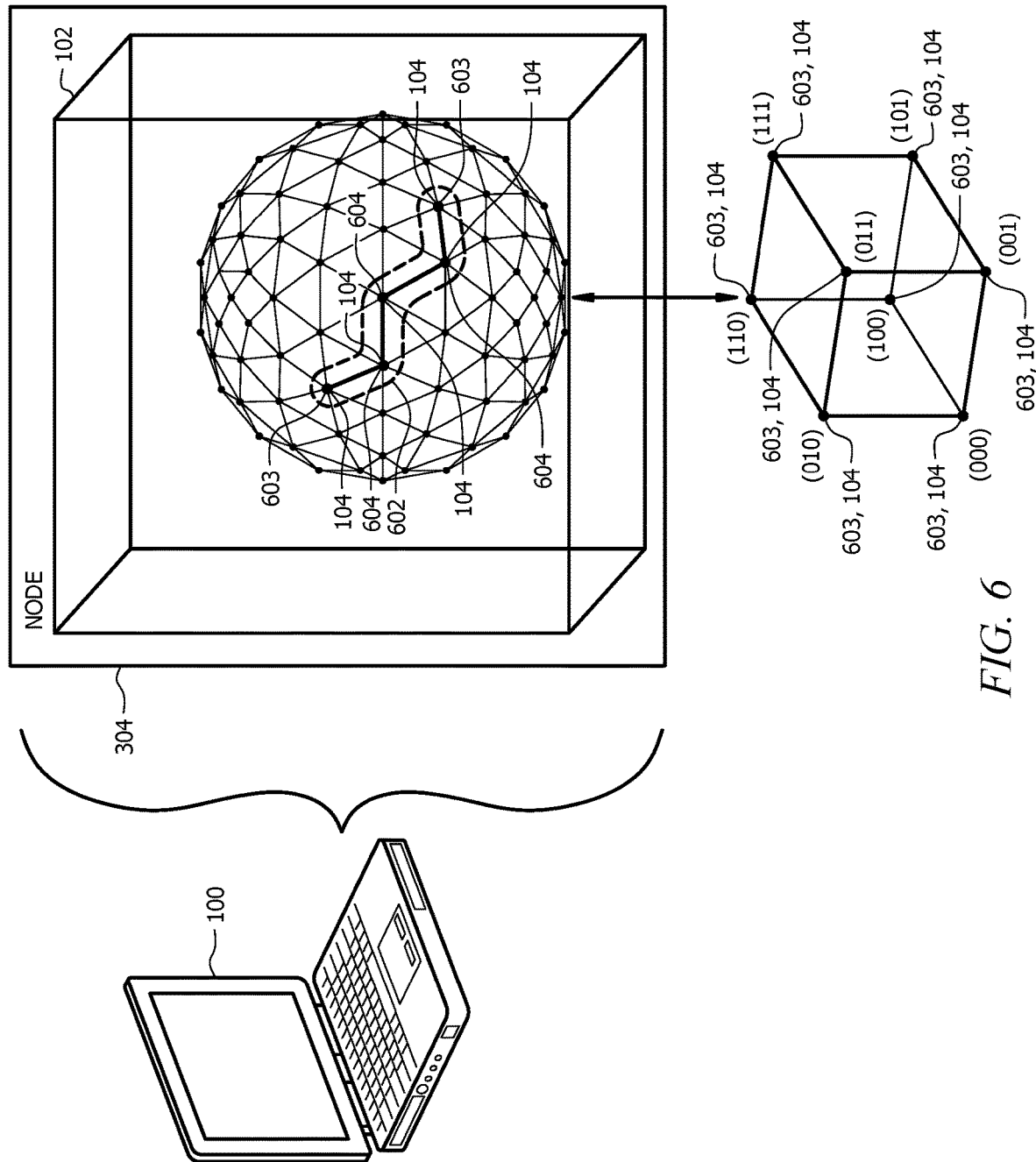
FIG. 6 illustrates an embodiment of how a string correlithm object may be implemented within a node by a device.
Figure 7:
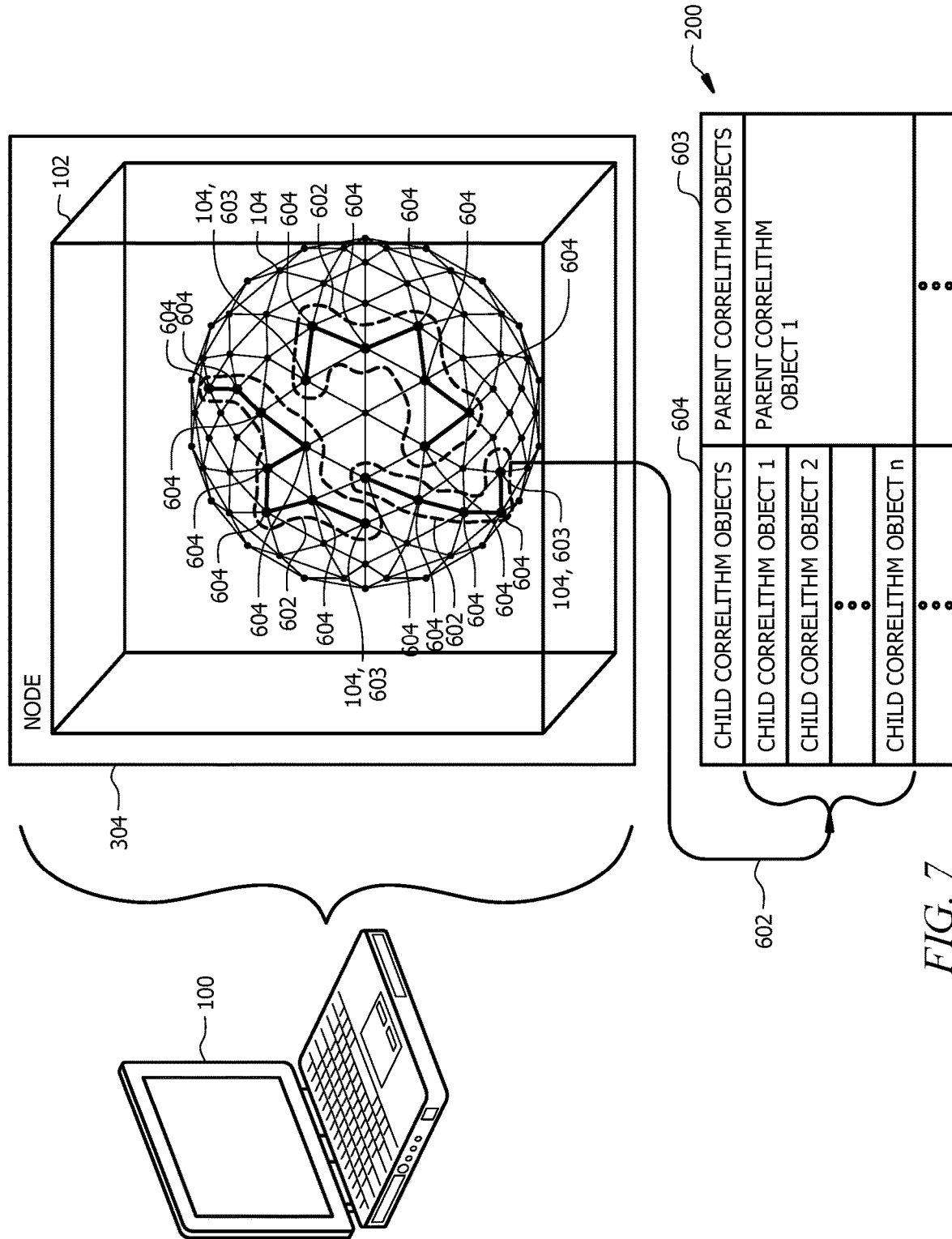
FIG. 7 illustrates another embodiment of how a string correlithm object may be implemented within a node by a device.

FIGS. 6 and 7 are schematic diagrams of an embodiment of a device 100 implementing string correlithm objects 602 for a correlithm object processing system 300. String correlithm objects 602 can be used by a correlithm object processing system 300 to embed higher orders of correlithm objects 104 within lower orders of correlithm objects 104. The order of a correlithm object 104 depends on the number of bits used to represent the correlithm object 104. The order of a correlithm object 104 also corresponds with the number of dimensions in the n-dimensional space 102 where the correlithm object 104 is located. For example, a correlithm object 104 represented by a 64-bit string is a higher order correlithm object 104 than a correlithm object 104 represented by 16-bit string.

Conventional computing systems rely on accurate data input and are unable to detect or correct for data input errors in real time. For example, a conventional computing device assumes a data stream is correct even when the data stream has bit errors. When a bit error occurs that leads to an unknown data value, the conventional computing device is unable to resolve the error without manual intervention. In contrast, string correlithm objects 602 enable a device 100 to perform operations such as error correction and interpolation within the correlithm object processing system 300. For example, higher order correlithm objects 104 can be used to associate an input correlithm object 104 with a lower order correlithm 104 when an input correlithm object does not correspond with a particular correlithm object 104 in an n-dimensional space 102. The correlithm object processing system 300 uses the embedded higher order correlithm objects 104 to define correlithm objects 104 between the lower order correlithm objects 104 which allows the device 100 to identify a correlithm object 104 in the lower order correlithm objects n-dimensional space 102 that corresponds with the input correlithm object 104. Using string correlithm objects 602, the correlithm object processing system 300 is able to interpolate and/or to compensate for errors (e.g. bit errors) which improve the functionality of the correlithm object processing system 300 and the operation of the device 100.

In some instances, string correlithm objects 602 may be used to represent a series of data samples or temporal data samples. For example, a string correlithm object 602 may be used to represent audio or video segments. In this example, media segments are represented by sequential correlithm objects that are linked together using a string correlithm object 602.

FIG. 6 illustrates an embodiment of how a string correlithm object 602 may be implemented within a node 304 by a device 100. In other embodiments, string correlithm objects 602 may be integrated within a sensor 302 or an actor 306. In 32-dimensional space 102 where correlithm objects 104 can be represented by a 32-bit string, the 32-bit string can be embedded and used to represent correlithm objects 104 in a lower order 3-dimensional space 102 which uses three bits. The 32-bit strings can be partitioned into three 12-bit portions, where each portion corresponds with one of the three bits in the 3-dimensional space 102. For example, the correlithm object 104 represented by the 3-bit binary value of 000 may be represented by a 32-bit binary string of zeros and the correlithm object represented by the binary value of 111 may be represented by a 32-bit string of all ones. As another example, the correlithm object 104 represented by the 3-bit binary value of 100 may be represented by a 32-bit binary string with 12 bits set to one followed by 24 bits set to zero. In other examples, string correlithm objects 602 can be used to embed any other combination and/or number of n-dimensional spaces 102.

In one embodiment, when a higher order n-dimensional space 102 is embedded in a lower order n-dimensional space 102, one or more correlithm objects 104 are present in both the lower order n-dimensional space 102 and the higher order n-dimensional space 102. Correlithm objects 104 that are present in both the lower order n-dimensional space 102 and the higher order n-dimensional space 102 may be referred to as parent correlithm objects 603. Correlithm objects 104 in the higher order n-dimensional space 102 may be referred to as child correlithm objects 604. In this example, the correlithm objects 104 in the 3-dimensional space 102 may be referred to as parent correlithm objects 603 while the correlithm objects 104 in the 32-dimensional space 102 may be referred to as child correlithm objects 604. In general, child correlithm objects 604 are represented by a higher order binary string than parent correlithm objects 603. In other words, the bit strings used to represent a child correlithm object 604 may have more bits than the bit strings used to represent a parent correlithm object 603. The distance between parent correlithm objects 603 may be referred to as a standard distance. The distance between child correlithm objects 604 and other child correlithm objects 604 or parent correlithm objects 603 may be referred to as a fractional distance which is less than the standard distance.

FIG. 7 illustrates another embodiment of how a string correlithm object 602 may be implemented within a node 304 by a device 100. In other embodiments, string correlithm objects 602 may be integrated within a sensor 302 or an actor 306. In FIG. 7, a set of correlithm objects 104 are shown within an n-dimensional space 102. In one embodiment, the correlithm objects 104 are equally spaced from adjacent correlithm objects 104. A string correlithm object 602 comprises a parent correlithm object 603 linked with one or more child correlithm objects 604. FIG. 7 illustrates three string correlithm objects 602 where each string correlithm object 602 comprises a parent correlithm object 603 linked with six child correlithm objects 603. In other examples, the n-dimensional space 102 may comprise any suitable number of correlithm objects 104 and/or string correlithm objects 602.

A parent correlithm object 603 may be a member of one or more string correlithm objects 602. For example, a parent correlithm object 603 may be linked with one or more sets of child correlithm objects 604 in a node table 200. In one embodiment, a child correlithm object 604 may only be linked with one parent correlithm object 603. String correlithm objects 602 may be configured to form a daisy chain or a linear chain of child correlithm objects 604. In one embodiment, string correlithm objects 602 are configured such that child correlithm objects 604 do not form loops where the chain of child correlithm objects 604 intersect with themselves. Each child correlithm objects 604 is less than the standard distance away from its parent correlithm object 603. The child correlithm objects 604 are equally spaced from other adjacent child correlithm objects 604.

In one embodiment, a data structure such as node table 200 may be used to map or link parent correlithm objects 603 with child correlithm objects 604. The node table 200 is generally configured to identify a plurality of parent correlithm objects 603 and one or more child correlithm objects 604 linked with each of the parent correlithm objects 603. For example, node table 200 may be configured with a first column that lists child correlithm objects 604 and a second column that lists parent correlithm objects 603. In other examples, the node table 200 may be configured in any other suitable manner or may be implemented using any other suitable data structure. In some embodiments, one or more mapping functions may be used to convert between a child correlithm object 604 and a parent correlithm object 603.

Figure 8:
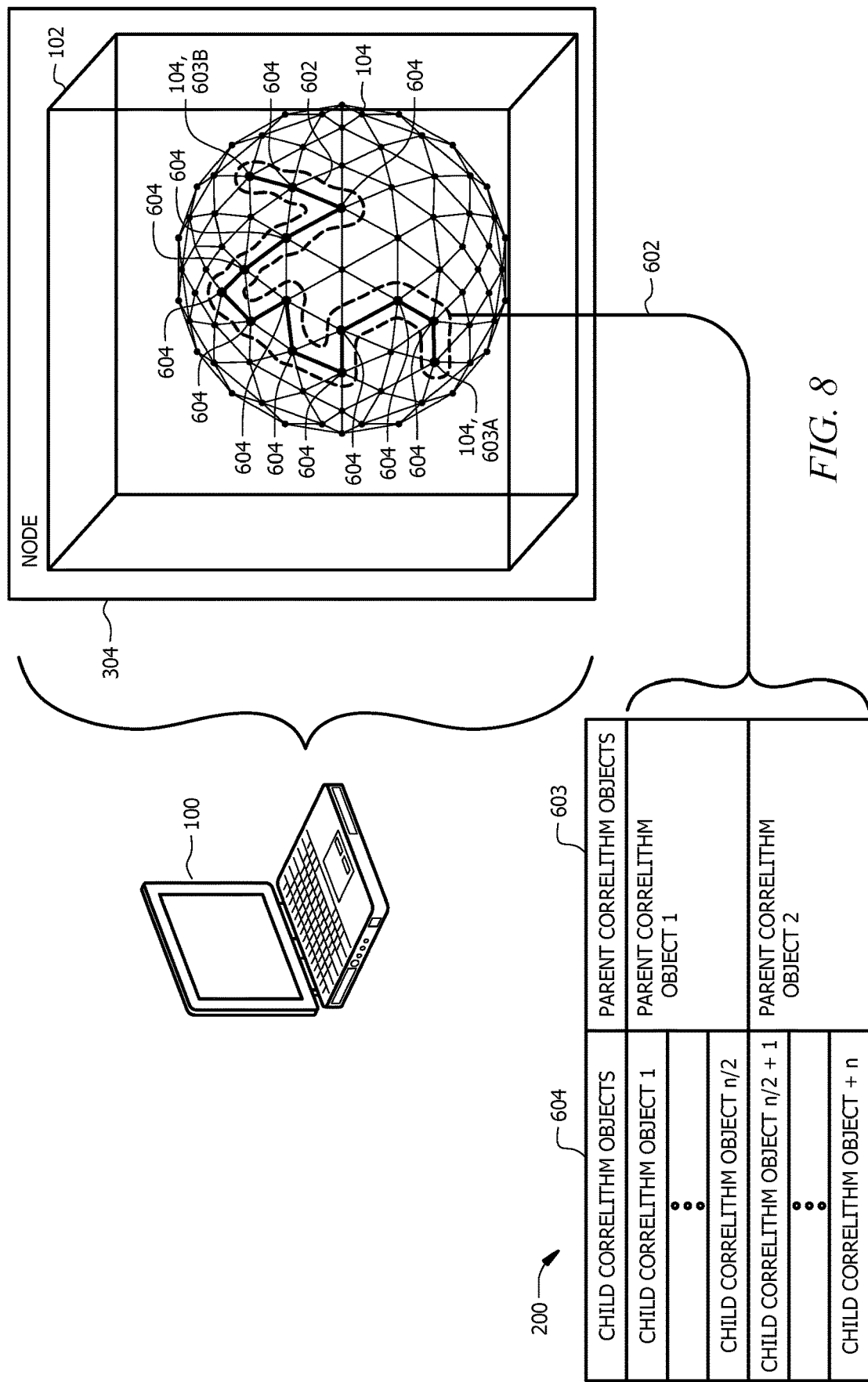
FIG. 8 is a schematic diagram of another embodiment of a device implementing string correlithm objects in a node for a correlithm object processing system.

FIG. 8 is a schematic diagram of another embodiment of a device 100 implementing string correlithm objects 602 in a node 304 for a correlithm object processing system 300. Previously in FIG. 7, a string correlithm object 602 comprised of child correlithm objects 604 that are adjacent to a parent correlithm object 603. In FIG. 8, string correlithm objects 602 comprise one or more child correlithm objects 604 in between a pair of parent correlithm objects 603. In this configuration, the string correlithm object 602 initially diverges from a first parent correlithm object 603A and then later converges toward a second parent correlithm object 603B. This configuration allows the correlithm object processing system 300 to generate a string correlithm object 602 between a particular pair of parent correlithm objects 603.

The string correlithm objects described in FIG. 8 allow the device 100 to interpolate value between a specific pair of correlithm objects 104 (i.e. parent correlithm objects 603). In other words, these types of string correlithm objects 602 allow the device 100 to perform interpolation between a set of parent correlithm objects 603. Interpolation between a set of parent correlithm objects 603 enables the device 100 to perform operations such as quantization which convert between different orders of correlithm objects 104.

In one embodiment, a data structure such as node table 200 may be used to map or link the parent correlithm objects 603 with their respective child correlithm objects 604. For example, node table 200 may be configured with a first column that lists child correlithm objects 604 and a second column that lists parent correlithm objects 603. In this example, a first portion of the child correlithm objects 604 is linked with the first parent correlithm object 603A and a second portion of the child correlithm objects 604 is linked with the second parent correlithm object 603B. In other examples, the node table 200 may be configured in any other suitable manner or may be implemented using any other suitable data structure. In some embodiments, one or more mapping functions may be used to convert between a child correlithm object 604 and a parent correlithm object 603.

Figure 9:
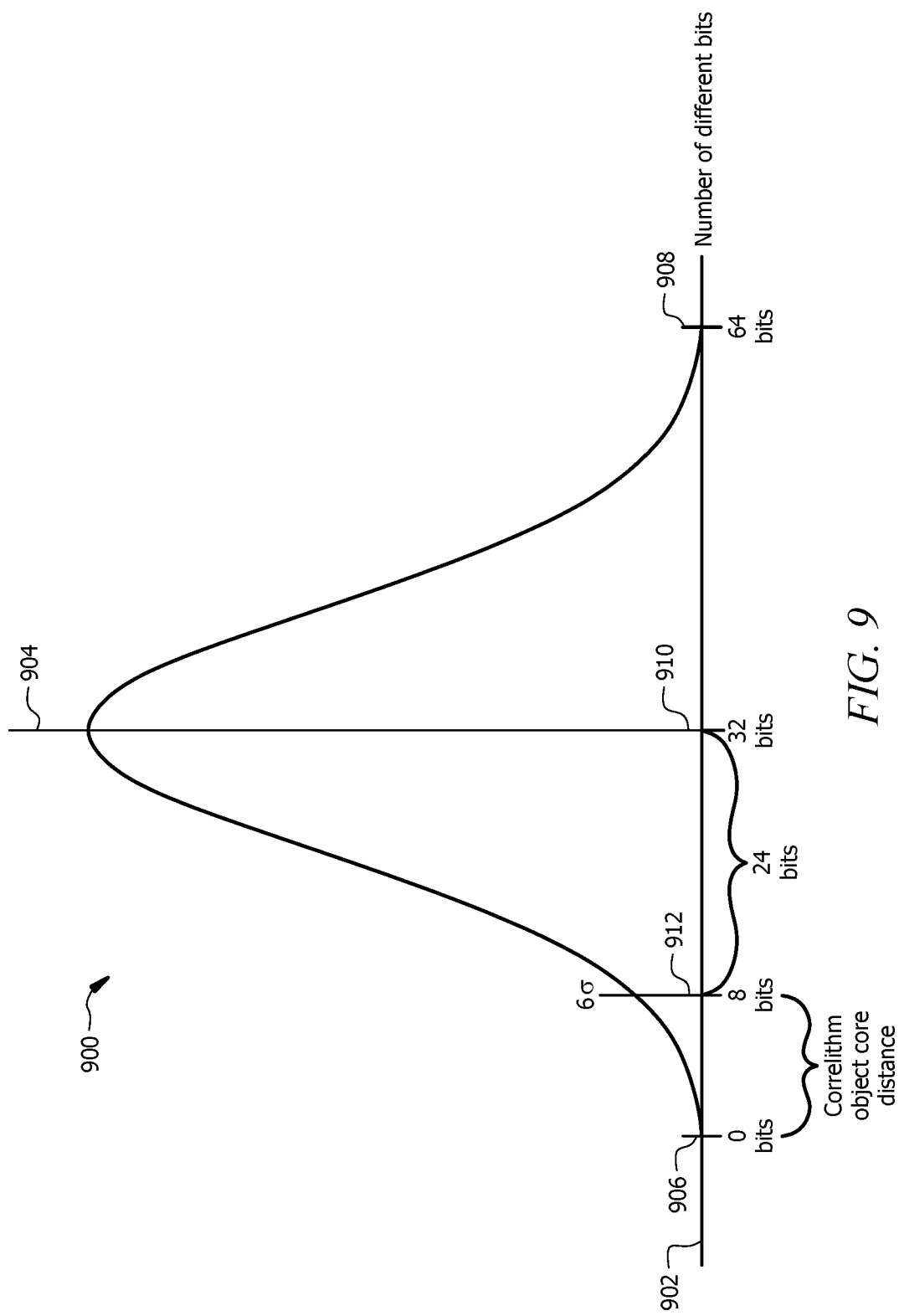
FIG. 9 is an embodiment of a graph of a probability distribution for matching a random correlithm object with a particular correlithm object.

FIG. 9 is an embodiment of a graph of a probability distribution 900 for matching a random correlithm object 104 with a particular correlithm object 104. Axis 902 indicates the number of bits that are different between a random correlithm object 104 with a particular correlithm object 104. Axis 904 indicates the probability associated with a particular number of bits being different between a random correlithm object 104 and a particular correlithm object 104.

As an example, FIG. 9 illustrates the probability distribution 900 for matching correlithm objects 104 in a 64-dimensional space 102. In one embodiment, the probability distribution 900 is approximately a Gaussian distribution. As the number of dimensions in the n-dimensional space 102 increases, the probability distribution 900 starts to shape more like an impulse response function. In other examples, the probability distribution 900 may follow any other suitable type of distribution.

Location 906 illustrates an exact match between a random correlithm object 104 with a particular correlithm object 104. As shown by the probability distribution 900, the probability of an exact match between a random correlithm object 104 with a particular correlithm object 104 is extremely low. In other words, when an exact match occurs the event is most likely deliberate and not a random occurrence.

Location 908 illustrates when all of the bits between the random correlithm object 104 with the particular correlithm object 104 are different. In this example, the random correlithm object 104 and the particular correlithm object 104 have 64 bits that are different from each other. As shown by the probability distribution 900, the probability of all the bits being different between the random correlithm object 104 and the particular correlithm object 104 is also extremely low.

Location 910 illustrates an average number of bits that are different between a random correlithm object 104 and the particular correlithm object 104. In general, the average number of different bits between the random correlithm object 104 and the particular correlithm object 104 is equal to $$\frac{n}{2}$$

(also referred to as standard distance), where 'n' is the number of dimensions in the n-dimensional space 102. In this example, the average number of bits that are different between a random correlithm object 104 and the particular correlithm object 104 is 32 bits.

Location 912 illustrates a cutoff region that defines a core distance for a correlithm object core. The correlithm object 104 at location 906 may also be referred to as a root correlithm object for a correlithm object core. The core distance defines the maximum number of bits that can be different between a correlithm object 104 and the root correlithm object to be considered within a correlithm object core for the root correlithm object. In other words, the core distance defines the maximum number of hops away a correlithm object 104 can be from a root correlithm object to be considered a part of the correlithm object core for the root correlithm object. Additional information about a correlithm object core is described in FIG. 10. In this example, the cutoff region defines a core distance equal to six standard deviations away from the average number of bits that are different between a random correlithm object 104 and the particular correlithm object 104. In general, the standard deviation is equal to $$\sqrt{\frac{n}{4}},$$

where 'n' is the number of dimensions in the n-dimensional space 102. In this example, the standard deviation of the 64-dimensional space 102 is equal to 4 bits. This means the cutoff region (location 912) is located 24 bits away from location 910 which is 8 bits away from the root correlithm object at location 906. In other words, the core distance is equal to 8 bits. This means that the cutoff region at location 912 indicates that the core distance for a correlithm object core includes correlithm objects 104 that have up to 8 bits different then the root correlithm object or are up to 8 hops away from the root correlithm object. In other examples, the cutoff region that defines the core distance may be equal any other suitable value. For instance, the cutoff region may be set to 2, 4, 8, 10, 12, or any other suitable number of standard deviations away from location 910.

Figure 10:
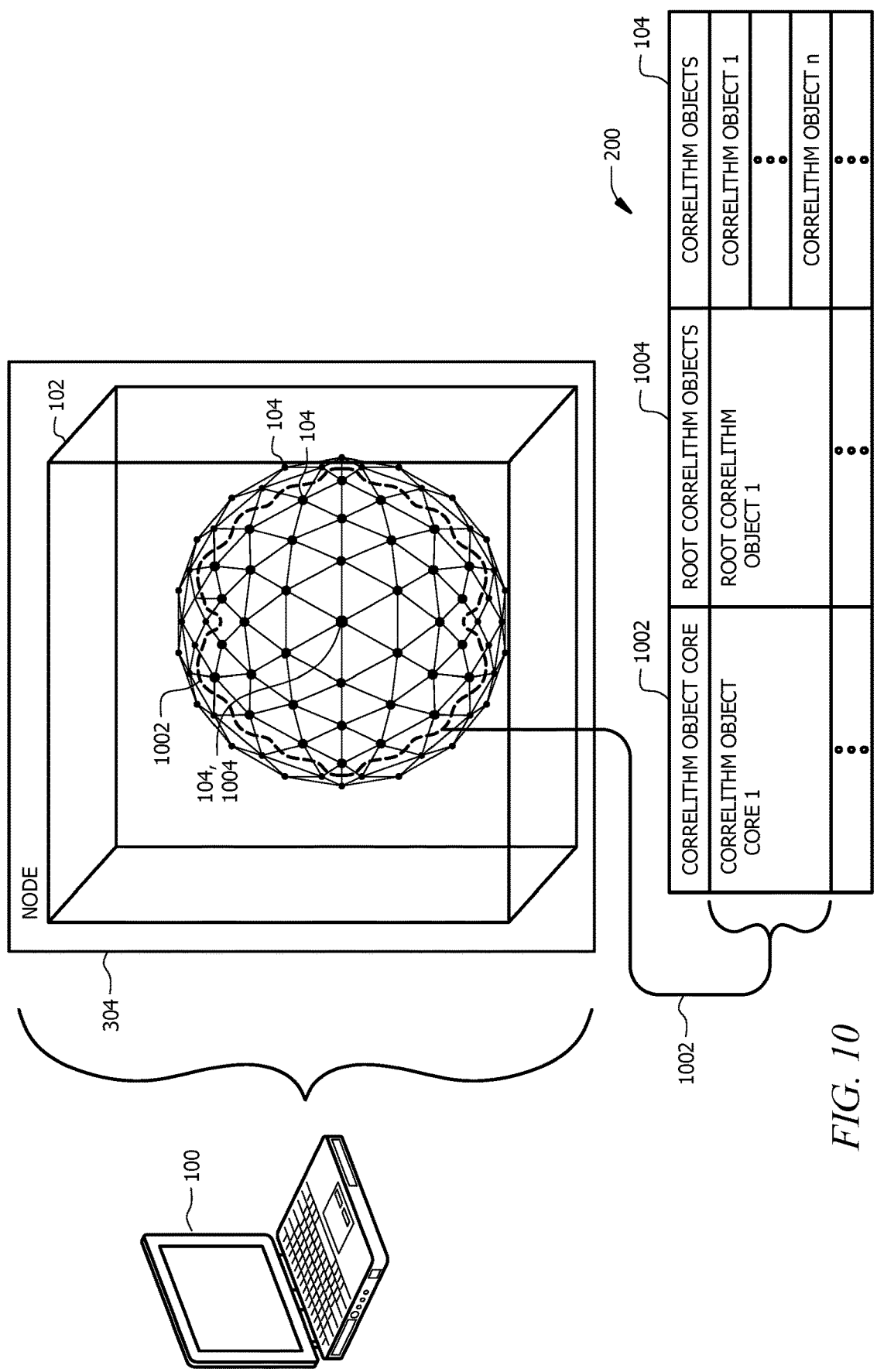
FIG. 10 is a schematic diagram of an embodiment of a device implementing a correlithm object core in a node for a correlithm object processing system.

FIG. 10 is a schematic diagram of an embodiment of a device 100 implementing a correlithm object core 1002 in a node 304 for a correlithm object processing system 300. In other embodiments, correlithm object cores 1002 may be integrated with a sensor 302 or an actor 306. Correlithm object cores 1002 can be used by a correlithm object processing system 300 to classify or group correlithm objects 104 and/or the data samples they represent. For example, a set of correlithm objects 104 can be grouped together by linking them with a correlithm object core 1402. The correlithm object core 1002 identifies the class or type associated with the set of correlithm objects 104.

In one embodiment, a correlithm object core 1002 comprises a root correlithm object 1004 that is linked with a set of correlithm objects 104. The set of correlithm objects 104 that are linked with the root correlithm object 1004 are the correlithm objects 104 which are located within the core distance of the root correlithm object 1004. The set of correlithm objects 104 are linked with only one root correlithm object 1004. The core distance can be computed using a process similar to the process described in FIG. 9. For example, in a 64-dimensional space 102 with a core distance defined at six sigma (i.e. six standard deviations), the core distance is equal to 8-bits. This means that correlithm objects 104 within up to eight hops away from the root correlithm object 1004 are members of the correlithm object core 1002 for the root correlithm object 1004.

In one embodiment, a data structure such as node table 200 may be used to map or link root correlithm objects 1004 with sets of correlithm objects 104. The node table 200 is generally configured to identify a plurality of root correlithm objects 1004 and correlithm objects 104 linked with the root correlithm objects 1004. For example, node table 200 may be configured with a first column that lists correlithm object cores 1002, a second column that lists root correlithm objects 1004, and a third column that lists correlithm objects 104. In other examples, the node table 200 may be configured in any other suitable manner or may be implemented using any other suitable data structure. In some embodiments, one or more mapping functions may be used to convert between correlithm objects 104 and a root correlithm object 1004.

Figure 11:
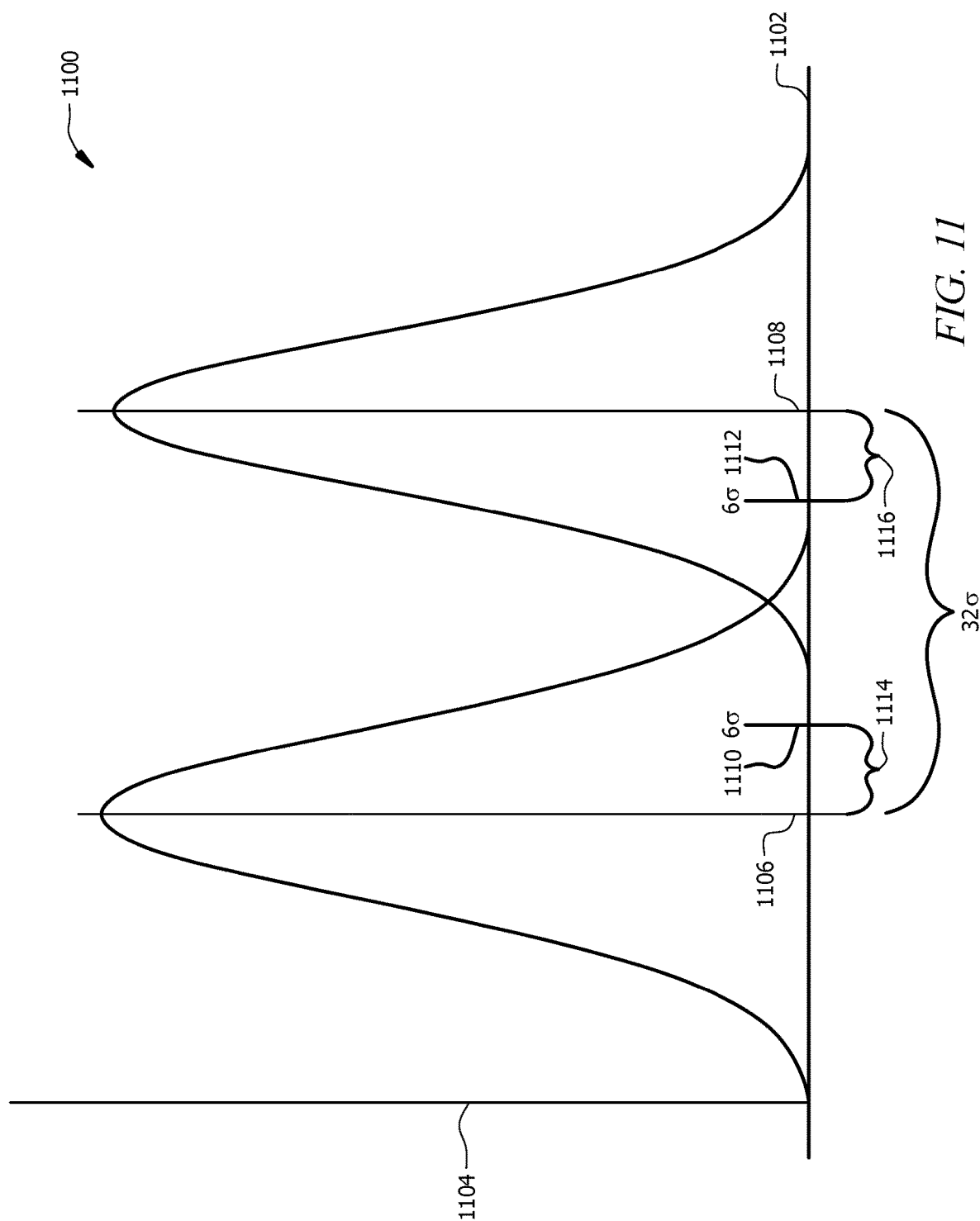
FIG. 11 is an embodiment of a graph of probability distributions for adjacent root correlithm objects.

FIG. 11 is an embodiment of a graph of probability distributions 1100 for adjacent root correlithm objects 1004. Axis 1102 indicates the distance between the root correlithm objects 1004, for example, in units of bits. Axis 1104 indicates the probability associated with the number of bits being different between a random correlithm object 104 and a root correlithm object 1004.

As an example, FIG. 11 illustrates the probability distributions for adjacent root correlithm objects 1004 in a 1024-dimensional space 102. Location 1106 illustrates the location of a first root correlithm object 1004 with respect to a second root correlithm object 1004. Location 1108 illustrates the location of the second root correlithm object 1004. Each root correlithm object 1004 is located an average distance away from each other which is equal to $$\frac{n}{2},$$

where 'n' is the number of dimensions in the n-dimensional space 102. In this example, the first root correlithm object 1004 and the second root correlithm object 1004 are 512 bits or 32 standard deviations away from each other.

In this example, the cutoff region for each root correlithm object 1004 is located at six standard deviations from locations 1106 and 1108. In other examples, the cutoff region may be located at any other suitable location. For example, the cutoff region defining the core distance may one, two, four, ten, or any other suitable number of standard deviations away from the average distance between correlithm objects 104 in the n-dimensional space 102. Location 1110 illustrates a first cutoff region that defines a first core distance 1114 for the first root correlithm object 1004. Location 1112 illustrates a second cutoff region that defines a second core distance 1116 for the second root correlithm object 1004.

In this example, the core distances for the first root correlithm object 1004 and the second root correlithm object 1004 do not overlap with each other. This means that correlithm objects 104 within the correlithm object core 1002 of one of the root correlithm objects 1004 are uniquely associated with the root correlithm object 1004 and there is no ambiguity.

Figures 12A, 12B:
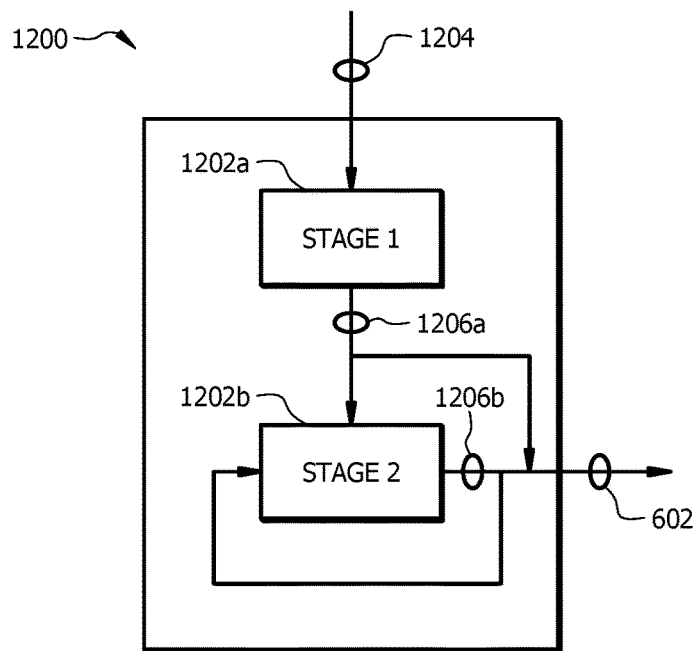
FIG. 12A is an embodiment of a string correlithm object generator.
FIG. 12B is an embodiment of a table demonstrating a change in bit values associated with sub-string correlithm objects.

FIG. 12A illustrates one embodiment of a string correlithm object generator 1200 configured to generate a string correlithm object 602 as output. String correlithm object generator 1200 is implemented by string correlithm object engine 522 and comprises a first processing stage 1202a communicatively and logically coupled to a second processing stage 1202b. First processing stage 1202 receives an input 1204 and outputs a first sub-string correlithm object 1206a that comprises an n-bit digital word wherein each bit has either a value of zero or one. In one embodiment, first processing stage 1202 generates the values of each bit randomly. Input 1204 comprises one or more parameters used to determine the characteristics of the string correlithm object 602. For example, input 1204 may include a parameter for the number of dimensions, n, in the n-dimensional space 102 (e.g., 64, 128, 256, etc.) in which to generate the string correlithm object 602. Input 1204 may also include a distance parameter, δ, that indicates a particular number of bits of the n-bit digital word (e.g., 4, 8, 16, etc.) that will be changed from one sub-string correlithm object 1206 to the next in the string correlithm object 602. Second processing stage 1202b receives the first sub-string correlithm object 1206a and, for each bit of the first sub-string correlithm object 1206a up to the particular number of bits identified in the distance parameter, δ, changes the value from a zero to a one or from a one to a zero to generate a second sub-string correlithm object 1206b. The bits of the first sub-string correlithm object 1206a that are changed in value for the second sub-string correlithm object 1206b are selected randomly from the n-bit digital word. The other bits of the n-bit digital word in second sub-string correlithm object 1206b remain the same values as the corresponding bits of the first sub-string correlithm object 1206a.

FIG. 12B illustrates a table 1220 that demonstrates the changes in bit values from a first sub-string correlithm object 1206a to a second sub-string correlithm object 1206b. In this example, assume that n=64 such that each sub-string correlithm object 1206 of the string correlithm object 602 is a 64-bit digital word. As discussed previously with regard to FIG. 9, the standard deviation is equal to $$\sqrt{\frac{n}{4}},$$

or four bits, for a 64-dimensional space 102. In one embodiment, the distance parameter, δ, is selected to equal the standard deviation. In this embodiment, the distance parameter is also four bits which means that four bits will be changed from each sub-string correlithm object 1206 to the next in the string correlithm object 602. In other embodiments where it is desired to create a tighter correlation among sub-string correlithm objects 1206, a distance parameter may be selected to be less than the standard deviation (e.g., distance parameter of three bits or less where standard deviation is four bits). In still other embodiments where it is desired to create a looser correlation among sub-string correlithm objects 1206, a distance parameter may be selected to be more than the standard deviation (e.g., distance parameter of five bits or more where standard deviation is four bits). Table 1220 illustrates the first sub-string correlithm object 1206a in the first column having four bit values that are changed, by second processing stage 1202b, from a zero to a one or from a one to a zero to generate second sub-string correlithm object 1206b in the second column. By changing four bit values, the core of the first sub-string correlithm object 1206a overlaps in 64-dimensional space with the core of the second sub-string correlithm object 1206b.

Referring back to FIG. 12A, the second processing stage 1202b receives from itself the second sub-string correlithm object 1206b as feedback. For each bit of the second sub-string correlithm object 1206b up to the particular number of bits identified by the distance parameter, the second processing stage 1202b changes the value from a zero to a one or from a one to a zero to generate a third sub-string correlithm object 1206c. The bits of the second sub-string correlithm object 1206b that are changed in value for the third sub-string correlithm object 1206c are selected randomly from the n-bit digital word. The other bits of the n-bit digital word in third sub-string correlithm object 1206c remain the same values as the corresponding bits of the second sub-string correlithm object 1206b. Referring back to table 1220 illustrated in FIG. 12B, the second sub-string correlithm object 1206b in the second column has four bit values that are changed, by second processing stage 1202b, from a zero to a one or from a one to a zero to generate third sub-string correlithm object 1206c in the third column.

Referring back to FIG. 12A, the second processing stage 1202b successively outputs a subsequent sub-string correlithm object 1206 by changing bit values of the immediately prior sub-string correlithm object 1206 received as feedback, as described above. This process continues for a predetermined number of sub-string correlithm objects 1206 in the string correlithm object 602. Together, the sub-string correlithm objects 1206 form a string correlithm object 602 in which the first sub-string correlithm object 1206a precedes and is adjacent to the second sub-string correlithm object 1206b, the second sub-string correlithm object 1206b precedes and is adjacent to the third sub-string correlithm object 1206c, and so on. Each sub-string correlithm object 1206 is separated from an adjacent sub-string correlithm object 1206 in n-dimensional space 102 by a number of bits represented by the distance parameter, δ.

Figure 13:
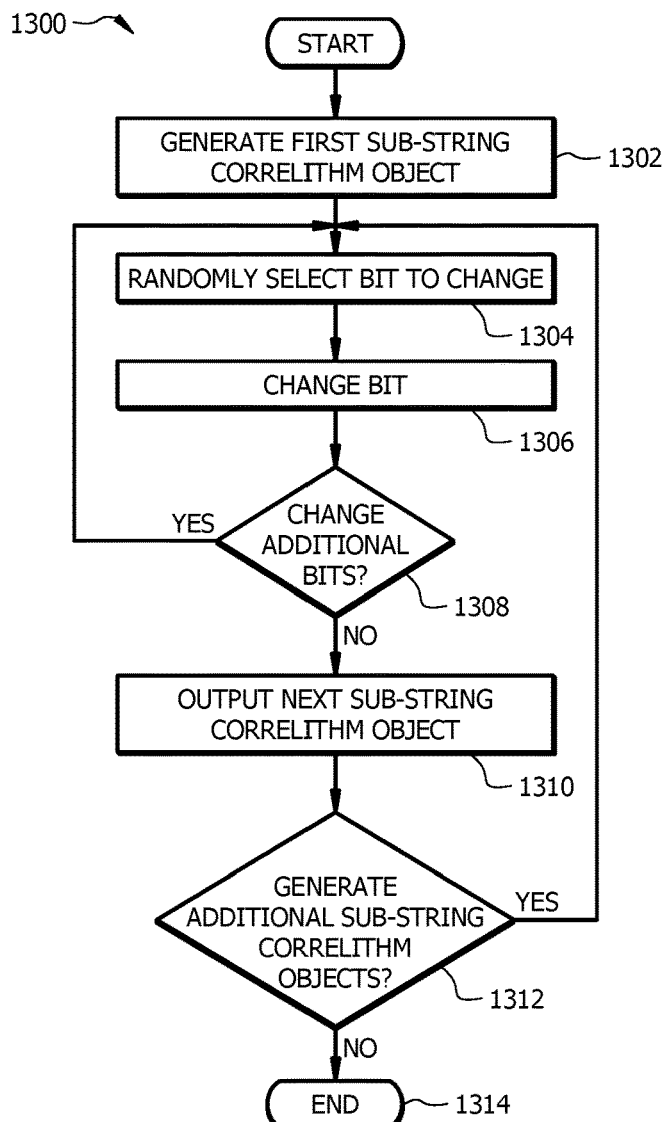
FIG. 13 is an embodiment of a process for generating a string correlithm object.

FIG. 13 is a flowchart of an embodiment of a process 1300 for generating a string correlithm object 602. At step 1302, a first sub-string correlithm object 1206a is generated, such as by a first processing stage 1202a of a string correlithm object generator 1200. The first sub-string correlithm object 1206a comprises an n-bit digital word. At step 1304, a bit of the n-bit digital word of the sub-string correlithm object 1206 is randomly selected and is changed at step 1306 from a zero to a one or from a one to a zero. Execution proceeds to step 1308 where it is determined whether to change additional bits in the n-bit digital word. In general, process 1300 will change a particular number of bits up to the distance parameter, δ. In one embodiment, as described above with regard to FIGS. 12A-B, the distance parameter is four bits. If additional bits remain to be changed in the sub-string correlithm object 1206, then execution returns to step 1304. If all of the bits up to the particular number of bits in the distance parameter have already been changed, as determined at step 1308, then execution proceeds to step 1310 where the second sub-string correlithm object 1206b is output. The other bits of the n-bit digital word in second sub-string correlithm object 1206b remain the same values as the corresponding bits of the first sub-string correlithm object 1206a.

Execution proceeds to step 1312 where it is determined whether to generate additional sub-string correlithm objects 1206 in the string correlithm object 602. If so, execution returns back to step 1304 and the remainder of the process occurs again to change particular bits up to the number of bits in the distance parameter, S. Each subsequent sub-string correlithm object 1206 is separated from the immediately preceding sub-string correlithm object 1206 in n-dimensional space 102 by a number of bits represented by the distance parameter, S. If no more sub-string correlithm objects 1206 are to be generated in the string correlithm object 602, as determined at step 1312, execution of process 1300 terminates at steps 1314.

A string correlithm object 602 comprising a series of adjacent sub-string correlithm objects 1206 whose cores overlap with each other permits data values to be correlated with each other in n-dimensional space 102. Thus, where discrete data values have a pre-existing relationship with each other in the real-world, those relationships can be maintained in n-dimensional space 102 if they are represented by sub-string correlithm objects of a string correlithm object 602. For example, the letters of an alphabet have a relationship with each other in the real-world. In particular, the letter "A" precedes the letters "B" and "C" but is closer to the letter "B" than the letter "C". Thus, if the letters of an alphabet are to be represented by a string correlithm object 602, the relationship between letter "A" and the letters "B" and "C" should be maintained such that "A" precedes but is closer to letter "B" than letter "C." Similarly, the letter "B" is equidistant to both letters "A" and "C," but the letter "B" is subsequent to the letter "A" and preceding the letter "C". Thus, if the letters of an alphabet are to be represented by a string correlithm object 602, the relationship between letter "B" and the letters "A" and "C" should be maintained such that the letter "B" is equidistant but subsequent to letter "A" and preceding letter "C." The ability to migrate these relationships between data values in the real-world to relationships among correlithm objects provides a significant advance in the ability to record, store, and faithfully reproduce data within different computing environments.

Figure 14:
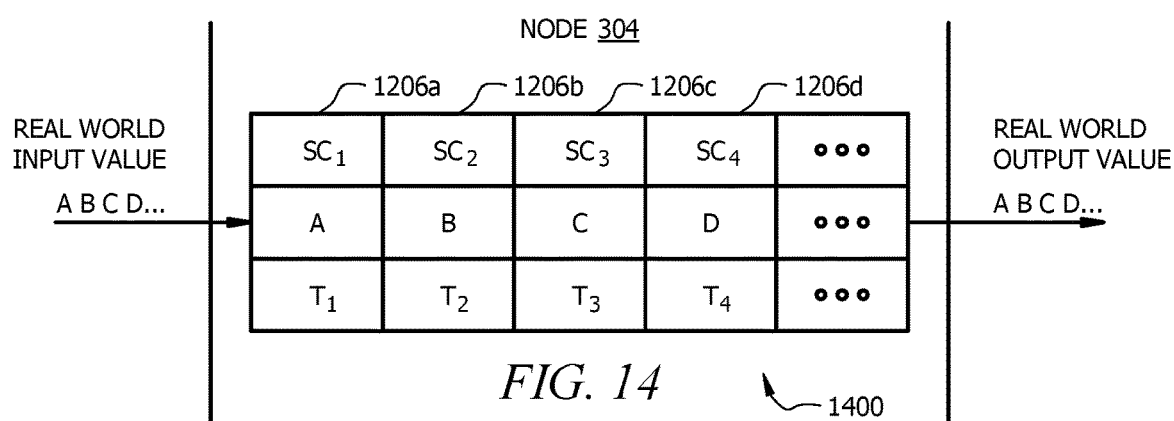
FIG. 14 is an embodiment of discrete data values mapped to sub-string correlithm objects of a string correlithm object.

FIG. 14 illustrates how data values that have pre-existing relationships with each other can be mapped to sub-string correlithm objects 1206 of a string correlithm object 602 in n-dimensional space 102 by string correlithm object engine 522 to maintain their relationships to each other. Although the following description of FIG. 14 is illustrated with respect to letters of an alphabet as representing data values that have pre-existing relationships to each other, other data values can also be mapped to string correlithm objects 602 using the techniques discussed herein. In particular, FIG. 14 illustrates a node table 1400 stored in memory 504 that includes a column for a subset of sub-string correlithm objects 1206 of a string correlithm object 602. The first sub-string correlithm object 1206a is mapped to a discrete data value, such as the letter "A" of the alphabet. The second sub-string correlithm object 1206b is mapped to a discrete data value, such as the letter "B" of the alphabet, and so on with sub-string correlithm objects 1206c and 1206d mapped to the letters "C" and "D". As discussed above, the letters of the alphabet have a correlation with each other, including a sequence, an ordering, and a distance from each other. These correlations among letters of the alphabet could not be maintained as represented in n-dimensional space if each letter was simply mapped to a random correlithm object 104. Accordingly, to maintain these correlations, the letters of the alphabet are mapped to sub-string correlation objects 1206 of a string correlation object 602. This is because, as described above, the adjacent sub-string correlation objects 1206 of a string correlation object 602 also have a sequence, an ordering, and a distance from each other that can be maintained in n-dimensional space.

In particular, just like the letters "A," "B," "C," and "D" have an ordered sequence in the real-world, the sub-string correlithm objects 1206a, 1206b, 1206c, and 1206d have an ordered sequence and distance relationships to each other in n-dimensional space. Similarly, just like the letter "A" precedes but is closer to the letter "B" than the letter "C" in the real-world, so too does the sub-string correlithm object 1206a precede but is closer to the sub-string correlithm object 1206b than the sub-string correlithm object 1206c in n-dimensional space. Similarly, just like the letter "B" is equidistant to but in between the letters "A" and "C" in the real world, so too is the sub-string correlithm object 1206b equidistant to but in between the sub-string correlithm objects 1206a and 1206c in n-dimensional space. Although the letters of the alphabet are used to provide an example of data in the real world that has a sequence, an ordering, and a distance relationship to each other, one of skill in the art will appreciate that any data with those characteristics in the real world can be represented by sub-string correlithm objects 1206 to maintain those relationships in n-dimensional space.

Because the sub-string correlithm objects 1206 of a string correlithm object 602 maintains the sequence, ordering, and/or distance relationships between real-world data in n-dimensional space, node 304 can output the real-world data values (e.g., letters of the alphabet) in the sequence in which they occurred. In one embodiment, the sub-string correlithm objects 1206 can also be associated with timestamps, $t_{1-4}$, to aid with maintaining the relationship of the real-world data with a sequence using the time at which they occurred. For example, sub-string correlithm object 1206a can be associated with a first timestamp, $t_1$; sub-string correlithm object 1206b can be associated with a second timestamp, $t_2$; and so on. In one embodiment where the real-world data represents frames of a video signal that occur at different times of an ordered sequence, maintaining a timestamp in the node table 1400 aids with the faithful reproduction of the real-world data at the correct time in the ordered sequence. In this way, the node table 1400 can act as a recorder by recording discrete data values for a time period extending from at least the first timestamp, $t_1$ to a later timestamp, $t_n$. Also, in this way, the node 304 is also configured to reproduce or playback the real-world data represented by the sub-string correlithm objects 1206 in the node table 1400 for a period of time extending from at least the first timestamp, $t_1$ to a later timestamp, $t_n$. The ability to record real-world data, associate it to sub-string correlithm objects 1206 in n-dimensional space while maintaining its order, sequence, and distance relationships, and subsequently faithfully reproduce the real-world data as originally recorded provides a significant technical advantage to computing systems.

Figure 15A:
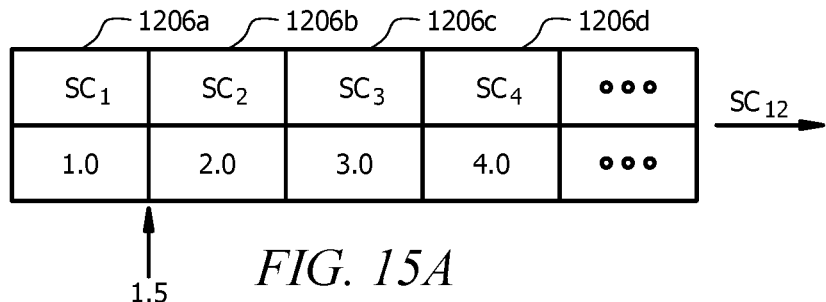
FIG. 15A is an embodiment of analog data values mapped to sub-string correlithm objects of a string correlithm object.

The examples described above relate to representing discrete data values, such as letters of an alphabet, using sub-string correlithm objects 1206 of a string correlithm object 602. However, sub-string correlithm objects 1206 also provide the flexibility to represent non-discrete data values, or analog data values, using interpolation from the real world to n-dimensional space 102. FIG. 15A illustrates how analog data values that have pre-existing relationships with each other can be mapped to sub-string correlithm objects 1206 of a string correlithm object 602 in n-dimensional space 102 by string correlithm object engine 522 to maintain their relationships to each other. FIG. 15A illustrates a node table 1500 stored in memory 504 that includes a column for each sub-string correlithm object 1206 of a string correlithm object 602. The first sub-string correlithm object 1206a is mapped to an analog data value, such as the number "1.0". The second sub-string correlithm object 1206b is mapped to an analog data value, such as the number "2.0", and so on with sub-string correlithm objects 1206c and 1206d mapped to the numbers "3.0" and "4.0." Just like the letters of the alphabet described above, these numbers have a correlation with each other, including a sequence, an ordering, and a distance from each other. One difference between representing discrete data values (e.g., letters of an alphabet) and analog data values (e.g., numbers) using sub-string correlithm objects 1206 is that new analog data values that fall between pre-existing analog data values can be represented using new sub-string correlithm objects 1206 using interpolation, as described in detail below.

If node 304 receives an input representing an analog data value of 1.5, for example, then string correlithm object engine 522 can determine a new sub-string correlithm object 1206 that maintains the relationship between this input of 1.5 and the other numbers that are already represented by sub-string correlithm objects 1206. In particular, node table 1500 illustrates that the analog data value 1.0 is represented by sub-string correlithm object 1206a and analog data value 2.0 is represented by sub-string correlithm object 1206b. Because the analog data value 1.5 is between the data values of 1.0 and 2.0, then a new sub-string correlithm object 1206 would be created in n-dimensional space 102 between sub-string correlithm objects 1206a and 1206b. This is done by interpolating the distance in n-dimensional space 102 between sub-string correlithm objects 1206a and 1206b that corresponds to the distance between 1.0 and 2.0 where 1.5 resides and representing that interpolation using an appropriate n-bit digital word. In this example, the analog data value of 1.5 is halfway between the data values of 1.0 and 2.0. Therefore, the sub-string correlithm object 1206 that is determined to represent the analog data value of 1.5 would be halfway between the sub-string correlithm objects 1206a and 1206b in n-dimensional space 102. Generating a sub-string correlithm object 1206 that is halfway between sub-string correlithm objects 1206a and 1206b in n-dimensional space 102 involves modifying bits of the n-bit digital words representing the sub-string correlithm objects 1206a and 1206b. This process is illustrated with respect to FIG. 15B.

Figure 15B:
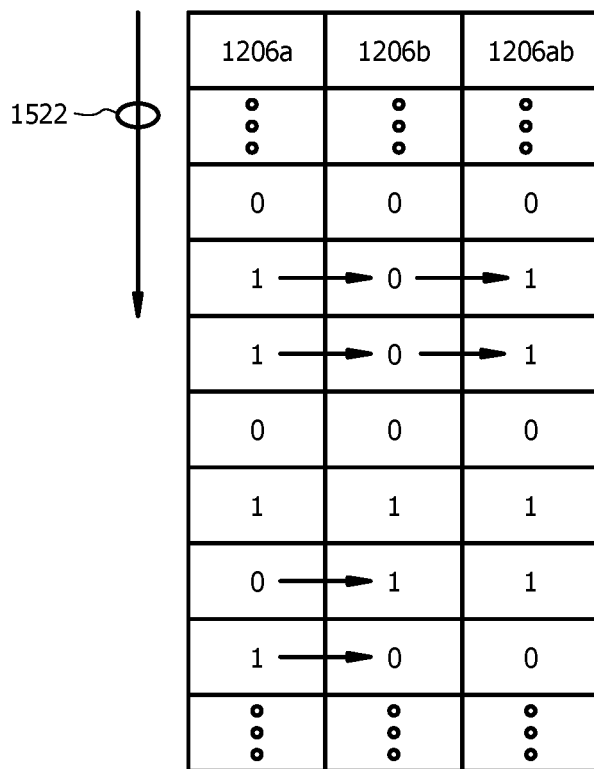
FIG. 15B is an embodiment of a table demonstrating how to map analog data values to sub-string correlithm objects using interpolation.

FIG. 15B illustrates a table 1520 with a first column representing the n-bit digital word of sub-string correlithm object 1206a that is mapped in the node table 1500 to the data value 1.0; a second column representing the n-bit digital word of sub-string correlithm object 1206b that is mapped in the node table 1500 to the data value 2.0; and a third column representing the n-bit digital word of sub-string correlithm object 1206ab that is generated and associated with the data value 1.5. Table 1520 is stored in memory 504. As described above with regard to table 1220, the distance parameter, δ, between adjacent sub-string correlithm objects 1206a and 1206b was chosen, in one embodiment, to be four bits. This means that for a 64-bit digital word, four bits have been changed from a zero to a one or from a one to a zero in order to generate sub-string correlithm object 1206b from sub-string correlithm object 1206a.

In order to generate sub-string correlithm object 1206ab to represent the data value of 1.5, a particular subset of those four changed bits between sub-string correlithm objects 1206a and 1206b should be modified. Moreover, the actual bits that are changed should be selected successively from one end of the n-bit digital word or the other end of the n-bit digital word. Because the data value of 1.5 is exactly halfway between the data values of 1.0 and 2.0, then it can be determined that exactly half of the four bits that are different between sub-string correlithm object 1206a and sub-string correlithm object 1206b should be changed to generate sub-string correlithm object 1206ab. In this particular example, therefore, starting from one end of the n-bit digital word as indicated by arrow 1522, the first bit that was changed from a value of one in sub-string correlithm object 1206a to a value of zero in sub-string correlithm object 1206b is changed back to a value of one in sub-string correlithm object 1206ab. Continuing from the same end of the n-bit digital word as indicated by arrow 1522, the next bit that was changed from a value of one in sub-string correlithm object 1206a to a value of zero in sub-string correlithm object 1206b is changed back to a value of one in sub-string correlithm object 1206ab. The other two of the four bits that were changed from sub-string correlithm object 1206a to sub-string correlithm object 1206b are not changed back. Accordingly, two of the four bits that were different between sub-string correlithm objects 1206a and 1206b are changed back to the bit values that were in sub-string correlithm object 1206a in order to generate sub-string correlithm object 1206ab that is halfway between sub-string correlithm objects 1206a and 1206b in n-dimensional space 102 just like data value 1.5 is halfway between data values 1.0 and 2.0 in the real world. Other input data values can also be interpolated and represented in n-dimensional space 102, as described above. For example, if the input data value received was 1.25, then it is determined to be one-quarter of the distance from the data value 1.0 and three-quarters of the distance from the data value 2.0. Accordingly, a sub-string correlithm object 1206ab can be generated by changing back three of the four bits that differ between sub-string correlithm objects 1206a and 1206b. In this regard, the sub-string correlithm object 1206ab (which represents the data value 1.25) will only differ by one bit from the sub-string correlithm object 1206a (which represents the data value 1.0) in n-dimensional space 102. Similarly, if the input data value received was 1.75, then it is determined to be three-quarters of the distance from the data value 1.0 and one-quarter of the distance from the data value 2.0. Accordingly, a sub-string correlithm object 1206ab can be generated by changing back one of the four bits that differ between sub-string correlithm objects 1206a and 1206b. In this regard, the sub-string correlithm object 1206ab (which represents the data value 1.75) will differ by one bit from the sub-string correlithm object 1206b (which represents the data value 2.0) in n-dimensional space 102. In this way, the distance between data values in the real world can be interpolated to the distance between sub-string correlithm objects 1206 in n-dimensional space 102 in order to preserve the relationships among analog data values.

Although the example above was detailed with respect to changing bit values from the top end of the n-bit digital word represented by arrow 1522, the bit values can also be successively changed from the bottom end of the n-bit digital word. The key is that of the bit values that differ from sub-string correlithm object 1206a to sub-string correlithm object 1206b, the bit values that are changed to generate sub-string correlithm object 1206ab should be taken consecutively as they are encountered whether from the top end of the n-bit digital word (as represented by arrow 1522) or from the bottom end of the n-bit digital word. This ensures that sub-string correlithm object 1206ab will actually be between sub-string correlithm objects 1206a and 1206b rather than randomly drifting away from both of sub-string correlithm objects 1206a and 1206b in n-dimensional space 102.

Figure 16:
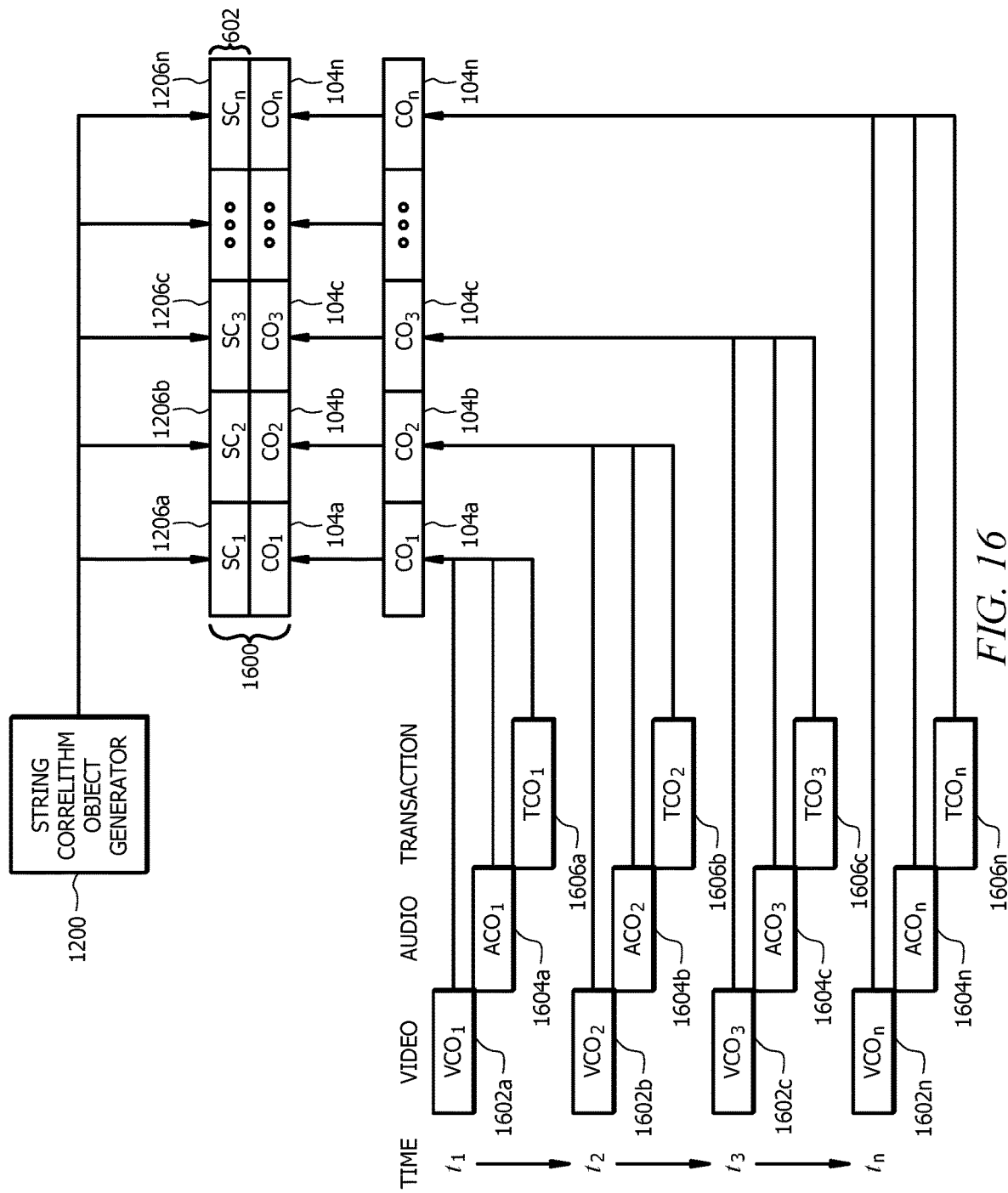
FIG. 16 is an embodiment of non-string correlithm objects mapped to sub-string correlithm objects of a string correlithm object.

FIG. 16 illustrates how real-world data values can be aggregated and represented by correlithm objects 104 (also referred to as non-string correlithm objects 104), which are then linked to corresponding sub-string correlithm objects 1206 of a string correlithm object 602 by string correlithm object engine 522. As described above with regard to FIG. 12A, a string correlithm object generator 1200 generates sub-string correlithm objects 1206 that are adjacent to each other in n-dimensional space 102 to form a string correlithm object 602. The sub-string correlithm objects 1206a-n embody an ordering, sequence, and distance relationships to each other in n-dimensional space 102. As described in detail below, non-string correlithm objects 104 can be mapped to corresponding sub-string correlithm objects 1206 and stored in a node table 1600 to provide an ordering or sequence among them in n-dimensional space 102. This allows node table 1600 to record, store, and faithfully reproduce or playback a sequence of events that are represented by non-string correlithm objects 104a-n. In one embodiment, the sub-string correlithm objects 1206 and the non-string correlithm objects 104 can both be represented by the same length of digital word, n, (e.g., 64 bit, 128 bit, 256 bit). In another embodiment, the sub-string correlithm objects 1206 can be represented by a digital word of one length, n, and the non-string correlithm objects 104 can be represented by a digital word of a different length, m.

In a particular embodiment, the non-string correlithm objects 104a-n can represent aggregated real-world data. For example, real-world data may be generated related to the operation of an automated teller machine (ATM). In this example, the ATM machine may have a video camera and a microphone to tape both the video and audio portions of the operation of the ATM by one or more customers in a vestibule of a bank facility or drive-through. The ATM machine may also have a processor that conducts and stores information regarding any transactions between the ATM and the customer associated with a particular account. The bank facility may simultaneously record video, audio, and transactional aspects of the operation of the ATM by the customer for security, audit, or other purposes. By aggregating the real-world data values into non-string correlithm objects 104 and associating those non-string correlithm objects 104 with sub-string correlithm objects 1206, as described in greater detail below, the correlithm object processing system may maintain the ordering, sequence, and other relationships between the real-world data values in n-dimensional space 102 for subsequent reproduction or playback. Although the example above is detailed with respect to three particular types of real-world data (i.e., video, audio, transactional data associated with a bank ATM) that are aggregated and represented by correlithm objects 104, it should be understood that any suitable number and combination of different types of real-world data can be aggregated and represented in this example.

For a period of time from $t_1$ to $t_n$, the ATM records video, audio, and transactional real-world data. For example, the period of time may represent an hour, a day, a week, a month, or other suitable time period of recording. The real-world video data is represented by video correlithm objects 1602. The real-world audio data is represented by audio correlithm objects 1604. The real-world transaction data is represented by transaction correlithm objects 1606. The correlithm objects 1602, 1604, and 1606 can be aggregated to form non-string correlithm objects 104. For example, at a first time, $t_1$, the ATM generates: (a) real-world video data that is represented as a first video correlithm object 1602a; (b) real-world audio data that is represented by a first audio correlithm object 1604a; and (c) real-world transaction data that is represented by a first transaction correlithm object 1606a. Correlithm objects 1602a, 1604a, and 1606a can be represented as a single non-string correlithm object 104a which is then associated with first sub-string correlithm object 1206a in the node table 1600. In one embodiment, the timestamp, $t_1$, can also be captured in the non-string correlithm object 104a. In this way, three different types of real-world data are captured, represented by a non-string correlithm object 104 and then associated with a portion of the string correlithm object 602.

Continuing with the example, at a second time, $t_2$, the ATM generates: (a) real-world video data that is represented as a second video correlithm object 1602b; (b) real-world audio data that is represented by a second audio correlithm object 1604b; and (c) real-world transaction data that is represented by a second transaction correlithm object 1606b. The second time, $t_2$, can be a predetermined time or suitable time interval after the first time, $t_1$, or it can be at a time subsequent to the first time, $t_1$, where it is determined that one or more of the video, audio, or transaction data has changed in an meaningful way (e.g., video data indicates that a new customer entered the vestibule of the bank facility; another audible voice is detected or the customer has made an audible request to the ATM; or the customer is attempting a different transaction or a different part of the same transaction). Correlithm objects 1602b, 1604b, and 1606b can be represented as a single non-string correlithm object 104b which is then associated with second sub-string correlithm object 1206b in the node table 1600. In one embodiment, the timestamp, $t_2$, can also be captured in the non-string correlithm object 104b.

Continuing with the example, at a third time, $t_3$, the ATM generates: (a) real-world video data that is represented as a third video correlithm object 1602c; (b) real-world audio data that is represented by a third audio correlithm object 1604c; and (c) real-world transaction data that is represented by a third transaction correlithm object 1606c. The third time, $t_3$, can be a predetermined time or suitable time interval after the second time, $t_2$, or it can be at a time subsequent to the second time, $t_2$, where it is determined that one or more of the video, audio, or transaction data has changed again in a meaningful way, as described above.

Correlithm objects 1602c, 1604c, and 1606c can be represented as a single non-string correlithm object 104c which is then associated with third sub-string correlithm object 1206c in the node table 1600. In one embodiment, the timestamp, $t_3$, can also be captured in the non-string correlithm object 104c.

Concluding with the example, at an n-th time, $t_n$, the ATM generates: (a) real-world video data that is represented as an n-th video correlithm object 1602n; (b) real-world audio data that is represented by an n-th audio correlithm object 1604n; and (c) real-world transaction data that is represented by an n-th transaction correlithm object 1606n. The third time, $t_n$, can be a predetermined time or suitable time interval after a previous time, $t_{n-1}$, or it can be at a time subsequent to the previous time, $t_{n-1}$, where it is determined that one or more of the video, audio, or transaction data has changed again in a meaningful way, as described above. Correlithm objects 1602n, 1604n, and 1606n can be represented as a single non-string correlithm object 104n which is then associated with n-th sub-string correlithm object 1206n in the node table 1600. In one embodiment, the timestamp, $t_n$, can also be captured in the non-string correlithm object 104n.

As illustrated in FIG. 16, different types of real-world data (e.g., video, audio, transactional) can be captured and represented by correlithm objects 1602, 1604, and 1606 at particular timestamps. Those correlithm objects 1602, 1604, and 1606 can be aggregated into correlithm objects 104. In this way, the real-world data can be "fanned in" and represented by a common correlithm object 104. By capturing real-world video, audio, and transaction data at different relevant timestamps from $t_1$-$t_n$, representing that data in correlithm objects 104, and then associating those correlithm objects 104 with sub-string correlithm objects 1206 of a string correlithm object 602, the node table 1600 described herein can store vast amounts of real-world data in n-dimensional space 102 for a period of time while preserving the ordering, sequence, and relationships among real-world data events and corresponding correlithm objects 104 so that they can be faithfully reproduced or played back in the real-world, as desired. This provides a significant savings in memory capacity.

Figure 17:
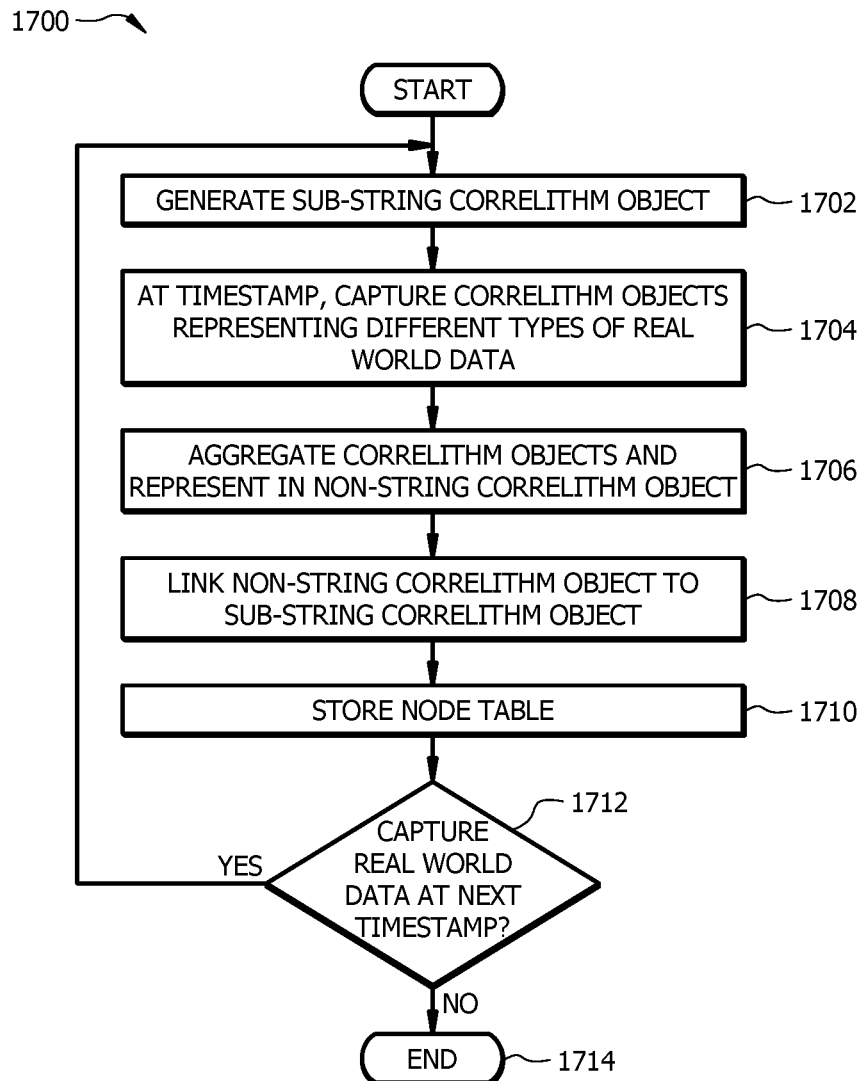
FIG. 17 is an embodiment of a process for mapping non-string correlithm objects to sub-string correlithm objects of a string correlithm object.

FIG. 17 is a flowchart of an embodiment of a process 1700 for linking non-string correlithm objects 104 with sub-string correlithm objects 1206. At step 1702, string correlithm object generator 1200 generates a first sub-string correlithm object 1206a. Execution proceeds to step 1704 where correlithm objects 104 are used to represent different types of real-world data at a first timestamp, $t_1$. For example, correlithm object 1602a represents real-world video data; correlithm object 1604a represents real-world audio data; and correlithm object 1606a represents real-world transaction data. At step 1706, each of correlithm objects 1602a, 1604a, and 1606a captured at the first timestamp, $t_1$, are aggregated and represented by a non-string correlithm object 104a. Execution proceeds to step 1708, where non-string correlithm object 104a is linked to sub-string correlithm object 1206a, and this association is stored in node table 1600 at step 1710. At step 1712, it is determined whether real-world data at the next timestamp should be captured. For example, if a predetermined time interval since the last timestamp has passed or if a meaningful change to the real-world data has occurred since the last timestamp, then execution returns to steps 1702-1710 where another sub-string correlithm object 1206 is generated (step 1702); correlithm objects representing real-world data is captured at the next timestamp (step 1704); those correlithm objects are aggregated and represented in a non-string correlithm object 104 (step 1706); that non-string correlithm object 104 is linked with a sub-string correlithm object 1206 (step 1708); and this association is stored in the node table 1600 (step 1710). If no further real-world data is to be captured at the next timestamp, as determined at step 1712, then execution ends at step 1714.

Figure 18:
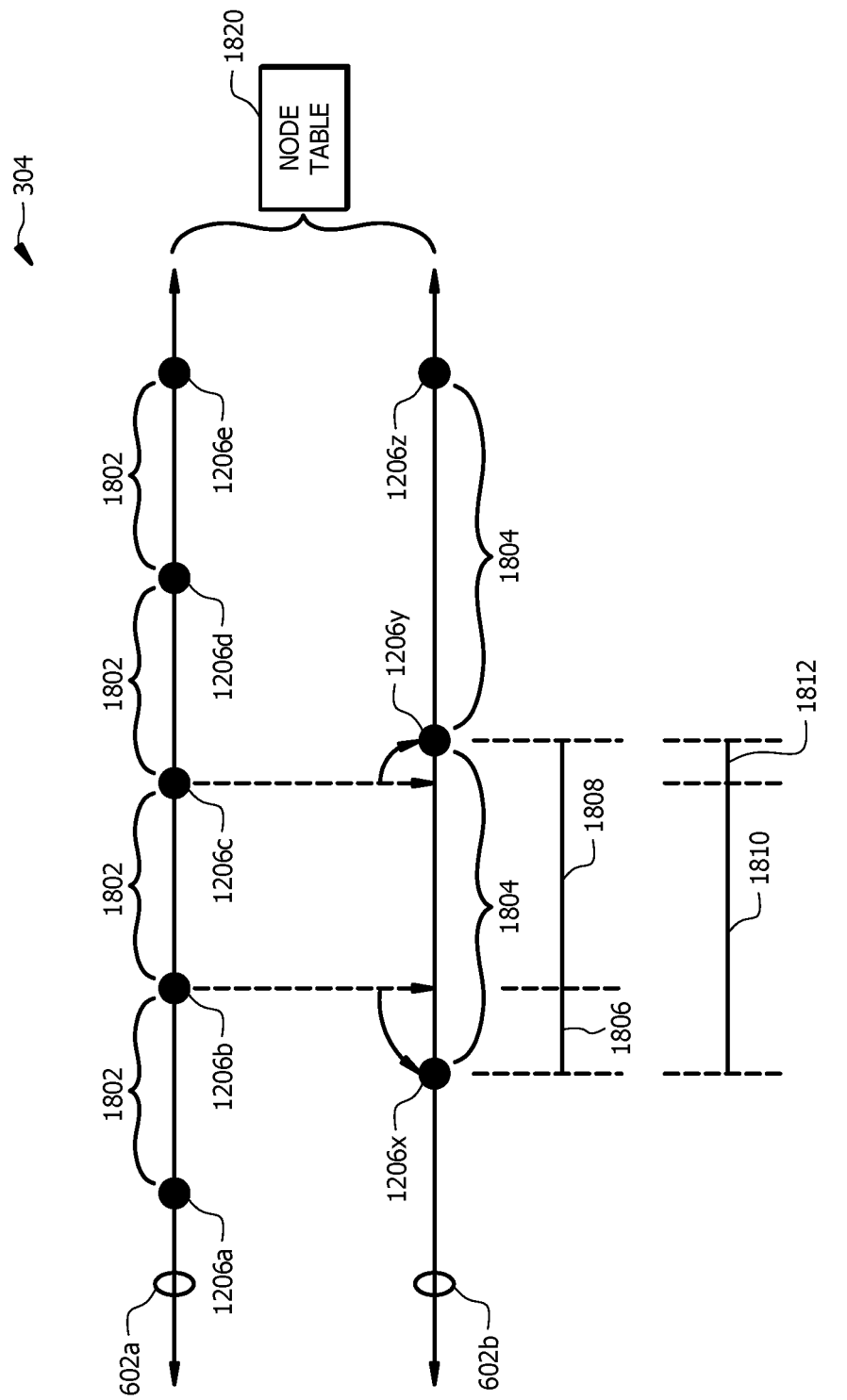
FIG. 18 is an embodiment of sub-string correlithm objects of a first string correlithm object mapped to sub-string correlithm objects of a second string correlithm objects.

FIG. 18 illustrates how sub-string correlithm objects 1206a-e of a first string correlithm object 602a are linked to sub-string correlithm objects 1206x-z of a second string correlithm object 602b by string correlithm object engine 522. The first string correlithm object 602a includes sub-string correlithm objects 1206a-e that are separated from each other by a first distance 1802 in n-dimensional space 102. The second string correlithm object 602b includes sub-string correlithm objects 1206x-z that are separated from each other by a second distance 1804 in n-dimensional space 102. In one embodiment, the sub-string correlithm objects 1206a-e of the first string correlithm object 602a and the sub-string correlithm objects 1206x-z can both be represented by the same length of digital word, n, (e.g., 64-bit, 128-bit, 256-bit). In another embodiment, the sub-string correlithm objects 1206a-e of the first string correlithm object 602a can be represented by a digital word of one length, n, and the sub-string correlithm objects 1206x-z of the second string correlithm object 602b can be represented by a digital word of a different length, m. Each sub-string correlithm object 1206a-e represents a particular data value, such as a particular type of real-world data value. When a particular sub-string correlithm object 1206a-e of the first string correlithm object 602 is mapped to a particular sub-string correlithm object 1206x-z of the second string correlithm object 602, as described below, then the data value associated with the sub-string correlithm object 1206a-e of the first string correlithm object 602a becomes associated with the mapped sub-string correlithm object 1206x-z of the second string correlithm object 602b.

Mapping data represented by sub-string correlithm objects 1206a-e of a first string correlithm object 602a in a smaller n-dimensional space 102 (e.g., 64-bit digital word) where the sub-string correlithm objects 1206a-e are more tightly correlated to sub-string correlithm objects 1206x-z of a second string correlithm object 602b in a larger n-dimensional space 102 (e.g., 256-bit digital word) where the sub-string correlithm objects 1206x-y are more loosely correlated (or vice versa) can provide several technical advantages in a correlithm object processing system. For example, such a mapping can be used to compress data and thereby save memory resources. In another example, such a mapping can be used to spread out data and thereby create additional space in n-dimensions for the interpolation of data. In yet another example, such a mapping can be used to apply a transformation function to the data (e.g., linear transformation function or non-linear transformation function) from the first string correlithm object 602a to the second string correlithm object 602b.

The mapping of a first string correlithm object 602a to a second correlithm object 602b operates, as described below. First, a node 304 receives a particular sub-string correlithm object 1206, such as 1206b illustrated in FIG. 18. To map this particular sub-string correlithm object 1206b to the second correlithm object 602b, the node 304 determines the proximity of it to corresponding sub-string correlithm objects 1206x and 1206y in second string correlithm object 602b (e.g., by determining the Hamming distance between 1206b and 1206x, and between 1206b and 1206y). In particular, node 304 determines a first proximity 1806 in n-dimensional space between the sub-string correlithm object 1206b and sub-string correlithm object 1206x; and determines a second proximity 1808 in n-dimensional space between the sub-string correlithm object 1206b and sub-string correlithm object 1206y. As illustrated in FIG. 18, the first proximity 1806 is smaller than the second proximity 1808. Therefore, sub-string correlithm object 1206b is closer in n-dimensional space 102 to sub-string correlithm object 1206x than to sub-string correlithm object 1206y. Accordingly, node 304 maps sub-string correlithm object 1206b of first string correlithm object 602a to sub-string correlithm object 1206x of second string correlithm object 602b and maps this association in node table 1820 stored in memory 504.

The mapping of the first string correlithm object 602a to a second correlithm object 602b continues in operation, as described below. The node 304 receives another particular sub-string correlithm object 1206, such as 1206c illustrated in FIG. 18. To map this particular sub-string correlithm object 1206c to the second correlithm object 602b, the node 304 determines the proximity of it to corresponding sub-string correlithm objects 1206x and 1206y in second string correlithm object 602b. In particular, node 304 determines a first proximity 1810 in n-dimensional space between the sub-string correlithm object 1206c and sub-string correlithm object 1206x; and determines a second proximity 1812 in n-dimensional space between the sub-string correlithm object 1206c and sub-string correlithm object 1206y. As illustrated in FIG. 18, the second proximity 1812 is smaller than the second proximity 1810. Therefore, sub-string correlithm object 1206c is closer in n-dimensional space 102 to sub-string correlithm object 1206y than to sub-string correlithm object 1206x. Accordingly, node 304 maps sub-string correlithm object 1206c of first string correlithm object 602a to sub-string correlithm object 1206y of second string correlithm object 602b and maps this association in node table 1820.

The sub-string correlithm objects 1206a-e may be associated with timestamps in order to capture a temporal relationship among them and with the mapping to sub-string correlithm objects 1206x-z. For example, sub-string correlithm object 1206a may be associated with a first timestamp, second sub-string correlithm object 1206b may be associated with a second timestamp later than the first timestamp, and so on.

Figure 19:
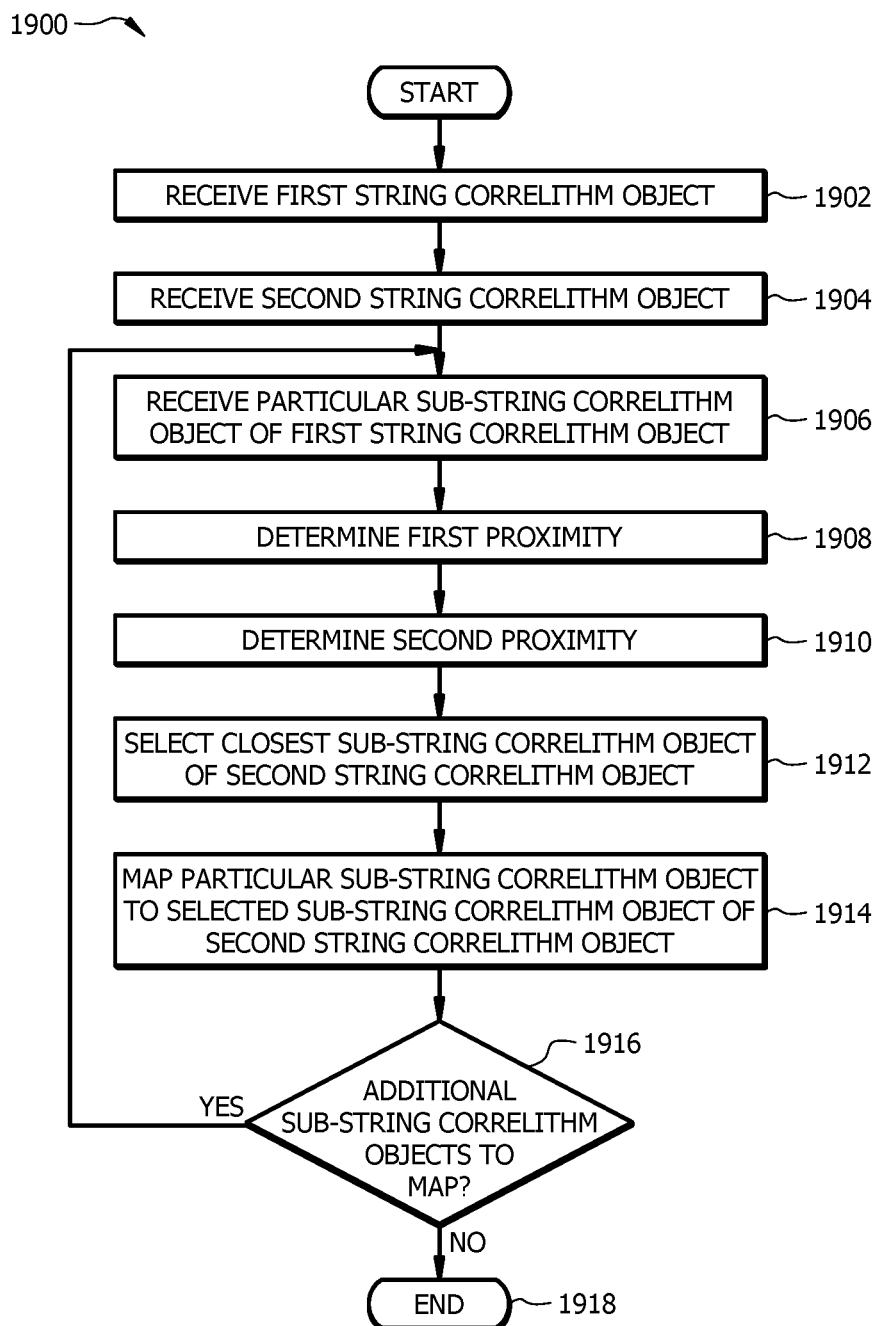
FIG. 19 is an embodiment of a process for mapping sub-string correlithm objects of a first string correlithm object to sub-string correlithm objects of a second string correlithm objects.

FIG. 19 is a flowchart of an embodiment of a process 1900 for linking a first string correlithm object 602a with a second string correlithm object 602b. At step 1902, a first string correlithm object 602a is received at node 304. The first correlithm object 602a includes a first plurality of sub-string correlithm objects 1206, such as 1206a-e illustrated in FIG. 18. Each of these sub-string correlithm objects 1206a-e are separated from each other by a first distance 1802 in n-dimensional space 102. At step 1904, a second string correlithm object 602b is received at node 304. The second correlithm object 602b includes a second plurality of sub-string correlithm objects 1206, such as 1206x-z illustrated in FIG. 18. Each of these sub-string correlithm objects 1206x-z are separated from each other by a second distance 1804 in n-dimensional space 102. At step 1906, node 304 receives a particular sub-string string correlithm object 1206 of the first string correlithm object 602a. At step 1908, node 304 determines a first proximity in n-dimensional space 102, such as proximity 1806 illustrated in FIG. 18, to a corresponding sub-string correlithm object 1206 of second correlithm object 602b, such as sub-string correlithm object 1206x illustrated in FIG. 18. At step 1910, node 304 determines a second proximity in n-dimensional space 102, such as proximity 1808 illustrated in FIG. 18, to a corresponding sub-string correlithm object 1206 of second correlithm object 602*b*, such as sub-string correlithm object 1206*y* illustrated in FIG. 18.

At step 1912, node 304 selects the sub-string correlithm object 1206 of second string correlithm object 602*b* to which the particular sub-string correlithm object 1206 received at step 1906 is closest in n-dimensional space based upon the first proximity determined at step 1908 and the second proximity determined at step 1910. For example, as illustrated in FIG. 18, sub-string correlithm object 1206*b* is closer in n-dimensional space to sub-string correlithm object 1206*x* than sub-string correlithm object 1206*y* based on first proximity 1806 being smaller than second proximity 1808. Execution proceeds to step 1914 where node 304 maps the particular sub-string correlithm object 1206 received at step 1906 to the sub-string correlithm object 1206 of second string correlithm object 602*b* selected at step 1912. At step 1916, node 304 determines whether there are any additional sub-string correlithm objects 1206 of first string correlithm object 602*a* to map to the second string correlithm object 602*b*. If so, execution returns to perform steps 1906 through 1914 with respect to a different particular sub-string correlithm object 1206 of first string correlithm object 602*a*. If not, execution terminates at step 1918.

Dynamic time warping (DTW) is a technique used to measure similarity between temporal sequences of data that may vary in speed. Dynamic time warping can be applied to temporal sequences of video, audio, graphics, or any other form of data that can be turned into a linear sequence. One application for DTW is automatic speech recognition to cope with different speaking speeds. For example, DTW can be used to find an optimal match between two given time-varying sequences where the sequences are "warped" non-linearly in the time dimension to determine a measure of their similarity independent of certain non-linear variations in the time dimension. A technical problem associated with using dynamic time warping is the heavy computational burden required to process real-world data using DTW algorithms. Examples of the computational burden include significant delays in processing speeds and large consumption of memory. A technologically improved system is needed to compare and determine matches between temporal sequences of data without the computational burden of conventional forms of processing using dynamic time warping algorithms. Using string correlithm objects 602 to represent real-world data significantly reduces the computational burden with comparing time-varying sequences of data, such as voice signals. As described in detail above with respect to FIGS. 14-19, real-world data can be mapped to string correlithm objects 602 and then compared to each other in n-dimensional space 102 to find matches. This approach alleviates the significant computational burden associated with dynamic time warping algorithms. One reason for the reduction in computational burden is because string correlithm objects 602 in n-dimensional space 102 can represent vast amounts of real-world data such that the amount of memory used to store string correlithm objects 602 is orders of magnitude less than that which is required to store the corresponding real-world data. Additionally, processors can compare string correlithm objects 602 to each other in n-dimensional space 102 with faster execution and with less processing power than is required to compare the corresponding real-world data.

Figure 20A:
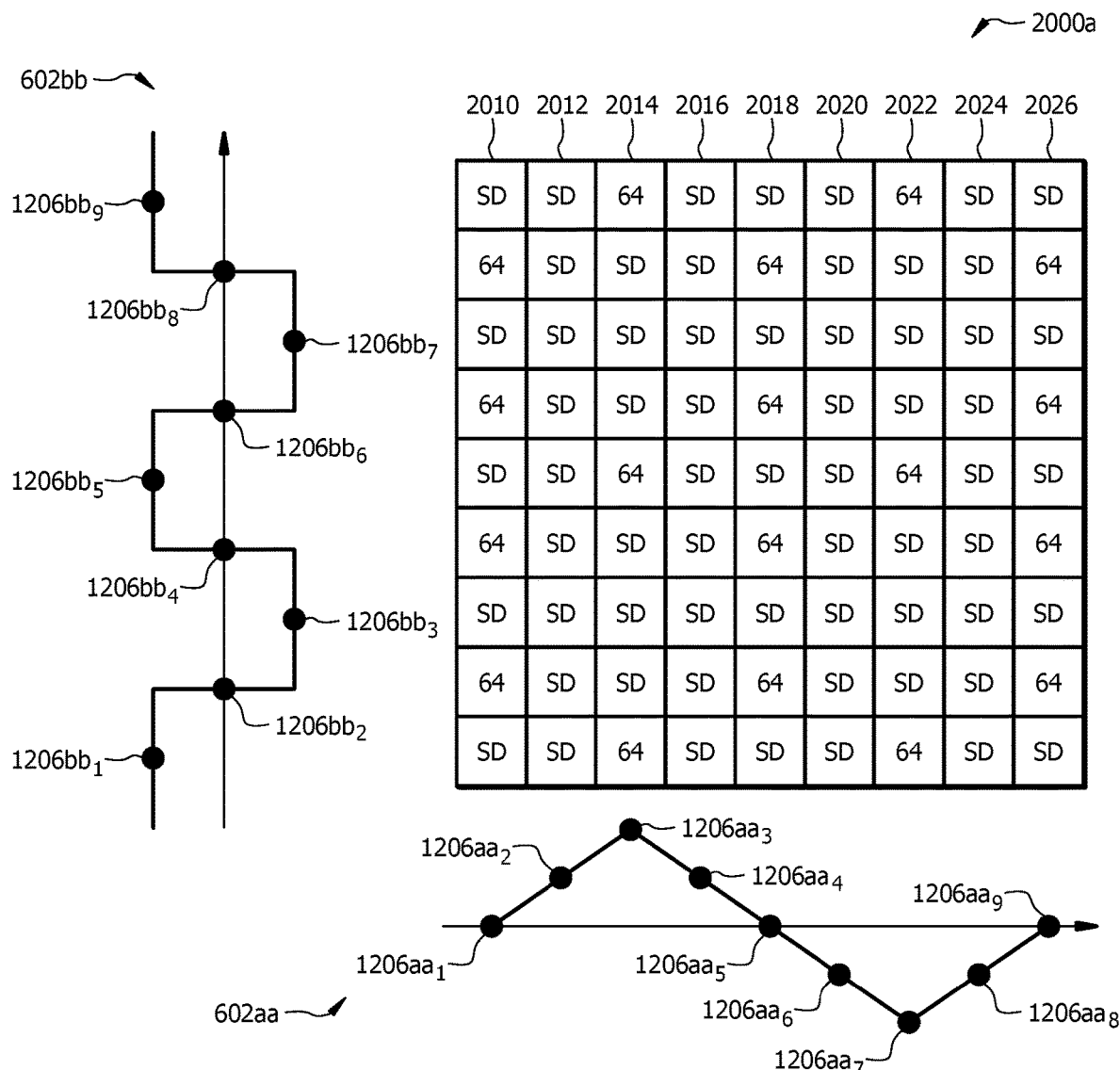
FIGS. 20A-C illustrate different embodiments of a distance table that is used to compare time-varying signals represented by string correlithm objects in n-dimensional space.

FIG. 20A illustrates one embodiment of a distance table 2000*a* stored in memory 504 that is used to compare one time-varying signal represented by a first string correlithm object 602*aa* in n-dimensional space (e.g., 64-bit, 128-bit, 256-bit, etc.), such as a first voice signal, with another time-varying signal represented as a second string correlithm object 602*bb* in n-dimensional space (e.g., 64-bit, 128-bit, 256-bit, etc.), such as a second voice signal. Memory 504 also stores string correlithm objects 602*aa* and 602*bb*. In one embodiment, the first voice signal may be a template voice signal that is to be compared against a series of sample voice signals stored in a database to find a match. The template voice signal may be a word or phrase uttered by a first person or entity that is being compared with a series of sample voice signals uttered by the same or different person or entity in order to find a match. Such a comparison and matching process may be useful in voice or speech recognition systems, or in natural language processing systems. The first voice signal is mapped to string correlithm object 602*aa* using one or more of the techniques described above, for example, with respect to FIGS. 14-19. For example, the first voice signal includes data values that are mapped to sub-string correlithm objects 1206*aa*$_{1-9}$. In this embodiment, the second voice signal may be one of the sample voice signals to be compared against the first voice signal. The second voice signal is mapped to string correlithm object 602*bb* using one or more of the techniques described above, for example, with respect to FIGS. 14-19. For example, the second voice signal includes data values that are mapped to sub-string correlithm objects 1206*bb*$_{1-9}$.

In operation, string correlithm object engine 522 of processor 502 performs a comparison of string correlithm object 602*aa* with string correlithm object 602*bb* in n-dimensional space 102, as described in detail below. In particular, engine 522 compares each sub-string correlithm object 1206*aa*$_{1-9}$ pairwise against each sub-string correlithm object 12066*bb*$_{1-9}$, and determines anti-Hamming distances based on this pairwise comparison. As described above with respect to FIG. 1, the anti-Hamming distance calculation can be used to determine the similarity between sub-string correlithm objects 1206 of the first string correlithm object 602*aa* and the second string correlithm object 602*bb*. As described above with reference to FIG. 9, the average number of different bits between a random correlithm object and a particular correlithm object is equal to $$\frac{n}{2}$$

(also referred to as standard distance), where 'n' is the number of dimensions in the n-dimensional space 102. The standard deviation is equal to $$\sqrt{\frac{n}{4}},$$

where 'n' is the number of dimensions in the n-dimensional space 102. Thus, if a sub-string correlithm object 1206*aa* of string correlithm object 602*aa* is statistically dissimilar to a corresponding sub-string correlithm object 1206*bb* of string correlithm object 602*bb*, then the anti-Hamming distance is expected to be roughly equal to the standard distance. Therefore, if the n-dimensional space 102 is 64-bits, then the anti-Hamming distance between two dissimilar correlithm objects is expected to be roughly 32. If a sub-string correlithm object 12066*aa* of string correlithm object 602*aa* is statistically similar to a corresponding sub-string correlithm object 1206bb of string correlithm object 602bb, then the anti-Hamming distance is expected to be roughly equal to six standard deviations more than the standard distance. Therefore, if the n-dimensional space 102 is 64-bits, then the anti-Hamming distance between similar correlithm objects is expected to be roughly 56 or more (i.e., 32 (standard distance)+24 (six standard deviations)=56). In other embodiments, if the anti-Hamming distance is equal to four or five standard deviations beyond the standard distance, then the correlithm objects are determined to be statistically similar.

The use of six standard deviations away from the standard distance to determine statistical similarity is also appropriate in a larger n-dimensional space 102, such as an n-space of 256-bits. For example, in 256-space, standard distance is 256/2, or 128. The standard deviation is the square root of (256/4), or 8. So an exact match between two correlithm objects 602 in 256-space, represented by a Hamming distance of 0 and an anti-Hamming distance of 256, is a statistical event that is 128/8, or 16 standard deviations from the expected or standard distance. Similarly, a perfect "inverse match" between two correlithm objects 602 in 256-space, represented by a Hamming distance of 256 and an anti-Hamming distance of 0, is also a statistical event that is (256−128)/8, or 16 standard deviations from the expected or standard distance. Accordingly, as the n-dimensional space 102 grows larger, the number of standard deviations between the peak of the binomial distribution and its end points also grows larger. However, in these examples of 256-space where an exact match lies 16 standard deviations from the standard distance, statistical similarity may still be found 6 standard deviations from the standard distance.

Engine 522 determines the anti-Hamming distances between sub-string correlithm object $1206aa_1$ of first string correlithm object 602aa and each of the sub-string correlithm objects $1206bb_{1-9}$ of second correlithm object 602bb, and stores those values in a first column 2010 of table 2000a. Engine 522 determines the anti-Hamming distances between sub-string correlithm object $1206aa_2$ of first string correlithm object 602aa and each of the sub-string correlithm objects $1206bb_{1-9}$ of second correlithm object 602bb, and stores those values in a second column 2012 of table 2000a. Engine 522 repeats the pairwise determination of anti-Hamming distances between sub-string correlithm objects $1206aa_{3-9}$ of first string correlithm object 602aa and each of the sub-string correlithm objects $1206bb_{1-9}$ of second correlithm object 602bb, and stores those values in columns 2014-2026 of table 2000a, respectively.

The anti-Hamming distance values represented in the cells of table 2000a indicate which sub-string correlithm objects 1206aa are statistically similar or dissimilar to corresponding sub-string correlithm objects 1206bb. Cells of table 2000a having an anti-Hamming distance value of 64 in them, for example, indicate a similarity between sub-string correlithm objects 1206aa and 1206bb. Cells of table 2000a with a 'SD' in them (for standard distance), for example, indicate a dissimilarity between sub-string correlithm objects 1206aa and 1206bb. Although particular cells of table 2000a have an anti-Hamming distance value of 64 in them, indicating a statistical similarity between particular sub-string correlithm objects 1206aa and 1206bb, engine 522 determines that there is no discernible pattern of similarity among any group of neighboring sub-string correlithm objects 1206aa and 1206bb. This indicates that while there may be some sporadic similarities between string correlithm object 602aa and string correlithm object 602bb, no meaningful portions of them are statistically similar to each other. Given that string correlithm object 602aa represents a first voice signal and string correlithm object 602bb represents a second voice signal in this embodiment, this means that no meaningful portion of those voice signals are statistically similar to each other. In other words, they are not a match. Although statistical similarity is represented in table 2000a with an anti-Hamming distance value of 64 in various cells to indicate a match among sub-string correlithm objects 1206, it should be understood that a statistical similarity can be determined with an anti-Hamming distance that is anywhere from four to six standard deviations greater than the standard distance.

Figure 20B:
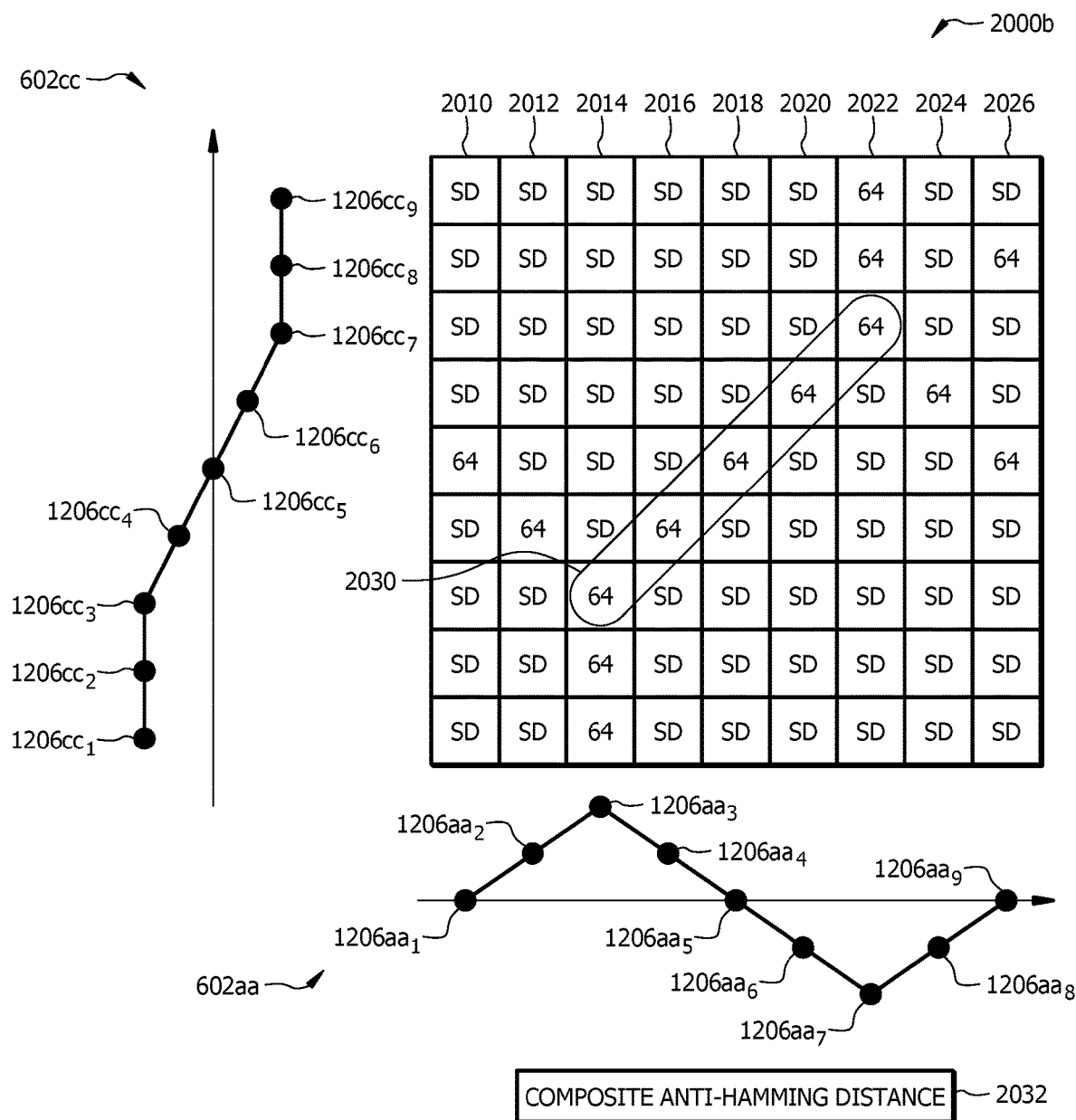

FIG. 20B illustrates one embodiment of a distance table 2000b stored in memory 504 that is used to compare the first voice signal represented by first string correlithm object 602aa in n-dimensional space (e.g., 64-bit, 128-bit, 256-bit, etc.), with another time-varying signal represented as a third string correlithm object 602cc in n-dimensional space (e.g., 64-bit, 128-bit, 256-bit, etc.), such as a third voice signal. In this embodiment, the third voice signal may be one of the sample voice signals to be compared against the first voice signal. The third voice signal is mapped to string correlithm object 602cc using one or more of the techniques described above, for example, with respect to FIGS. 14-19. For example, the third voice signal includes data values that are mapped to sub-string correlithm objects $1206cc_{1-9}$. Memory 504 stores string correlithm object 602cc.

In operation, string correlithm object engine 522 of processor 502 performs a comparison of string correlithm object 602aa with string correlithm object 602cc in n-dimensional space 102, as described in detail below. In particular, engine 522 compares each sub-string correlithm object $1206aa_{1-9}$ pairwise against each sub-string correlithm object $12066cc_{1-9}$.

Engine 522 determines the anti-Hamming distance between sub-string correlithm object $1206aa_1$ of first string correlithm object 602aa and each of the sub-string correlithm objects $1206cc_{1-9}$ of third correlithm object 602cc, and stores those values in a first column 2010 of table 2000b. Engine 522 determines the anti-Hamming distance between sub-string correlithm object $1206aa_2$ of first string correlithm object 602aa and each of the sub-string correlithm objects $1206cc_{1-9}$ of third correlithm object 602cc, and stores those values in a second column 2012 of table 2000b. Engine 522 repeats the pairwise determination of anti-Hamming distances between sub-string correlithm objects $1206aa_{3-9}$ of first string correlithm object 602aa and each of the sub-string correlithm objects $1206cc_{1-9}$ of third correlithm object 602cc, and stores those values in columns 2014-2026 of table 2000b, respectively.

The anti-Hamming distance values represented in the cells of table 2000b indicate which sub-string correlithm objects 1206aa are statistically similar or dissimilar to corresponding sub-string correlithm objects 1206cc. Although many cells of table 2000b have an anti-Hamming distance value of 64 in them, indicating statistical similarity between particular sub-string correlithm objects 1206aa and 1206cc, engine 522 determines that there also exists a discernible pattern of similarity among a group of five neighboring sub-string correlithm objects $1206aa_{3-7}$ and $1206cc_{3-7}$. This pattern is represented as a trace 2030 in FIG. 20B. This trace 2030 indicates that at least a portion of string correlithm object 602aa is statistically similar to at least a portion of string correlithm object 602cc. The trace 2030 is seen in table 2000b as extending from a lower left cell to an upper right cell, where each cell in the trace 2030 has an anti-Hamming distance value of 64 in it. Although statistical similarity is represented in table 2000*b* with an anti-Hamming distance value of 64 in various cells to indicate a match among sub-string correlithm objects 1206, it should be understood that a statistical similarity can be determined with an anti-Hamming distance that is anywhere from four to six standard deviations greater than the standard distance.

Given that string correlithm object 602*aa* represents a first voice signal and string correlithm object 602*cc* represents a third voice signal, this means that there is a relevant portion of those voice signals that are statistically similar to each other. In other words, there is a match between at least a portion of these respective voice signals. Trace 2030 therefore identifies the location of a match between string correlithm objects 602*aa* and 602*cc* (i.e., match between 1206$aa_{3-7}$ and 1206$cc_{3-7}$), as well as the quality of that match. Once engine 522 locates a trace 2030 in table 2000*b*, engine 522 sums together the anti-Hamming distance calculations for the cells in the trace 2030 to determine a composite anti-Hamming distance calculation 2032. In this example, the composite anti-Hamming distance calculation 2032 is 320.

Figure 20C:
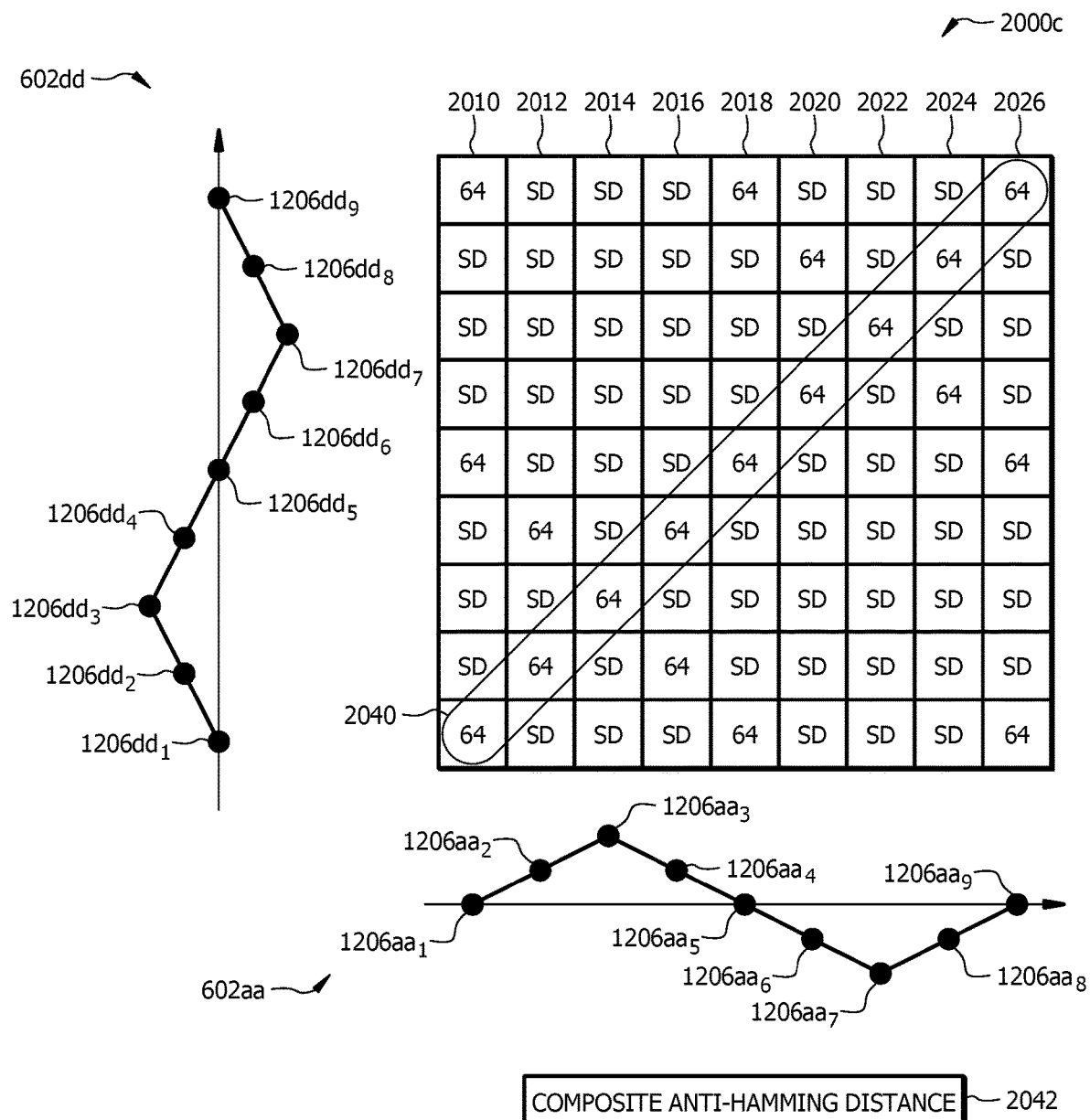

FIG. 20C illustrates one embodiment of a distance table 2000*c* stored in memory 504 that is used to compare the first voice signal represented by first string correlithm object 602*aa* in n-dimensional space (e.g., 64-bit, 128-bit, 256-bit, etc.), with another time-varying signal represented as a fourth string correlithm object 602*dd* in n-dimensional space (e.g., 64-bit, 128-bit, 256-bit, etc.), such as a fourth voice signal. In this embodiment, the fourth voice signal may be one of the sample voice signals to be compared against the first voice signal. The fourth voice signal is mapped to string correlithm object 602*dd* using one or more of the techniques described above, for example, with respect to FIGS. 14-19. For example, the fourth voice signal includes data values that are mapped to sub-string correlithm objects 1206$dd_{1-9}$. Memory 504 stores fourth string correlithm object 602*dd*.

In operation, string correlithm object engine 522 of processor 502 performs a comparison of string correlithm object 602*aa* with string correlithm object 602*dd* in n-dimensional space 102, as described in detail below. In particular, engine 522 compares each sub-string correlithm object 1206$aa_{1-9}$ pairwise against each sub-string correlithm object 12066$dd_{1-9}$.

Engine 522 determines the anti-Hamming distance between sub-string correlithm object 1206$aa_1$ of first string correlithm object 602*aa* and each of the sub-string correlithm objects 1206$dd_{1-9}$ of fourth string correlithm object 602*dd*, and stores those values in a first column 2010 of table 2000*c*. Engine 522 determines the anti-Hamming distance between sub-string correlithm object 1206$aa_2$ of first string correlithm object 602*aa* and each of the sub-string correlithm objects 1206$dd_{1-9}$ of fourth string correlithm object 602*dd*, and stores those values in a second column 2012 of table 2000*c*. Engine 522 repeats the pairwise determination of anti-Hamming distances between sub-string correlithm objects 1206$aa_{3-9}$ of first string correlithm object 602*aa* and each of the sub-string correlithm objects 1206$dd_{1-9}$ of fourth correlithm object 602*dd*, and stores those values in columns 2014-2026 of table 2000*c*, respectively. The anti-Hamming distance values represented in the cells of table 2000*c* indicate which sub-string correlithm objects 1206*aa* are statistically similar or dissimilar to corresponding sub-string correlithm objects 1206*dd*.

Although numerous cells of table 2000*c* have an anti-Hamming distance of 64 in them, indicating statistical similarity between particular sub-string correlithm objects 1206*aa* and 1206*dd*, engine 522 determines that there exists a pattern of similarity among a group of nine neighboring sub-string correlithm objects 1206$aa_{1-9}$ and 1206$cc_{1-9}$. This pattern is represented as a trace 2040 in table 2000*c*. This trace 2040 indicates that a portion of string correlithm object 602*aa* is statistically similar to a corresponding portion of string correlithm object 602*dd*. The trace 2040 is seen in table 2000*c* as extending from the lowermost left cell to the uppermost right cell, where each cell in the trace 2040 has an anti-Hamming distance value of 64 in it. Although statistical similarity is represented in table 2000*c* with an anti-Hamming distance value of 64 in various cells to indicate a match among sub-string correlithm objects 1206, it should be understood that a statistical similarity can be determined with an anti-Hamming distance that is anywhere from four to six standard deviations greater than the standard distance.

Given that string correlithm object 602*aa* represents a first voice signal and string correlithm object 602*dd* represents a fourth voice signal, this means that there is a significant portion of those voice signals that are statistically similar to each other. In other words, there is a close match between the entirety of these respective voice signals. Trace 2040 therefore identifies the location of a match between string correlithm objects 602*aa* and 602*dd* (i.e., match between 1206$aa_{1-9}$ and 1206$dd_{1-9}$), as well as the quality of that match. Once engine 522 locates a trace 2040 in table 2000*c*, engine 522 sums together the anti-Hamming distance calculations for the cells in the trace 2040 to determine a composite anti-Hamming distance calculation 2042. In this example, the composite anti-Hamming distance calculation 2042 is 576.

Upon locating trace 2030 in table 2000*b* and trace 2040 in table 2000*c*, but no trace in table 2000*a*, engine 522 determines that each of string correlithm objects 602*cc* and 602*dd* are closer matches to string correlithm object 602*aa* than string correlithm object 602*bb*. Furthermore, engine 522 further determines which of string correlithm objects 602*cc* and 602*dd* is the closest match to string correlithm object 602*aa* by determining which string correlithm object 602*cc* or 602*dd* has the largest composite anti-Hamming distance calculation. In this example, because string correlithm object 602*dd* has a larger composite anti-Hamming distance calculation than string correlithm object 602*cc* (i.e., 576>320), engine 522 determines that string correlithm object 602*dd* is the closest match to string correlithm object 602*aa*. Based on this determination, engine 522 further determines that the fourth voice signal is the closest match to the first voice signal.

The principles described above with respect to FIGS. 20A-C can be extended from a single dimensional data object, such as a voice signal, to a multi-dimensional data object, such as a two-dimensional photograph. In a multi-dimensional implementation, engine 522 can implement a facial recognition system by comparing the data comprising a two-dimensional image of a face, as represented by string correlithm objects 602*v* and 602*h*, with the data comprising sample two-dimensional images of faces, also as represented by string correlithm objects 602*v* and 602*h*.

Figure 21A:
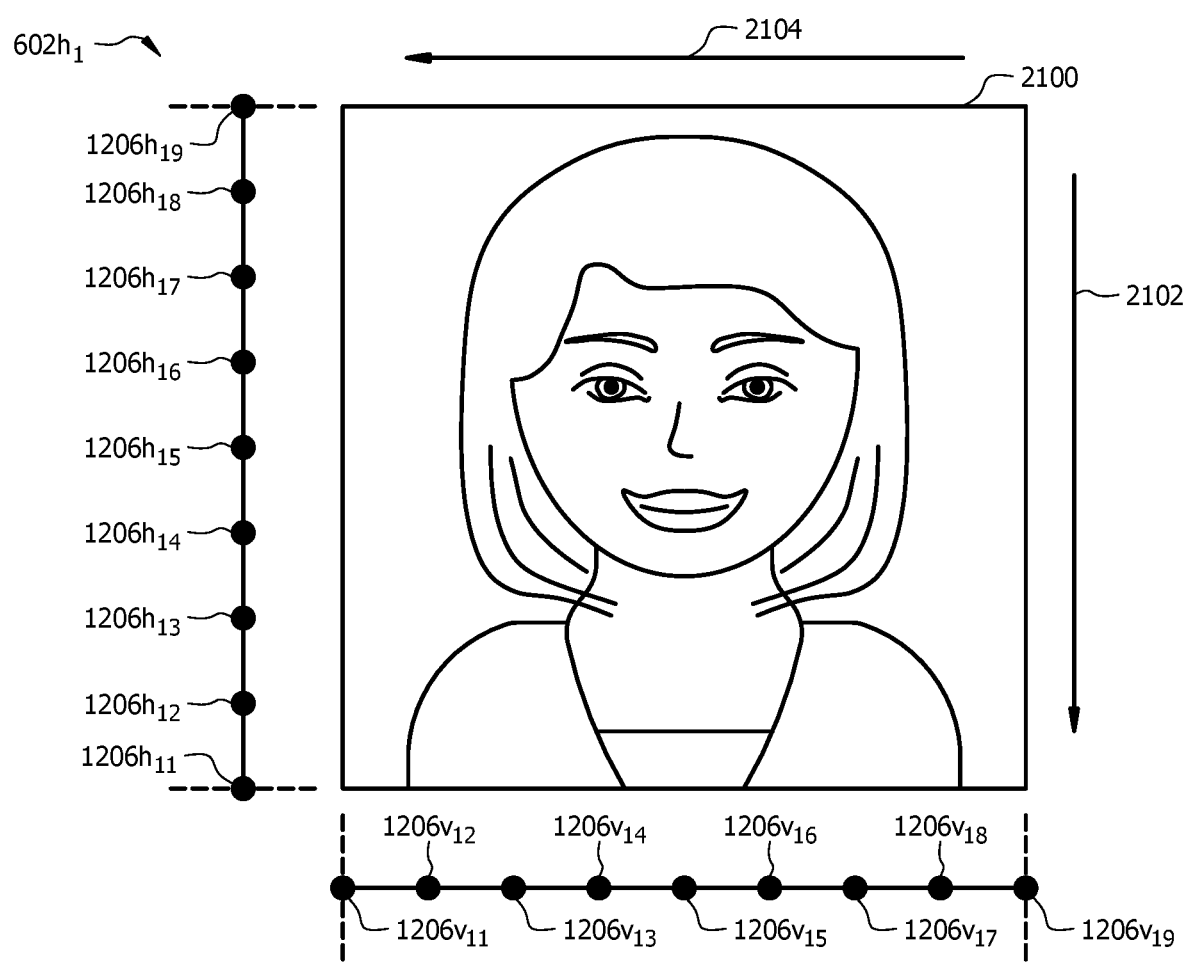
FIGS. 21A-D illustrate different embodiments of two-dimensional images that are compared against each other using string correlithm objects.

FIG. 21A illustrates an embodiment of a two-dimensional image 2100 comprising pixels represented by real-world data. In this embodiment, image 2100 is a picture of a woman. Engine 522 represents the real-world data of image 2100 as a horizontal string correlithm object 602$h_1$ and a vertical string correlithm object 602$v_1$ pursuant to the techniques described above with respect to FIGS. 14-19. In particular, engine 522 represents vertical slices of the real-world data in image 2100 (as represented by arrow 2102) in corresponding sub-string correlithm objects 1206$v_{11\text{-}19}$. For example, engine 522 represents a first vertical slice of the real-world data in image 2100 in sub-string correlithm object 1206$v_{11}$; a second vertical slice of the real-world data in image 2100 in sub-string correlithm object 1206$v_{12}$; and so on from sub-string correlithm object 1206$v_{13}$ through sub-string correlithm object 1206$v_{19}$. Similarly, engine 522 represents horizontal slices of the real-world data in image 2100 (as represented by arrow 2104) in corresponding sub-string correlithm objects 1206$h_{11\text{-}19}$. For example, engine 522 represents a first horizontal slice of the real-world data in image 2100 in sub-string correlithm object 1206$h_{11}$; a second vertical slice of the real-world data in image 2100 in sub-string correlithm object 1206$h_{12}$; and so on from sub-string correlithm object 1206$h_{13}$ through sub-string correlithm object 1206$h_{19}$. Memory 504 stores string correlithm objects 602$v_1$ and 602$h_1$.

Figure 21B:
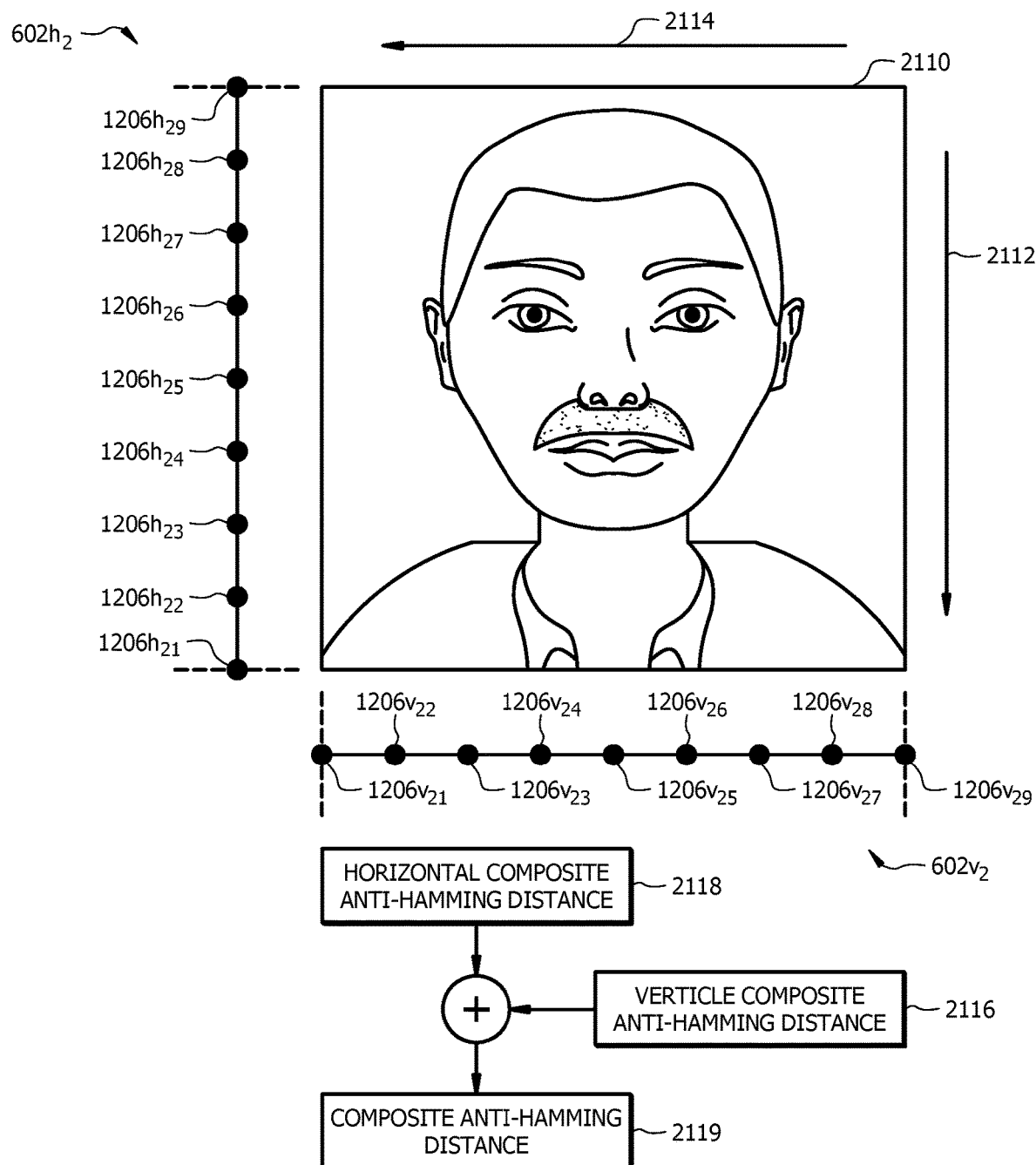
Figure 21C:
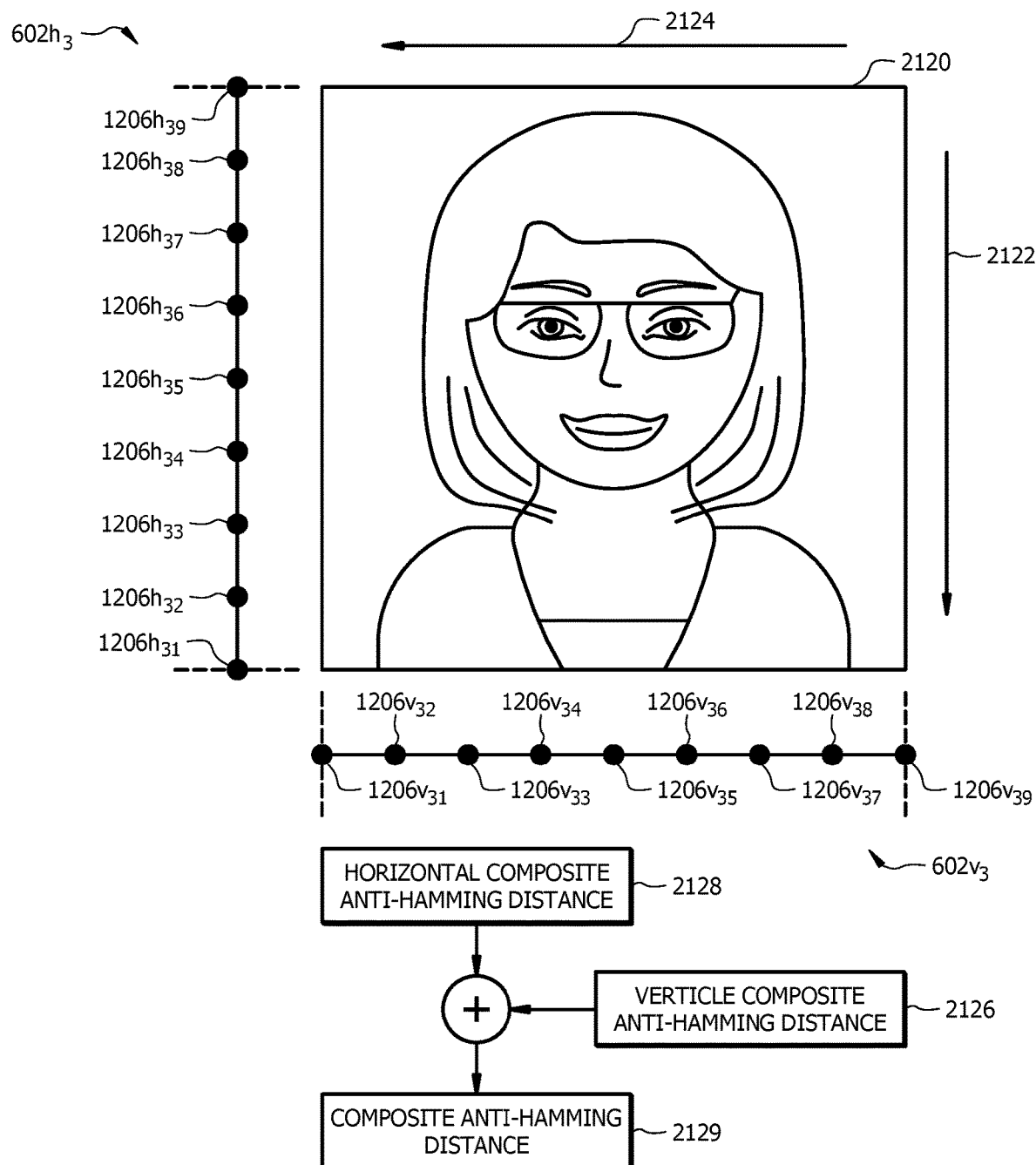
Figure 21D:
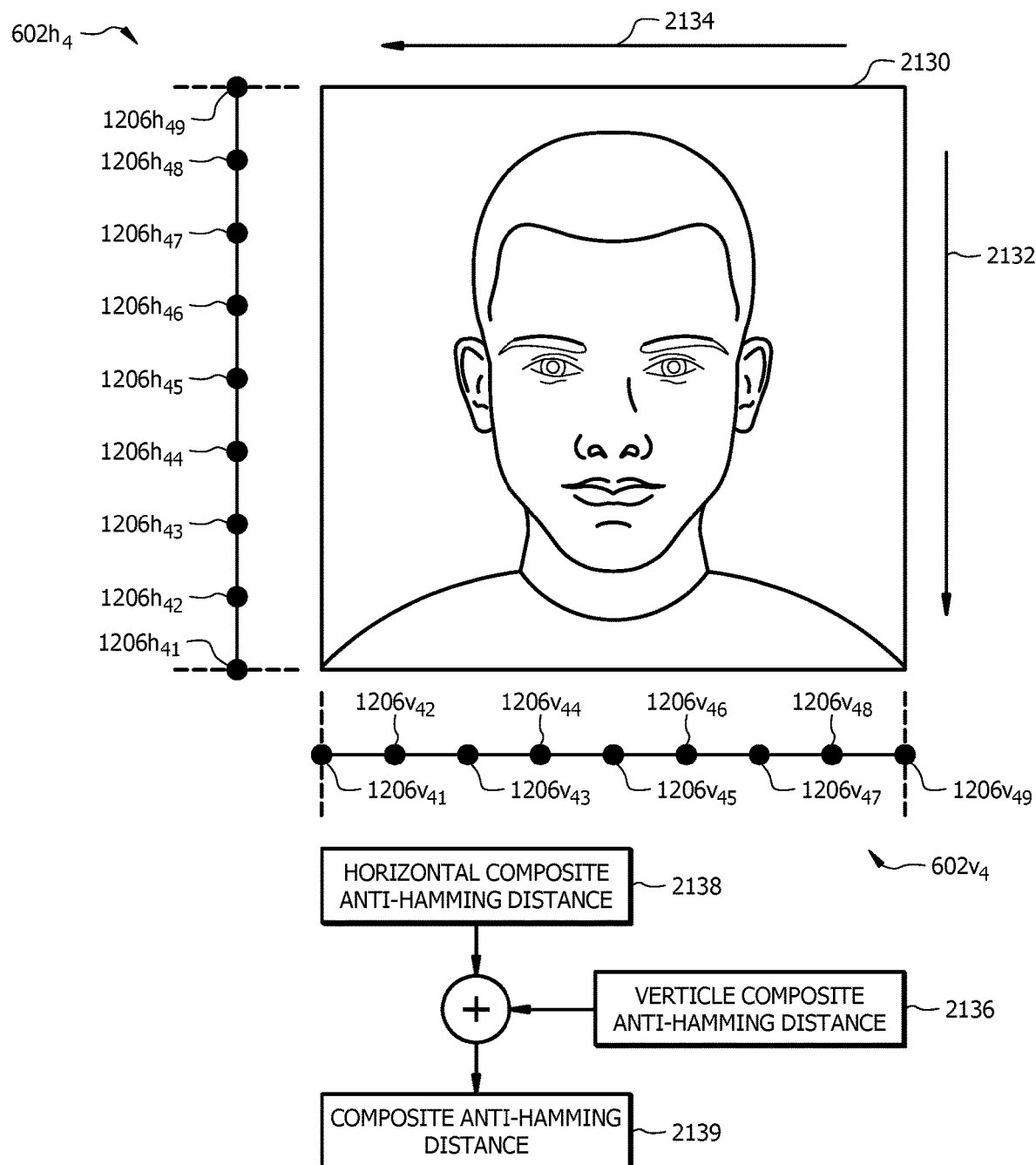

FIGS. 21B-D illustrate embodiments of two-dimensional images to be compared against image 2100 to determine similarities or a match. In particular, FIG. 21B illustrates an embodiment of a two-dimensional image 2110 comprising pixels represented by real-world data. In this embodiment, image 2110 is a picture of a man. Engine 522 represents the real-world data of image 2110 as a horizontal string correlithm object 602$h_2$ and a vertical string correlithm object 602$v_2$ pursuant to the techniques described above with respect to FIGS. 14-19. In particular, engine 522 represents vertical slices of the real-world data in image 2110 (as represented by arrow 2112) in corresponding sub-string correlithm objects 1206$v_{21\text{-}29}$. For example, engine 522 represents a first vertical slice of the real-world data in image 2110 in sub-string correlithm object 1206$v_{21}$; a second vertical slice of the real-world data in image 2110 in sub-string correlithm object 1206$v_{22}$; and so on from sub-string correlithm object 1206$v_{23}$ through sub-string correlithm object 1206$v_{29}$. Similarly, engine 522 represents horizontal slices of the real-world data in image 2110 (as represented by arrow 2114) in corresponding sub-string correlithm objects 1206$h_{21\text{-}29}$. For example, engine 522 represents a first horizontal slice of the real-world data in image 2110 in sub-string correlithm object 1206$h_{21}$; a second vertical slice of the real-world data in image 2110 in sub-string correlithm object 1206$h_{22}$; and so on from sub-string correlithm object 1206$h_{23}$ through sub-string correlithm object 1206$h_{29}$. Memory 504 stores string correlithm objects 602$v_2$ and 602$h_2$.

FIG. 21C illustrates an embodiment of a two-dimensional image 2120 comprising pixels represented by real-world data. In this embodiment, image 2120 is a picture of a woman wearing glasses. Engine 522 represents the real-world data of image 2120 as a horizontal string correlithm object 602$h_3$ and a vertical string correlithm object 602$v_3$ pursuant to the techniques described above with respect to FIGS. 14-19. In particular, engine 522 represents vertical slices of the real-world data in image 2120 (as represented by arrow 2122) in corresponding sub-string correlithm objects 1206$v_{31\text{-}39}$. For example, engine 522 represents a first vertical slice of the real-world data in image 2120 in sub-string correlithm object 1206$v_{31}$; a second vertical slice of the real-world data in image 2120 in sub-string correlithm object 1206$v_{32}$; and so on from sub-string correlithm object 1206$v_{33}$ through sub-string correlithm object 1206$v_{39}$. Similarly, engine 522 represents horizontal slices of the real-world data in image 2120 (as represented by arrow 2124) in corresponding sub-string correlithm objects 1206$h_{31\text{-}39}$. For example, engine 522 represents a first horizontal slice of the real-world data in image 2120 in sub-string correlithm object 1206$h_{31}$; a second vertical slice of the real-world data in image 2120 in sub-string correlithm object 1206$h_{32}$; and so on from sub-string correlithm object 1206$h_{33}$ through sub-string correlithm object 1206$h_{39}$. Memory 504 stores string correlithm objects 602$v_3$ and 602$h_3$.

FIG. 21D illustrates an embodiment of a two-dimensional image 2130 comprising pixels represented by real-world data. In this embodiment, image 2130 is a picture of a young man. Engine 522 represents the real-world data of image 2130 as a horizontal string correlithm object 602$h_4$ and a vertical string correlithm object 602$v_4$ pursuant to the techniques described above with respect to FIGS. 14-19. In particular, engine 522 represents vertical slices of the real-world data in image 2130 (as represented by arrow 2132) in corresponding sub-string correlithm objects 1206$v_{41\text{-}49}$. For example, engine 522 represents a first vertical slice of the real-world data in image 2130 in sub-string correlithm object 1206$v_{41}$; a second vertical slice of the real-world data in image 2130 in sub-string correlithm object 1206$v_{42}$; and so on from sub-string correlithm object 1206$v_{43}$ through sub-string correlithm object 1206$v_{49}$. Similarly, engine 522 represents horizontal slices of the real-world data in image 2130 (as represented by arrow 2134) in corresponding sub-string correlithm objects 1206$h_{41\text{-}49}$. For example, engine 522 represents a first horizontal slice of the real-world data in image 2130 in sub-string correlithm object 1206$h_{41}$; a second vertical slice of the real-world data in image 2130 in sub-string correlithm object 1206$h_{42}$; and so on from sub-string correlithm object 1206$h_{43}$ through sub-string correlithm object 1206$h_{49}$. Memory 504 stores string correlithm objects 602$v_4$ and 602$h_4$.

In operation, engine 522 compares each of the images 2110, 2120, and 2130 against image 2100 in n-dimensional space 102 to determine the best match. It does so by performing a comparison of string correlithm object 602$v_1$ with each of string correlithm objects 602$v_{2\text{-}4}$ in n-dimensional space 102; and by performing a comparison of string correlithm objects 602$h_1$ with each of string correlithm objects 602$h_{2\text{-}4}$ in n-dimensional space 102. Engine 522 performs each of the horizontal and vertical comparisons in n-dimensional space 102 by calculating the anti-Hamming distances between corresponding pairs of sub-string correlithm objects 1206, using the methodology described above with respect to FIGS. 20A-B. The following description of this operation is not described with respect to specific distance tables to avoid confusion, but it should be understood that the operation described below uses distance tables to store the anti-Hamming distance values calculated by engine 522 when performing a pairwise comparison of sub-string correlithm objects 1206, as described above with respect to FIGS. 20A-C.

Comparison of Image 2100 with Image 2110 in n-dimensional Space

To compare image 2110 against image 2100 in n-dimensional space 102, engine 522 compares each sub-string correlithm object 1206$v_{11\text{-}19}$ pairwise against each sub-string correlithm object 1206$v_{21\text{-}29}$ to determine a plurality of anti-Hamming distances and stores them in a first distance table, as described above with regard to FIGS. 20A-B. Engine 522 determines whether there is any discernible pattern of similarity in the first distance table among any group of neighboring sub-string correlithm objects 1206$v_{11\text{-}19}$ and 1206$v_{21\text{-}29}$, as represented by the calculated anti-Hamming distances, as described above with regard to FIGS. 20A-B. If such a pattern of similarity is found (e.g., a trace), then engine 522 calculates a vertical composite anti-Hamming distance 2116 by summing the anti-Hamming distance values within the pattern.

Engine 522 also compares each sub-string correlithm object $1206h_{11-19}$ pairwise against each sub-string correlithm object $1206h_{21-29}$ to determine a plurality of anti-Hamming distances and stores them in a second distance table, as described above with regard to FIGS. 20A-B. Engine 522 determines whether there is any discernible pattern of similarity in the second distance table among any group of neighboring sub-string correlithm objects $1206h_{11-19}$ and $1206h_{21-29}$, as represented by the calculated anti-Hamming distances, as described above with regard to FIGS. 20A-B. If such a pattern of similarity is found (e.g., a trace), then engine 522 calculates a horizontal composite anti-Hamming distance 2118 by summing the anti-Hamming distance values within the pattern.

Engine 522 determines a composite anti-Hamming distance 2119 by summing the vertical composite anti-Hamming distance 2116 and the horizontal composite anti-Hamming distance 2118. Engine 522 determines whether the image 2110 is statistically similar to, or a match of, image 2100 based on the magnitude of the calculated composite anti-Hamming distance 2119 in comparison to a threshold. For example, in one embodiment, a composite anti-Hamming distance 2119 that is roughly four standard deviations greater than a standard distance composite value for the n-dimensional string correlithm object 602 is considered to be statistically similar.

Comparison of Image 2100 with Image 2120 in n-dimensional Space

To compare image 2120 against image 2100 in n-dimensional space 102, engine 522 compares each sub-string correlithm object $1206v_{11-19}$ pairwise against each sub-string correlithm object $1206v_{31-39}$ to determine a plurality of anti-Hamming distances and stores them in a first distance table, as described above with regard to FIGS. 20A-B. Engine 522 determines whether there is any discernible pattern of similarity in the first distance table among any group of neighboring sub-string correlithm objects $1206v_{11-19}$ and $1206v_{31-39}$, as represented by the calculated anti-Hamming distances, as described above with regard to FIGS. 20A-B. If such a pattern of similarity is found (e.g., a trace), then engine 522 calculates a vertical composite anti-Hamming distance 2126 by summing the anti-Hamming distance values within the pattern.

Engine 522 also compares each sub-string correlithm object $1206h_{11-19}$ pairwise against each sub-string correlithm object $1206h_{31-39}$ to determine a plurality of anti-Hamming distances and stores them in a second distance table, as described above with regard to FIGS. 20A-B. Engine 522 determines whether there is any discernible pattern of similarity in the second distance table among any group of neighboring sub-string correlithm objects $1206h_{11-19}$ and $1206h_{31-39}$, as represented by the calculated anti-Hamming distances, as described above with regard to FIGS. 20A-B. If such a pattern of similarity is found (e.g., a trace), then engine 522 calculates a horizontal composite anti-Hamming distance 2128 by summing the anti-Hamming distance values within the pattern.

Engine 522 determines a composite anti-Hamming distance 2129 by summing the vertical composite anti-Hamming distance 2126 and the horizontal composite anti-Hamming distance 2128. Engine 522 determines whether the image 2120 is statistically similar to, or a match of, image 2100 based on the magnitude of the calculated composite anti-Hamming distance 2129 in comparison to a threshold. For example, in one embodiment, a composite anti-Hamming distance 2129 that is roughly four standard deviations greater than a standard distance composite value for the n-dimensional string correlithm object 602 is considered to be statistically similar.

Comparison of Image 2100 with Image 2130 in n-dimensional Space

To compare image 2130 against image 2100 in n-dimensional space 102, engine 522 compares each sub-string correlithm object $1206v_{11-19}$ pairwise against each sub-string correlithm object $1206v_{41-49}$ to determine a plurality of anti-Hamming distances and stores them in a first distance table, as described above with regard to FIGS. 20A-B. Engine 522 determines whether there is any discernible pattern of similarity in the first distance table among any group of neighboring sub-string correlithm objects $1206v_{11-19}$ and $1206v_{41-49}$, as represented by the calculated anti-Hamming distances, as described above with regard to FIGS. 20A-B. If such a pattern of similarity is found (e.g., a trace), then engine 522 calculates a vertical composite anti-Hamming distance 2136 by summing the anti-Hamming distance values within the pattern.

Engine 522 also compares each sub-string correlithm object $1206h_{11-19}$ pairwise against each sub-string correlithm object $1206h_{41-49}$ to determine a plurality of anti-Hamming distances and stores them in a second distance table, as described above with regard to FIGS. 20A-B. Engine 522 determines whether there is any discernible pattern of similarity in the second distance table among any group of neighboring sub-string correlithm objects $1206h_{11-19}$ and $1206h_{41-49}$, as represented by the calculated anti-Hamming distances, as described above with regard to FIGS. 20A-B. If such a pattern of similarity is found (e.g., a trace), then engine 522 calculates a horizontal composite anti-Hamming distance 2128 by summing the anti-Hamming distance values within the pattern.

Engine 522 determines a composite anti-Hamming distance 2139 by summing the vertical composite anti-Hamming distance 2136 and the horizontal composite anti-Hamming distance 2138. Engine 522 determines whether the image 2130 is statistically similar to, or a match of, image 2100 based on the magnitude of the calculated composite anti-Hamming distance 2139 in comparison to a threshold. For example, in one embodiment, a composite anti-Hamming distance 2139 that is roughly four standard deviations greater than a standard distance composite value for the n-dimensional string correlithm object 602 is considered to be statistically similar.

Once engine 522 performs the comparisons of images 2110, 2120, and 2130 with image 2100 in n-dimensional space 102, as described above, it compares the composite anti-Hamming distance calculations 2119, 2129, and 2139 to determine which image is the closest match to image 2100. In particular, the largest composite anti-Hamming distance among the calculations 2119, 2129, and 2139 is determined to be the closest match to image 2100. Using the example images described above with respect to FIGS. 21A-D, the image 2120 of the woman wearing glasses is most likely to be the closest match to the image 2100 of the woman without the glasses, and therefore it is expected that composite anti-Hamming distance calculation 2129 would be greater than the anti-Hamming distance calculation 2119 associated with the image 2110 of the man, and greater than the anti-Hamming distance calculation 2139 associated with the image 2130 of the young man. In this way, engine 522 is able to perform a comparison of multi-dimensional data objects in n-dimensional space using string correlithm objects 602*h* and 602*v* instead of the more computationally burdensome approach using dynamic time warping algorithms.

Figure 22:
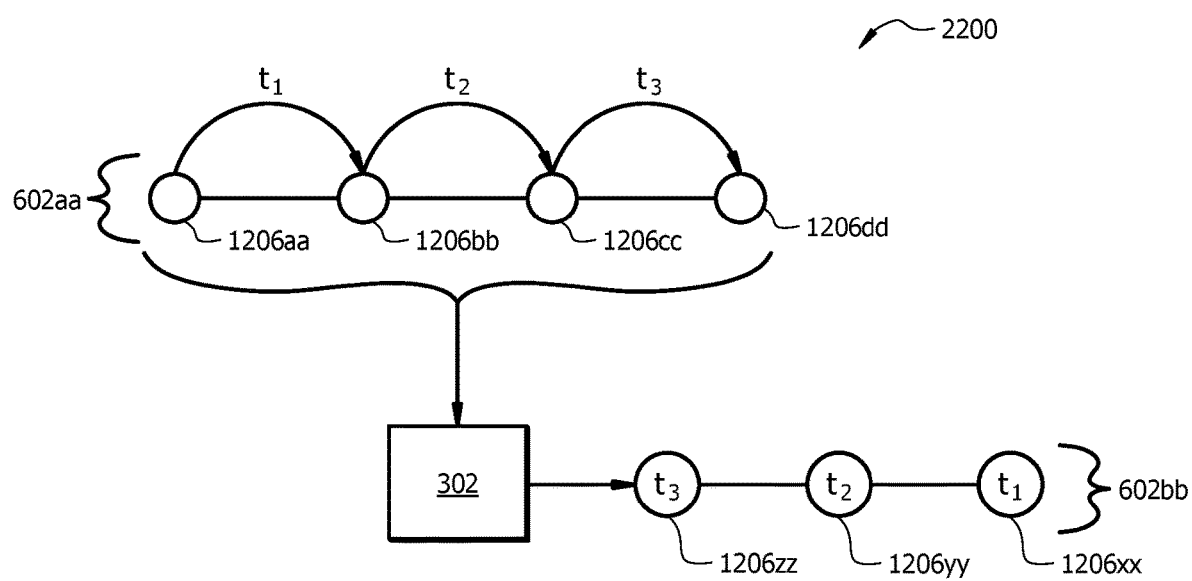
FIG. 22 illustrates one embodiment of a string correlithm object velocity detector.

FIG. 22 illustrates one embodiment of a string correlithm object velocity detector 2200 configured to generate a string correlithm object 602*bb* that represents a time measurement between performing data processes associated with a string correlithm object 602*aa*. String correlithm object velocity detector 2200 and its constituent components can be implemented by processor 502, one or more of the engines 510, 512, 514, and 522, and other elements of computer architecture 500, described above with respect to FIG. 5. Detector 2200 comprises a sensor 302 configured to access a string correlithm object 602*aa* and to generate string correlithm object 602*bb*. String correlithm object 602*aa* includes sub-string correlithm objects 1206*aa*, 1206*bb*, 1206*cc*, and 1206*dd* that each comprise an n-bit digital word representing data. Although string correlithm object 602*aa* is described as including four sub-string correlithm objects, it may include any number and combination of sub-string correlithm objects in other embodiments. The string correlithm object engine 522 processes the data in string correlithm object 602*aa*, as appropriate, for any particular task being performed. For example, the data processing that may be performed by processor 502 on the data represented by string correlithm object 602*aa* may include a sequence of operations that collect and/or manipulate data, such as the conversion of raw data into machine-readable form, the flow of data through processor 502 to other elements of a system, any formatting or transformation of the data, and any other computable function.

The measurement of how much time it takes to perform any of the data processes associated with the sub-string correlithm objects 1206*aa*, 1206*bb*, 1206*cc*, and 1206*dd* is illustrated in FIG. 22. In particular, a first time measure, $t_1$, represents the time between performing the first data process associated with sub-string correlithm object 1206*aa* and performing the second data process associated with sub-string correlithm object 1206*bb*. A second time measure, $t_2$, represents the time between performing the second data process associated with sub-string correlithm object 1206*bb* and performing the third data process associated with sub-string correlithm object 1206*cc*. A third time measure, $t_3$, represents the time between performing the third data process associated with sub-string correlithm object 1206*cc* and performing the fourth data process associated with sub-string correlithm object 1206*dd*.

In one embodiment, one or more of the time measures, $t_1$, $t_2$, and $t_3$ comprises a measurement of time between the completion of one data process (e.g., first data process associated with sub-string correlithm object 1206*aa*) and the beginning of the next data process (e.g., second data process associated with sub-string correlithm object 1206*bb*). In another embodiment, one or more of the time measures, $t_1$, $t_2$, and $t_3$ comprises a measurement of time between the completion of one data process (e.g., first data process associated with sub-string correlithm object 1206*aa*) and the completion of the next data process (e.g., second data process associated with sub-string correlithm object 1206*bb*). In still another embodiment, one or more of the time measures, $t_1$, $t_2$, and $t_3$ comprise a measurement of time between the beginning of one data process (e.g., first data process associated with sub-string correlithm object 1206*aa*) and the beginning of the next data process (e.g., second data process associated with sub-string correlithm object 1206*bb*). Other embodiments may organize the measurements of time according to the needs of any particular application.

Sensor 302 observes these time measurements $t_1$, $t_2$, and $t_3$ as real-world data and outputs a string correlithm object 602*bb* to represent them as correlithm objects. In particular, sensor 302 observes time measurement $t_1$ as real-world data and outputs a sub-string correlithm object 1206*xx* to represent $t_1$ as a correlithm object 104. Sensor 302 observes time measurement $t_2$ as real-world data and outputs a sub-string correlithm object 1206*yy* to represent $t_2$ as a correlithm object 104. Sensor 302 observes time measurement $t_3$ as real-world data and outputs a sub-string correlithm object 1206*zz* to represent $t_3$ as a correlithm object 104. The combination of sub-string correlithm objects 1206*xx*, 1206*yy*, and 1206*zz* form string correlithm object 602*bb*. In this way, sensor 302 is an "internal" sensor in that it that monitors the real-world data characterizing correlithm objects 104 internal to the correlithm object processing system. As described above, a sensor engine 510 implements sensors 302. The operation of a sensor 302 to convert real-world data into correlithm objects is described at length above, at least with respect to FIGS. 3 and 4.

As described above, the sub-string correlithm objects 1206*aa*, 1206*bb*, 1206*cc*, and 1206*dd* each comprise an n-bit digital word representing data and/or a data process. The sub-string correlithm objects 1206*xx-zz* each comprise an m-bit digital word representing data (e.g., the time measurements) in m-dimensional space. In one embodiment, the n-dimensional space associated with sub-string correlithm objects 1206*aa-dd* equals the m-dimensional space associated with sub-string correlithm objects 1206*xx-zz*. In other words, for example, the sub-string correlithm objects 1206*aa-dd* and the sub-string correlithm objects 1206*xx-zz* may be all be represented by 64-bit digital words. In another embodiment, the n-dimensional space associated with sub-string correlithm objects 1206*aa-dd* may be xx-zz. In other words, for example, the sub-string correlithm objects 1206*aa-dd* may be all represented by 64-bit digital words whereas the sub-string correlithm objects 1206*xx-zz* may be all represented by 128-bit digital words.

Figure 23:
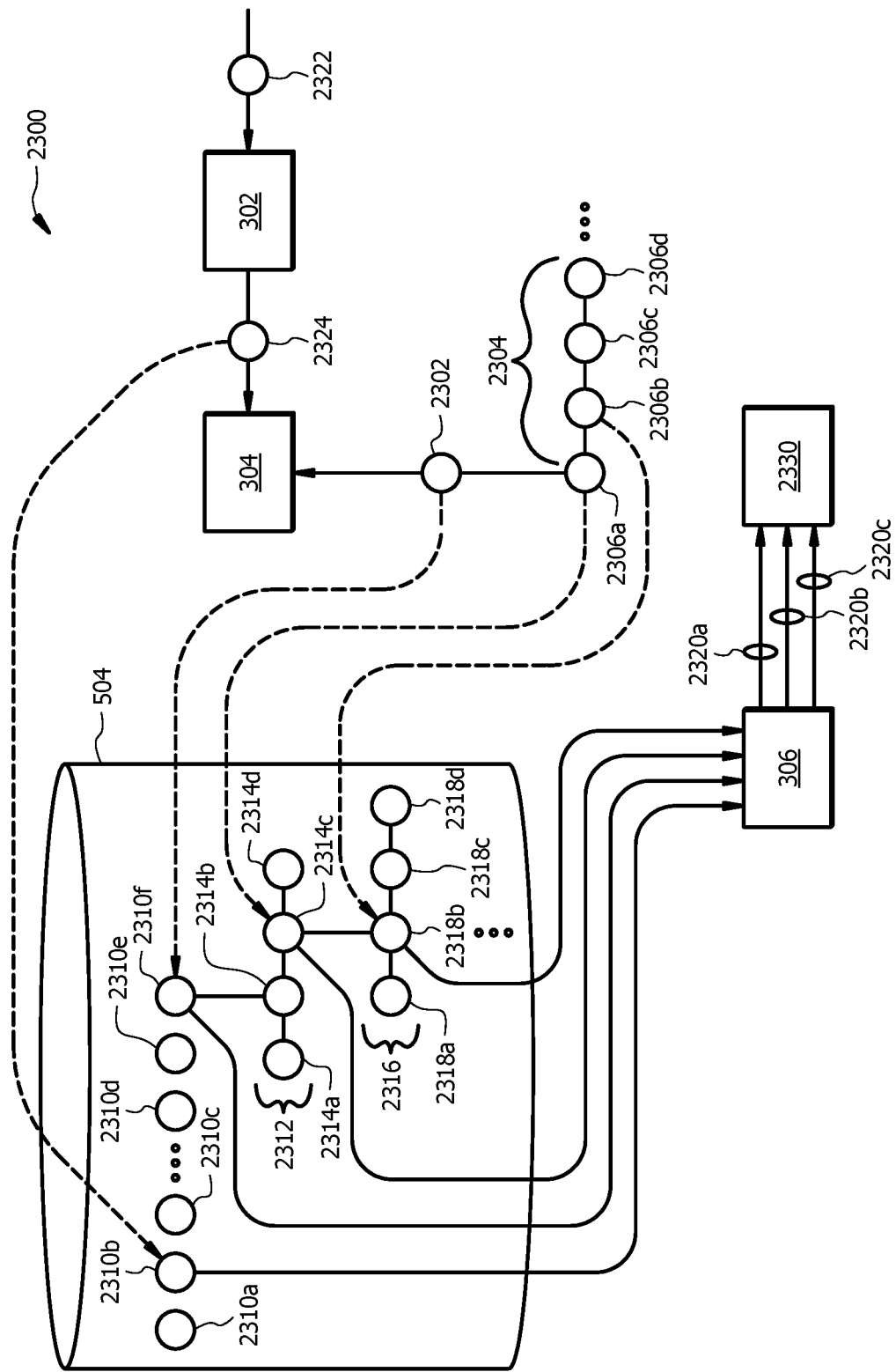
FIG. 23 illustrates one embodiment of a correlithm object processing system to emulate recording and playback.

FIG. 23 illustrates one embodiment of a correlithm object processing system 2300 that includes a sensor 302, a node 304, and an actor 306. System 2300 and its constituent components can be implemented by processor 502, one or more of the engines 510, 512, 514, and 522, and other elements of computer architecture 500, described above with respect to FIG. 5. In general, node 304 receives an input correlithm object 2302 that represents a task to be performed. This task may comprise a series of sub-tasks that are represented by a string correlithm object 2304 and sub-string correlithm objects 2306*a-d*. Memory 504 of system 2300 stores data representing a "recording" of prior experiences in correlithm objects 2310*a-f*, string correlithm object 2312, and string correlithm object 2316. Node 304 compares the correlithm objects 104 representing the tasks and sub-tasks with the correlithm objects 104 representing prior experiences in n-dimensional space. Actor 306 outputs real-world data 2320 to perform the tasks based on the results of these comparisons. The use of correlithm objects 104 to compare tasks and sub-tasks to be performed with prior experiences enables system 2300 to perform analogous reasoning such as, for example, for artificial intelligence applications. In this way, system 2300 can "playback" prior experiences to perform future tasks and sub-tasks. Sensor 302 monitors real-world data 2322 as the tasks and sub-tasks are being performed, and works with node 304 to address gaps or inconsistencies in the analogous reasoning. Conventional artificial intelligence systems are unable to perform this sort of analogous reasoning that is powered by correlithm objects 104, as explained below. In a particular embodiment, the analogous reasoning enabled by system 2300 may be used to control movements and operations of a machine 2330, such as a robot in one embodiment.

Input correlithm object 2302 represents a task to be performed. In one embodiment, the task may be any suitable movement or operation to be performed by a machine 2330, such as a robot. The task may involve a series of individual sub-tasks that may be independent of each other or that may be dependent upon each other to perform the task. These sub-tasks are collectively represented in FIG. 23 by string correlithm object 2304 and individually represented by each of sub-string correlithm objects 2306*a-d* of string correlithm object 2304. Although string correlithm object 2304 is illustrated with four sub-string correlithm objects 2306*a-d*, it may include any number and combination of sub-string correlithm objects as appropriate for the particular application. For example, the task may be to control a robot to purchase a gallon of milk in a grocery store. In this example, the sub-tasks may involve "buying milk in a particular grocery store," "locating where in the particular grocery store the milk can be found," "picking up and carrying the gallon of milk to the checkout counter," and "paying for the gallon of milk," among others.

Correlithm objects 2310*a-f* stored in memory 504 represent data detailing a range of prior experiences which might be useful to perform the specific task associated with input correlithm object 2302. For example, correlithm object 2310*d* may represent data detailing a prior experience of "buying bread in a grocery store"; correlithm object 2310*e* may represent data detailing a prior experience of "buying milk in a gas station convenience store"; and correlithm object 2310*f* may represent data detailing a prior experience of "buying milk in a grocery store." Correlithm objects 2310*a-c* may represent data that is more generally associated with a prior experience of buying goods. For example, correlithm object 2310*a* may represent data detailing a prior experience of "looking for a product when it cannot be found"; correlithm object 2310*b* may represent data detailing a prior experience of "asking for help when a product cannot be found"; and correlithm object 2310*c* may represent data detailing a prior experience of "giving up and going home when a product cannot be found."

Node 304 receives the input correlithm object 2302 as well as the sub-string correlithm objects 2306*a-d* that represent the tasks and sub-tasks to be performed, and determines which prior experience is most analogous to the task to be performed. To do this, node 304 compares input correlithm object 2302 with the plurality of correlithm objects 2310*a-f* to identify the particular correlithm object 2310 that is closest in n-dimensional space to input correlithm object 2302. In particular, node 304 determines the distances in n-dimensional space between input correlithm object 2302 and each of the plurality of correlithm objects 2310. In one embodiment, these distances may be determined by calculating Hamming distances between input correlithm object 2302 and each of the plurality of correlithm objects 2310. In another embodiment, these distances may be determined by calculating the anti-Hamming distances between input correlithm object 2302 and each of the plurality of correlithm objects 2310.

As described above, the Hamming distance is determined based on the number of bits that differ between the binary string representing input correlithm object 2302 and each of the binary strings representing each of the correlithm objects 2310*a-f*. The anti-Hamming distance may be determined based on the number of bits that are the same between the binary string representing input correlithm object 2302 and each of the binary strings representing each of the correlithm objects 2310*a-f*. In still other embodiments, the distances in n-dimensional space between input correlithm object 2302 and each of the correlithm objects 2310*a-f* may be determined using a Minkowski distance or a Euclidean distance.

Upon calculating the distances between input correlithm object 2302 and each of the plurality of correlithm objects 2310*a-f* using one of the techniques described above, node 304 determines which calculated distance is the shortest distance. This is because the correlithm object 2310 having the shortest distance between it and input correlithm object 2302 received by node 304 can be thought of as being the most analogous prior experience to the task being performed. In the example described herein, the correlithm object 2310*f* representing data detailing the prior experience of "buying milk in a grocery store" is the most analogous to the task represented by input correlithm object 2302. Thus, system 2300 communicates correlithm object 2310*f* to actor 306.

In the embodiment illustrated in FIG. 23, correlithm object 2310*f* is itself associated with a string correlithm object 2312 that includes a plurality of sub-string correlithm objects 2314*a-d*. Because the prior experience represented by correlithm object 2310*f* was the most analogous to the task represented by input correlithm object 2302, node 304 may access the prior experiences associated with sub-string correlithm objects 2314*a-d* in conjunction with analyzing sub-tasks of the task, as described in greater detail below. In the example presented herein, sub-string correlithm object 2314*a* may represent "buying milk in conjunction with buying other groceries"; sub-string correlithm object 2314*b* may represent "buying only milk, but in a different grocery store" from the one represented by input correlithm object 2302; sub-string correlithm object 2314*c* may represent "buying only milk, and in the same grocery store" as the one represented by input correlithm object 2302; and sub-string correlithm object 2314*d* may represent "buying only milk, but in a specialty grocery store."

The task represented by input correlithm object 2302 is made up of a series of sub-tasks represented by sub-string correlithm objects 2306*a-d*. In the example described herein, the sub-task of "buying milk in a particular grocery store" may be represented by sub-string correlithm object 2306*a*; "locating where in the particular grocery store the milk can be found" may be represented by sub-string correlithm object 2306*b*; "picking up and carrying the gallon of milk to the checkout counter" may be represented by sub-string correlithm object 2306*c*; and "paying for the gallon of milk" may be represented by sub-string correlithm object 2306*d*. Although only four sub-tasks are described in conjunction with this example, additional or fewer sub-tasks may be provided, as appropriate, together with additional or fewer sub-string correlithm objects 2306 to represent those sub-tasks.

Node 304 receives sub-string correlithm object 2306*a* and determines which prior experience among those represented by sub-string correlithm objects 2314*a-d* is most analogous to the sub-task to be performed. To do this, node 304 compares input sub-string correlithm object 2306*a* with the plurality of sub-string correlithm objects 2314*a-d* to identify the particular sub-string correlithm object 2314 that is closest in n-dimensional space to input sub-string correlithm object 2306*a*. In particular, node 304 determines the distances in n-dimensional space between input sub-string correlithm object 2306a and each of the sub-string correlithm objects 2314a-d.

Upon calculating the distances between input sub-string correlithm object 2306a and each of the plurality of sub-string correlithm objects 2314a-d using one of the techniques described above, node 304 determines which calculated distance is the shortest distance. This is because the sub-string correlithm object 2314 having the shortest distance between it and input sub-string correlithm object 2306a received by node 304 can be thought of as being the most analogous prior experience to the sub-task being performed. In the example described herein, the sub-string correlithm object 2314c representing data detailing the prior experience of "buying milk in the same grocery store" is the most analogous to the sub-task represented by input sub-string correlithm object 2306a. Thus, system 2300 communicates sub-string correlithm object 2314c to actor 306 which outputs real-world data 2320a representing the prior experience of "buying milk in the same grocery" as indicated by the task. This real-world data 2320a may be used by a robot or other machine 2330 in conjunction with other real-world data to perform at least a portion of a task or sub-task.

Sub-string correlithm object 2314c is associated with a string correlithm object 2316 that includes a plurality of sub-string correlithm objects 2318a-d. Because the prior experience represented by correlithm object 2314c was the most analogous to the sub-task represented by input sub-string correlithm object 2306a, node 304 may access the prior experiences associated with sub-string correlithm objects 2318a-d in conjunction with analyzing additional sub-tasks of the task, as described in greater detail below. In the example presented herein, sub-string correlithm object 2318a may represent data detailing the "general layout of the grocery store"; sub-string correlithm object 2318b may represent data for "locating the refrigerator unit storing milk in the back of the grocery store"; sub-string correlithm object 2318c may represent data for "paying for the gallon of milk at a self-checkout counter"; and sub-string correlithm object 2318d may represent data for "paying for the gallon of milk at a full service checkout counter."

Node 304 receives sub-string correlithm object 2306b and determines which prior experience among those represented by sub-string correlithm objects 2318a-d is most analogous to the sub-task to be performed. To do this, node 304 compares input sub-string correlithm object 2306b with the plurality of sub-string correlithm objects 2318a-d to identify the particular sub-string correlithm object 2318 that is closest in n-dimensional space to input sub-string correlithm object 2306b. In particular, node 304 determines the distances in n-dimensional space between input sub-string correlithm object 2306b and each of the sub-string correlithm objects 2318a-d.

Upon calculating the distances between input sub-string correlithm object 2306b and each of the plurality of sub-string correlithm objects 2318a-d using one of the techniques described above, node 304 determines which calculated distance is the shortest distance. This is because the sub-string correlithm object 2318 having the shortest distance between it and input sub-string correlithm object 2306b received by node 304 can be thought of as being the most analogous prior experience to the sub-task being performed. In the example described above, the sub-string correlithm object 2318b representing data associated with the prior experience of "locating the refrigerator unit storing milk in the back of the grocery store" is the most analogous to the sub-task represented by input sub-string correlithm object 2306b. Thus, system 2300 communicates sub-string correlithm object 2318b to actor 306 which outputs real-world data 2320b representing the prior experience of "locating the refrigerator unit storing milk in the back of the grocery store." This real-world data 2320b may be used by a robot or other machine 2330 in conjunction with other real-world data to perform at least a portion of a task or sub-task. For example, this real-world data 2320b may be used to instruct the robot to walk to the back of the grocery store where a prior experience suggested the gallon of milk may be stored in a refrigerator unit. Note that the prior experience for "locating the refrigerator unit storing milk in the back of the grocery store" need not be a hard-coded instruction for the machine 2330 to follow. It also need not be an exact match to the task or specific sub-task to be performed. Instead, it may simply be analogous to the task or sub-task to be performed. The use of correlithm objects 104 to compare prior experiences and tasks/sub-tasks in n-dimensional space enables system 2300 to find analogous prior experiences which may be used to control a machine 2330, rather than requiring an exact match between tasks/sub-tasks and a prior experience. This provides a technical advantage over conventional artificial intelligence systems, such as ones that are used to control machinery 2330.

A sensor 302 may be used to address inconsistencies between real-world data and the prior experiences determined to be analogous to tasks/sub-tasks. In the example described herein, a sensor 302 positioned on the robot may be used to observe real-world data 2322 that determines whether the milk is indeed located in the back of the grocery store. For example, the real-world data 2322 may be visual data captured by a camera on a robot that walked to the back of the grocery store. This real-world data 2322 may indicate that rather than storing milk in the back of the grocery store, the refrigerator unit that the robot finds itself in front of actually stores eggs. In other words, the real-world data 2322 may indicate that the gallon of milk is not actually found where prior experiences suggested it should be found. Thus, the real-world data 2322 may be inconsistent with the real-world data 2320b indicating that the refrigerator unit storing milk is located in the back of the grocery store. At this point, sensor 302 may convert the real-world data 2322 indicating that the milk was not found in the back of the grocery store into an intermediate input correlithm object 2324.

Node 304 receives the intermediate input correlithm object 2324, and determines which prior experience is most analogous to it. For example, node 304 determines which prior experience is most analogous to not being able to find the milk in the grocery store. To do this, node 304 compares intermediate input correlithm object 2324 with the plurality of correlithm objects 2310a-f to identify the particular correlithm object 2310 that is closest in n-dimensional space to intermediate input correlithm object 2324. In particular, node 304 determines the distances in n-dimensional space between intermediate input correlithm object 2324 and each of the plurality of correlithm objects 2310.

Upon calculating the distances between intermediate input correlithm object 2324 and each of the plurality of correlithm objects 2310, node 304 determines which calculated distance is the shortest distance. In the example described herein, the correlithm object 2310b representing data detailing the prior experience of "looking for a product when it cannot be found" is the most analogous to the condition represented by intermediate input correlithm object 2324. Thus, system 2300 communicates correlithm object 2310b to actor 306 which outputs real-world data 2320c representing the prior experience of "looking for a product when it cannot be found." This real-world data 2320c may be used by a robot or other machine 2330 in conjunction with other real-world data to perform at least a portion of a task or sub-task.

Upon looking for the milk and, perhaps, finding the milk in a different refrigerator unit in the back of the grocery store, the operation can return to performing the remaining sub-tasks, such as "picking up and carrying the gallon of milk to the checkout counter" as represented by sub-string correlithm object 2306c, and "paying for the gallon of milk" as represented by sub-string correlithm object 2306d. The sensor 302, node 304, and actor 306 work harmoniously to compare tasks/sub-tasks to be performed with prior experiences, to produce real-world data 2320 used to control the operation of machines 2330, and to monitor real-world data 2322 in order to fill in any gaps or correct for any inconsistencies with real-world data 2320.

The operation of system 2300 was described above with respect to a particular example to illustrate how particular tasks/sub-tasks can be compared to prior experiences in n-dimensional space using correlithm objects 104 to emulate analogous reasoning in an artificial intelligence application. The operation of system 2300 is not limited to the specific example described herein.

Figure 24:
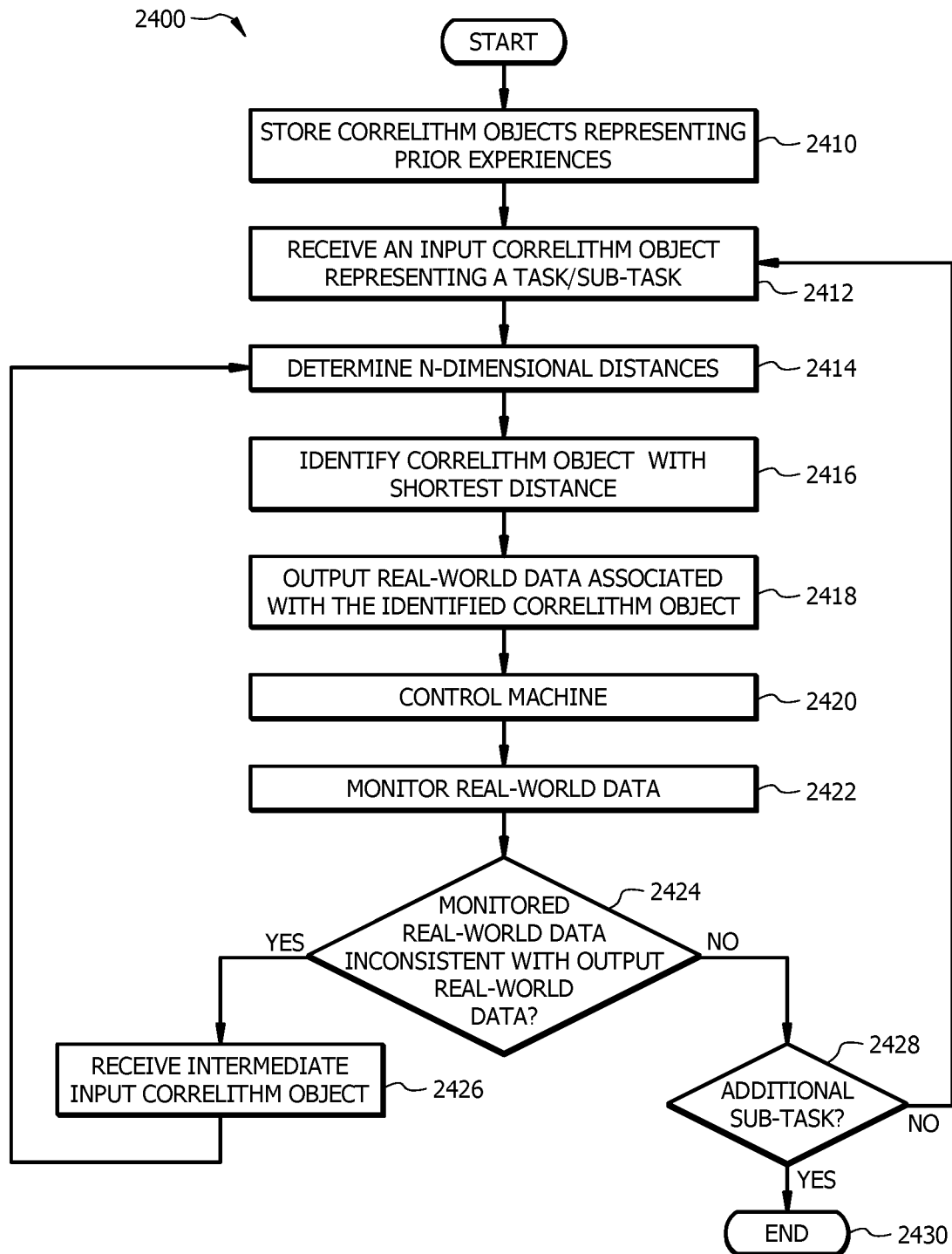
FIG. 24 illustrates an embodiment of a process for emulating recording and playback in a correlithm object processing system.

FIG. 24 is a flowchart of an embodiment of a process 2400 for comparing tasks/sub-tasks with prior experiences using correlithm objects 104 to perform analogous reasoning such as, for example, in an artificial intelligence application. At step 2410, correlithm objects 104 representing prior experiences are stored such as, for example, in a memory 504. Referring back to FIG. 23, these correlithm objects 104 may be logically organized in a hierarchy that includes any number and combination of multiple levels of correlithm objects 104. For example, correlithm objects 104 may include a plurality of correlithm objects 2310. One or more of these correlithm objects 2310 may be associated with multiple levels of string correlithm objects. For example, as illustrated in FIG. 23, correlithm object 2310f includes a first level string correlithm object 2312 that itself comprises a plurality of first level sub-string correlithm objects 2314a-d. Similarly, one or more of these first level sub-string correlithm objects 2314a-d also includes a second level string correlithm object 2316 that itself comprises a plurality of second level sub-string correlithm objects 2318a-d. Although the correlithm objects 104 stored at step 2410 are illustrated as being organized in a hierarchical relationship, they may be stored in any suitable logical organization that facilitates interrelationships and access by the other elements of system 2300, such as node 304.

Execution proceeds to step 2412 where the process 2400 receives an input correlithm object 104 representing a task/sub-task. Referring back to FIG. 23, for example, node 304 may receive input correlithm object 2302 representing a task to be performed. Node 304 may also receive one or more input sub-string correlithm objects 2306a-d representing sub-tasks to be performed.

At step 2414, the process 2400 determines distances in n-dimensional space between the received input correlithm object 104 representing the task/sub-task and the stored correlithm objects 104 representing prior experiences. Referring back to FIG. 23, for example, node 304 may determine the n-dimensional distance between input correlithm objects 2302 and each of the plurality of correlithm objects 2310a-f to find the prior experience that is the closest match to the task to be performed. In another example, node 304 may determine the n-dimensional distance between input sub-string correlithm objects 2306a-d and sub-string correlithm objects 2314a-d and/or 2318a-d. As explained above, these n-dimensional distances may be determined using Hamming distances, anti-Hamming distances, Minkowski distances, and/or Euclidean distances. By comparing correlithm objects 104 in n-dimensional space, process 2400 can find prior experiences that are most analogous to the task/sub-task to be performed instead of having to find an exact match.

At step 2416, process 2400 identifies the correlithm object 104 with the shortest distance in n-dimensional space, which indicates the prior experience that is most analogous to the task/sub-task to be performed. Referring back to FIG. 23, for example, node 304 determines which of correlithm objects 2310a-f has the shortest distance in n-dimensional space to the input correlithm object 2302 representing a task. In another example, node 304 determines which of sub-string correlithm objects 2314a-d and/or 2318a-d has the shortest distance in n-dimensional space to a particular input sub-string correlithm object 2306a-d representing a sub-task.

At step 2418, process 2400 outputs real-world data associated with the correlithm object 104 identified at step 2416. Referring back to FIG. 23, for example, actor 306 may receive one or more of correlithm objects 2310b, 2314c and 2318b and output real-world data 2320a-c. In a particular embodiment, execution proceeds to step 2420 where process 2400 controls machine 2330 using real-world data 2320. For example, machine 2330 may be a robot that is controlled, at least in part, based upon the real-world data 2320 output by actor 306 in combination with any other instructions or programming, as appropriate. At step 2422, process 2400 monitors real-world data. Referring back to FIG. 23, for example, sensor 302 may receive real-world data 2322 as the tasks and sub-tasks are being performed, and works with node 304 to address gaps or inconsistencies in the analogous reasoning. Execution proceeds to step 2424 where process 2400 determines whether the real-world data monitored at step 2422 is inconsistent with any real-world data output at step 2418. If yes, then execution proceeds to step 2426 where process 2400 receives an intermediate input correlithm object 2426 associated with the real-world data 2322 monitored at step 2422, and execution returns to step 2414. If no, execution proceeds to step 2428 where process 2400 determines whether any sub-tasks represented by sub-string correlithm objects 2306 remain to be processed. If yes, execution returns to step 2412. If no, execution concludes at step 2430.

The relationships between and among data elements can span multiple dimensions of n-dimensional space 102. Moreover, multiple data elements (e.g., real-world data or data already represented by correlithm objects 104) often have interrelationships between them that cannot always be captured in a linear geometric relationship. For example, data elements A, B, and C may have interrelationships such that data element A is correlated with data element B by a certain degree and data element B is correlated with data element C by a certain degree, but data element A is correlated with data element C by an amount that is not necessarily the sum of the amount of correlation of data elements A with B and data elements B with C. Accordingly, a technique to map the correlations between multiple data elements that have other geometric relationships is desirable. A lattice correlithm object and/or a bidirectional string correlithm object, as described below, may be used to capture these more complex interrelationships between and among data elements in n-dimensional space 102.

Figure 25:
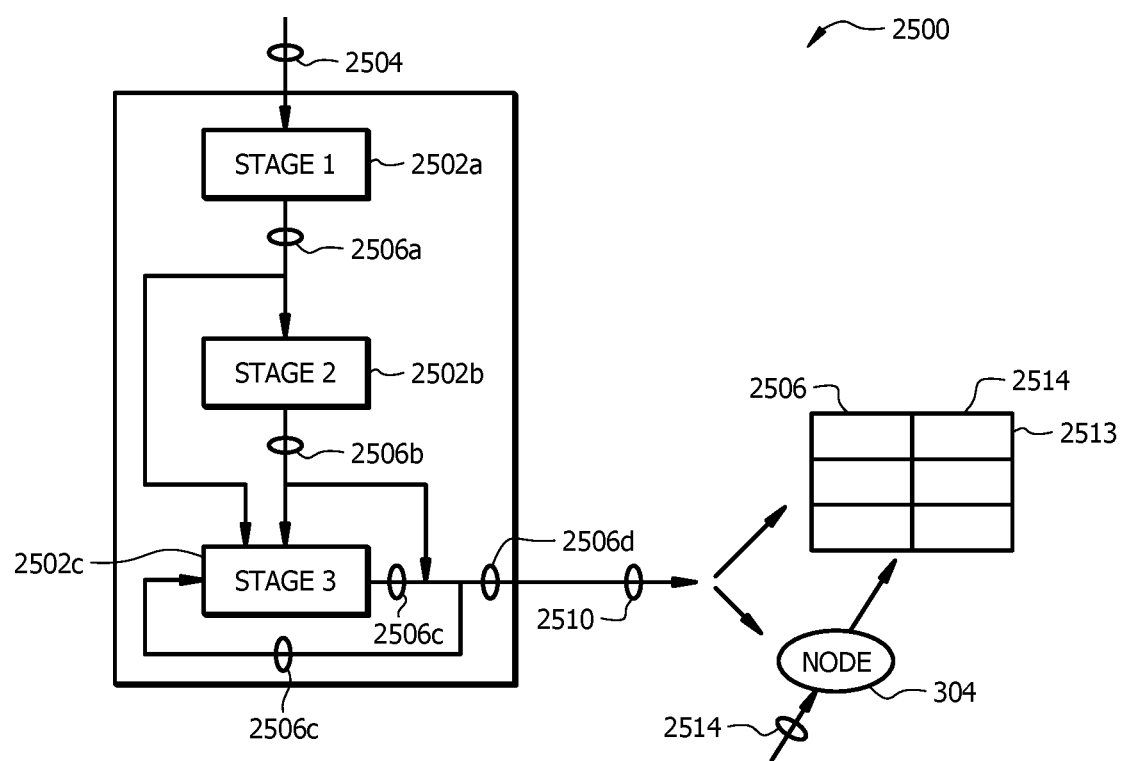
FIG. 25 illustrates an embodiment of a triangle lattice correlithm object generator.

FIG. 25 illustrates one embodiment of a triangle lattice correlithm object generator 2500 configured to generate a triangle lattice correlithm object 2510 as output. Triangle lattice correlithm object generator 2500 and its constituent components is implemented by lattice correlithm object engine 524, and any other suitable elements of computer architecture 500, described above with respect to FIG. 5. Triangle lattice correlithm object generator 2500 comprises a first processing stage 2502a, a second processing stage 2502b, and a third processing stage 2502c communicatively coupled to each other. First processing stage 2502a receives an input 2504 and outputs a first sub-lattice correlithm object 2506a that comprises an n-bit digital word wherein each bit has either a value of zero or one. In one embodiment, first processing stage 2502a generates the values of each bit randomly. Input 2504 comprises one or more parameters used to determine the characteristics of the lattice correlithm object 2510. For example, input 2504 may include a parameter for the number of dimensions, n, in the n-dimensional space 102 (e.g., 64, 128, 256, etc.) in which to generate the lattice correlithm object 2510. Input 2504 may also include a distance parameter, δ, that indicates a particular number of bits of the n-bit digital word (e.g., 4, 8, 16, etc.) that will be changed from one sub-lattice correlithm object 2506 to the next in the lattice correlithm object 2510. Although FIG. 25 illustrates only first processing stage 2502a receiving input 2504, it should be understood that both second processing stage 2502b and third processing stage 2502c may also receive input 2504 (or at least the information contained within input 2504).

In the examples described below, assume that n=64 such that each sub-lattice correlithm object 2506 of the lattice correlithm object 2510 is a 64-bit digital word. As discussed previously with regard to FIG. 9, the standard deviation is equal to $$\sqrt{\frac{n}{4}},$$

or four bits, for a 64-dimensional space 102. In one embodiment, the distance parameter, δ, is selected to equal the standard deviation. In this embodiment, the distance parameter is also four bits (e.g., one standard deviation). Although in the examples described below the selected distance parameter is four bits, other distance parameters may be used in input 2504 depending on the particular structure and arrangement desired for triangle lattice correlithm object 2510. In general, the fewer the number of bits that are changed between sub-lattice correlithm objects 2506, the tighter the correlation between those sub-lattice correlithm objects 2506; and the greater the number of bits that are changed between sub-lattice correlithm objects 2506, the looser the correlation between those sub-lattice correlithm objects 2506. Moreover, it is not necessary that each processing stage 2502 of triangle correlithm object generator 2500 strictly change the exact number of bits identified by the distance parameter from one sub-lattice correlithm object 2506 to the next. Instead, the present disclosure contemplates some variance from the number of bits indicated by the distance parameter (e.g., a fewer or a greater number of bits being changed).

Second processing stage 2502b receives the first sub-lattice correlithm object 2506a and, for a plurality of bits of the first sub-lattice correlithm object 2506a up to the particular number of bits identified in the distance parameter, δ, changes the value from a zero to a one or from a one to a zero to generate a second sub-lattice correlithm object 2506b. In this example, four bit values are changed from the first sub-lattice correlithm object 2506a to generate the second sub-lattice correlithm object 2506b. The bits of the first sub-lattice correlithm object 2506a that are changed in value to generate the second sub-lattice correlithm object 2506b may be selected randomly from the n-bit digital word. The other bits of the n-bit digital word in second sub-lattice correlithm object 2506b remain the same values as the corresponding bits of the first sub-lattice correlithm object 2506a. By changing four bit values, the core of the first sub-lattice correlithm object 2506a overlaps in 64-dimensional space with the core of the second sub-lattice correlithm object 2506b. Third processing stage 2502c receives the second sub-lattice correlithm object 2506b and modifies certain bits of the second sub-lattice correlithm object 2506b to generate a third sub-lattice correlithm object 2506c, as described below with respect to different embodiments.

General Triangle Lattice Correlithm Object

In one embodiment, the third processing stage 2502c may receive the second sub-lattice correlithm object 2506b and, for a plurality of bits of the second sub-lattice correlithm object 2506b up to the particular number of bits identified in the distance parameter, δ, changes the value from a zero to a one or from a one to a zero to generate a third sub-lattice correlithm object 2506c. In this example, four bit values are changed from the second sub-lattice correlithm object 2506b to generate the third sub-lattice correlithm object 2506c. The bits of the second sub-lattice correlithm object 2506b that are changed in value to generate the third sub-lattice correlithm object 2506c may be selected randomly from the n-bit digital word. The other bits of the n-bit digital word in third sub-lattice correlithm object 2506c remain the same values as the corresponding bits of the second sub-lattice correlithm object 2506b.

Figure 26C:
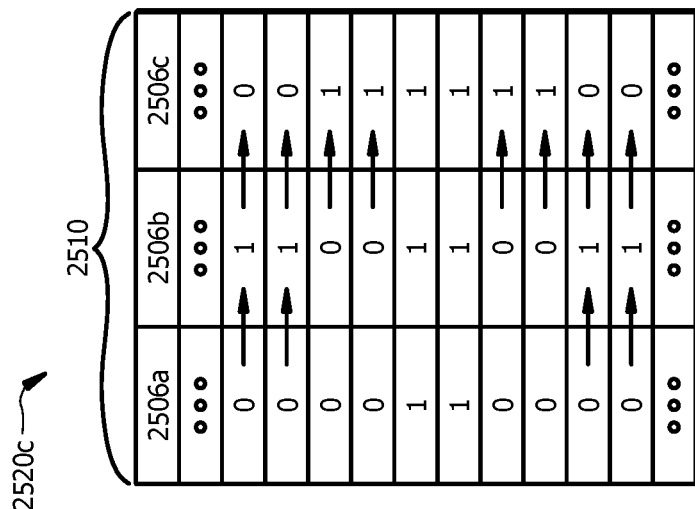
FIGS. 26A-C illustrate embodiments of bit value tables.
Figure 26B:
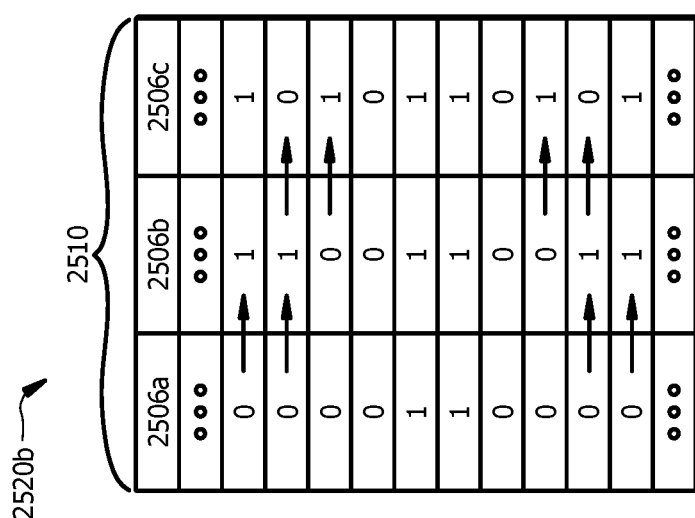
Figure 26A:
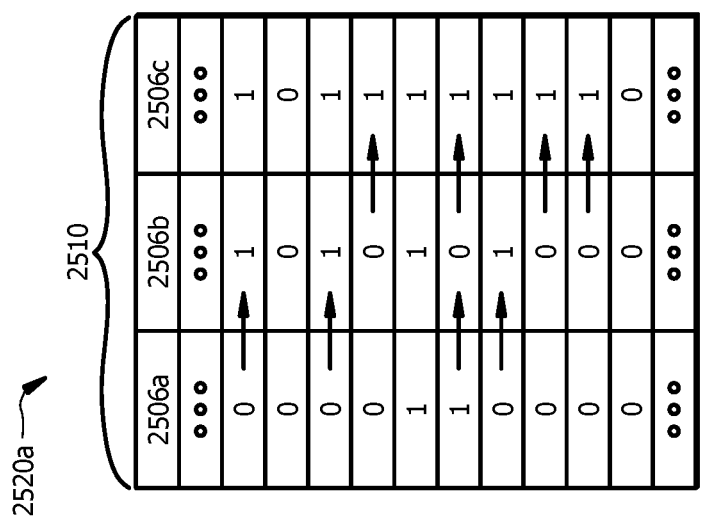

FIG. 26A illustrates a table 2520a that demonstrates the changes in bit values from a first sub-lattice correlithm object 2506a to a second sub-lattice correlithm object 2506b, and from a second sub-lattice correlithm object 2506b to a third sub-lattice correlithm object 2506c, according to this embodiment. For example, the first column of table 2520a illustrates at least a portion of the bit values of the n-dimensional first sub-lattice correlithm object 2506a generated by first processing stage 2502a. The second column of table 2520a illustrates at least a portion of the bit values of the n-dimensional second sub-lattice correlithm object 2506b generated by second processing stage 2502b, with four randomly selected bits with values changed from a zero to a one, or from a one to a zero. The third column of table 2520a illustrates at least a portion of the bit values of the n-dimensional third sub-lattice correlithm object 2506c generated by third processing stage 2502c, with another four randomly selected bits with values changed from a zero to a one, or from a one to a zero.

Figure 27A:
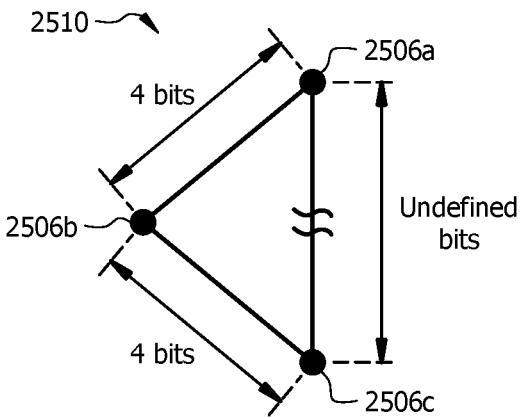
FIGS. 27A-D illustrate embodiments of lattice correlithm objects.

FIG. 27A illustrates one embodiment of a lattice correlithm object 2510 with a generally triangular shape and formed by first sub-lattice correlithm object 2506a, second sub-lattice correlithm object 2506b that is four bits away from first sub-lattice correlithm object 2506a in n-dimensional space 102, and third sub-lattice correlithm object 2506c that is four bits away from second sub-lattice correlithm object 2506b in n-dimensional space 102. Third sub-lattice correlithm object 2506c may be an undefined number of bits away from first sub-lattice correlithm object 2506a in n-dimensional space 102. This is because the particular bits that are changed by second processing stage 2506b when creating second sub-lattice correlithm object 2506*b* from first sub-lattice 2506*a* are randomly selected, and because the particular bits that are changed by third processing stage 2506*c* when creating third sub-lattice correlithm object 2506*c* from second sub-lattice 2506*b* are randomly selected. Therefore, third sub-lattice correlithm object 2506*c* may be anywhere between zero and eight bits away from first sub-lattice correlithm object 2506*a* in n-dimensional space 102.

Referring back to FIG. 25, the third processing stage 2502*c* may receive from itself the third sub-lattice correlithm object 2506*c* and modify certain bits to generate a fourth sub-lattice correlithm object 2506*d*. For example, for a plurality of bits of the third sub-lattice correlithm object 2506*c* up to the particular number of bits identified by the distance parameter, δ, the third processing stage 2502*c* changes the value from a zero to a one or from a one to a zero. In this example, four bit values are changed from the third sub-lattice correlithm object 2506*c* to generate the fourth sub-lattice correlithm object 2506*d*. The bits of the third sub-lattice correlithm object 2506*c* that are changed in value to generate the fourth sub-lattice correlithm object 2506*d* may be selected randomly from the n-bit digital word. The other bits of the n-bit digital word in fourth sub-lattice correlithm object 2506*d* remain the same values as the corresponding bits of the third sub-lattice correlithm object 2506*c*. The third processing stage 2502*c* may successively output a subsequent sub-lattice correlithm object 2506 based on changing bit values of the immediately prior sub-lattice correlithm object 2506 received as feedback, as described herein.

Equilateral Triangle Lattice Correlithm Object

In another embodiment, the third processing stage 2502*c* may receive the second sub-lattice correlithm object 2506*b* and, for each bit of the second sub-lattice correlithm object 2506*b* that was changed from the first sub-lattice correlithm object 2506*a* up to half of the number of bits identified by the distance parameter, δ, changes the value from a zero to a one or from a one to a zero. Thus, in this example, two of the bits that were changed from first sub-lattice correlithm object 2506*a* to second sub-lattice correlithm object 2506*b* are changed to generate third sub-lattice correlithm object 2506*c*. Moreover, for each bit of the second sub-lattice correlithm object 2506*b* that remained the same from the first sub-lattice correlithm object 2506*a* up to half of the number of bits identified by the distance parameter, δ, the third processing stage 2502*c* changes the value from a zero to a one or from a one to a zero. Thus, in this example, two of the bits that remained the same from first sub-lattice correlithm object 2506*a* to second sub-lattice correlithm object 2506*b* are changed to generate third sub-lattice correlithm object 2506*c*. The other bits of the n-bit digital word in third sub-lattice correlithm object 2506*c* remain the same values as the corresponding bits of the second sub-lattice correlithm object 2506*b*.

FIG. 26B illustrates a table 2520*b* that demonstrates the changes in bit values from a first sub-lattice correlithm object 2506*a* to a second sub-lattice correlithm object 2506*b*, and from a second sub-lattice correlithm object 2506*b* to a third sub-lattice correlithm object 2506*c*, according to this embodiment. The first column of table 2520*b* illustrates at least a portion of the bit values of the n-dimensional first sub-lattice correlithm object 2506*a* generated by first processing stage 2502*a*. The second column of table 2520*b* illustrates at least a portion of the bit values of the n-dimensional second sub-lattice correlithm object 2506*b* generated by second processing stage 2502*b*, with four randomly selected bits with values changed from a zero to a one, or from a one to a zero. The third column of table 2520*b* illustrates at least a portion of the bit values of the n-dimensional third sub-lattice correlithm object 2506*c* generated by third processing stage 2502*c*, whereby for each bit of the second sub-lattice correlithm object 2506*b* that was changed from the first sub-lattice correlithm object 2506*a*, up to half of the number of bits identified by the distance parameter, δ, are changed from a zero to a one or from a one to a zero. Thus, as illustrated in the second column of table 2520*b*, four bit values were changed from first sub-lattice correlithm object 2506*a* to create second sub-lattice correlithm object 2506*b*, and two of those bit values are further changed to create third sub-lattice correlithm object 2506*c*. The third column of table 2520*b* also illustrates that for each bit of the second sub-lattice correlithm object 2506*b* that remained the same from the first sub-lattice correlithm object 2506*a*, up to half of the number of bits identified by the distance parameter, δ, are changed from a zero to a one or from a one to a zero. Thus, as illustrated in the second column of table 2520*b*, sixty bit values remained the same from first sub-lattice correlithm object 2506*a* to create second sub-lattice correlithm object 2506*b* and two of those bit values are changed to create third sub-lattice correlithm object 2506*c*. The other bits of the n-bit digital word in third sub-lattice correlithm object 2506*c* remain the same values as the corresponding bits of the second sub-lattice correlithm object 2506*b*.

Figure 27B:
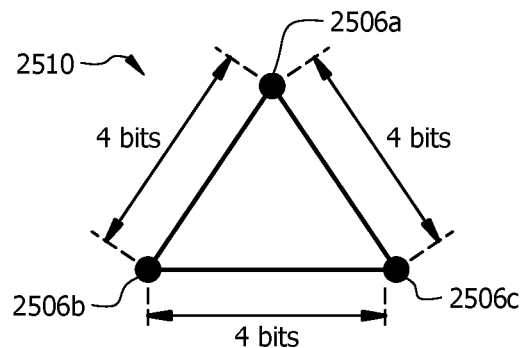

FIG. 27B illustrates one embodiment of a lattice correlithm object 2510 with an equilateral triangle shape and formed by first sub-lattice correlithm object 2506*a*, second sub-lattice correlithm object 2506*b* that is four bits away from first sub-lattice correlithm object 2506*a* in n-dimensional space 102, and third sub-lattice correlithm object 2506*c* that is four bits away from second sub-lattice correlithm object 2506*b* in n-dimensional space 102. Because of the particular technique employed by the third processing stage 2502*c* described above, third sub-lattice correlithm object 2506*c* is also four bits away from first sub-lattice correlithm object 2506*a* in n-dimensional space 102, which leads to the equilateral triangle shape. This is because the particular bits that are changed by third processing stage 2502*c* when creating third sub-lattice correlithm object 2506*c* from second sub-lattice 2506*b* are specifically determined as described above.

Referring back to FIG. 25, the third processing stage 2502*c* may receive from itself the third sub-lattice correlithm object 2506*c* and modify certain bits to generate a fourth sub-lattice correlithm object 2506*d*. For example, for each bit of the third sub-lattice correlithm object 2506*c* that is different from the first sub-lattice correlithm object 2506*a* up to half of the number of bits identified by the distance parameter, δ, the third processing stage 2502*c* changes the value from a zero to a one or from a one to a zero. In this example, two of the four bits that are different between the third sub-lattice correlithm object 2506*c* and the first sub-lattice correlithm object 2506*a* are changed to generate fourth sub-lattice correlithm object 2506*d*. Additionally, for each bit of the third sub-lattice correlithm object 2506*c* that is the same from the first sub-lattice correlithm object 2506*a* up to half of the number of bits identified by the distance parameter, δ, the third processing stage 2502*c* changes the value from a zero to a one or from a one to a zero. In this example, two of the sixty bits that remained the same between the third sub-lattice correlithm object 2506*c* and the first sub-lattice correlithm object 2506*a* are changed to generate the fourth sub-lattice correlithm object 2506*d*. The other bits of the n-bit digital word in fourth sub-lattice correlithm object 2506*d* remain the same values as the corresponding bits of the third sub-lattice correlithm object 2506*c*. The third processing stage 2502*c* may successively output a subsequent sub-lattice correlithm object 2506, such as sub-lattice correlithm objects 2506*e*, 2506*f*, and 2506*g* as illustrated in FIG. 27D, based on changing bit values of the immediately prior sub-lattice correlithm object 2506 received as feedback, as described herein. FIG. 27D illustrates one embodiment of a hexagonal lattice correlithm object 2512 formed by generating and arranging six lattice correlithm objects 2510 with an equilateral triangle shape, using the techniques described herein.

Isosceles triangle Lattice Correlithm Object

In still another embodiment, the third processing stage 2502*c* may receive the second sub-lattice correlithm object 2506*b* and, for each bit of the second sub-lattice correlithm object 2506*b* that was changed from the first sub-lattice correlithm object 2506*a*, changes the value from a zero to a one or from a one to a zero. Thus, in this example, all four of the bits that were changed from first sub-lattice correlithm object 2506*a* to second sub-lattice correlithm object 2506*b* are changed to generate third sub-lattice correlithm object 2506*c*. Moreover, for each bit of the second sub-lattice correlithm object 2506*b* that remained the same from the first sub-lattice correlithm object 2506*a* up to the number of bits identified by the distance parameter, δ, the third processing stage 2502*c* changes the value from a zero to a one or from a one to a zero. Thus, in this example, four of the bits that remained the same from the first sub-lattice correlithm object 2506*a* to generate second sub-lattice correlithm object 2506*b* are changed to generate third sub-lattice correlithm object 2506*c*. The other bits of the n-bit digital word in third sub-lattice correlithm object 2506*c* remain the same values as the corresponding bits of the second sub-lattice correlithm object 2506*b*.

FIG. 26C illustrates a table 2520*c* that demonstrates the changes in bit values from a first sub-lattice correlithm object 2506*a* to a second sub-lattice correlithm object 2506*b*, and from a second sub-lattice correlithm object 2506*b* to a third sub-lattice correlithm object 2506*c*, according to this embodiment. The first column of table 2520*c* illustrates at least a portion of the bit values of the n-dimensional first sub-lattice correlithm object 2506*a* generated by first processing stage 2502*a*. The second column of table 2520*c* illustrates at least a portion of the bit values of the n-dimensional second sub-lattice correlithm object 2506*b* generated by second processing stage 2502*b*, with four randomly selected bits with values changed from a zero to a one, or from a one to a zero. The third column of table 2520*c* illustrates at least a portion of the bit values of the n-dimensional third sub-lattice correlithm object 2506*c* generated by third processing stage 2502*c*, whereby each of the four bits of the second sub-lattice correlithm object 2506*b* that was changed from the first sub-lattice correlithm object 2506*a*, are changed from a zero to a one or from a one to a zero. Thus, as illustrated in the second column of table 2520*c*, four bit values were changed from first sub-lattice correlithm object 2506*a* to create second sub-lattice correlithm object 2506*b* and each of those four bit values are further changed to create third sub-lattice correlithm object 2506*c*. The third column of table 2520*c* also illustrates that for each bit of the second sub-lattice correlithm object 2506*b* that remained the same from the first sub-lattice correlithm object 2506*a*, the number of bits identified by the distance parameter, δ, are changed from a zero to a one or from one to a zero. Thus, as illustrated in the second column of table 2520*c*, sixty bit values remained the same from first sub-lattice correlithm object 2506*a* to create second sub-lattice correlithm object 2506*b* and four of those bit values are changed to create third sub-lattice correlithm object 2506*c*. The other bits of the n-bit digital word in third sub-lattice correlithm object 2506*c* remain the same values as the corresponding bits of the second sub-lattice correlithm object 2506*b*.

Figure 27C:
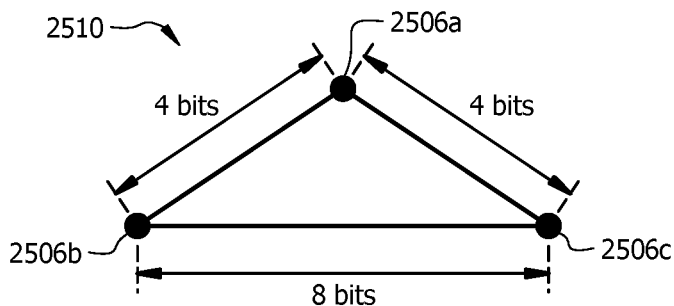
Figure 27D:
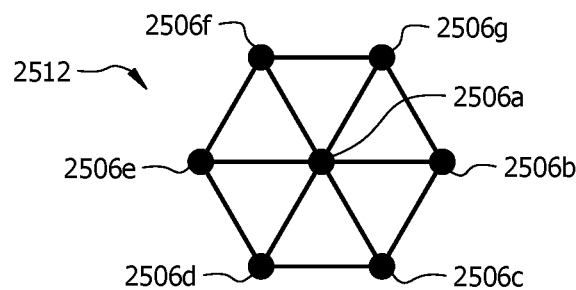

FIG. 27C illustrates one embodiment of a lattice correlithm object 2510 with a triangle shape and formed by first sub-lattice correlithm object 2506*a*, second sub-lattice correlithm object 2506*b* that is four bits away from first sub-lattice correlithm object 2506*a* in n-dimensional space 102, and third sub-lattice correlithm object 2506*c* that is eight bits away from second sub-lattice correlithm object 2506*b* in n-dimensional space 102 but only four bits away from first sub-lattice correlithm object 2506*a* in n-dimensional space 102. This is because the particular bits that are changed by third processing stage 2502*c* when creating third sub-lattice correlithm object 2506*c* from second sub-lattice 2506*b* are specifically determined as described above.

Referring back to FIG. 25, the third processing stage 2502*c* may receive from itself the third sub-lattice correlithm object 2506*c* and modify certain bits to generate a fourth sub-lattice correlithm object 2506*d*. For example, for each bit of the third sub-lattice correlithm object 2506*c* that is different from the first sub-lattice correlithm object 2506*a*, the third processing stage 2502*c* changes the value from a zero to a one or from a one to a zero. In this example, the four bits that are different between the third sub-lattice correlithm object 2506*c* and the first sub-lattice correlithm object 2506*a* are changed to generate fourth sub-lattice correlithm object 2506*d*. Additionally, for each bit of the third sub-lattice correlithm object 2506*c* that is the same from the first sub-lattice correlithm object 2506*a* up to the number of bits identified by the distance parameter, δ, the third processing stage 2502*c* changes the value from a zero to a one or from a one to a zero. In this example, four of the sixty bits that remained the same between the third sub-lattice correlithm object 2506*c* and the first sub-lattice correlithm object 2506*a* are changed to generate the fourth sub-lattice correlithm object 2506*d*. The other bits of the n-bit digital word in fourth sub-lattice correlithm object 2506*d* remain the same values as the corresponding bits of the third sub-lattice correlithm object 2506*c*. The third processing stage 2502*c* may successively output a subsequent sub-lattice correlithm object 2506 based on changing bit values of the immediately prior sub-lattice correlithm object 2506 received as feedback, as described herein.

FIG. 25 further illustrates a node 304 and node table 2513 stored in memory 504. Node 304 receives the lattice correlithm object 2510, including each of the sub-lattice correlithm objects 2506, and further receives data elements 2514 in the form of real-world data elements or data represented by correlithm objects 104. Node table 2513 associates the data elements 2514 to the sub-lattice correlithm objects 2506 of lattice correlithm object 2510.

In a particular embodiment, lattice correlithm object 2510 may be used to represent data elements A, B, and C in a non-linear and/or multi-directional relationship. For example, the degree of relationships among three people may be captured using a lattice correlithm object 2510. In particular, a Person A may be represented by sub-lattice correlithm object 2506*a*; Person B may be represented by sub-lattice correlithm object 2506*b*; and Person C may be represented by sub-lattice correlithm object 2506*c*. The degree to which Person A knows Person B may be represented by the distance in n-dimensional space 102 between sub-lattice correlithm objects 2506a and 2506b. The degree to which Person A knows Person C may be represented by the distance in n-dimensional space 102 between sub-lattice correlithm objects 2506a and 2506c. Finally, the degree to which Person B knows Person C may be represented by the distance in n-dimensional space 102 between sub-lattice correlithm objects 2506b and 2506c.

If Persons A, B, and C all know each other equally well, then sub-lattice correlithm objects 2506a, 2506b, and 2506c will be equidistant from each other in n-dimensional space 102, as illustrated in FIG. 27B. If Person A knows Persons B and C equally well but Person B knows Person C less well, then sub-lattice correlithm objects 2506a will be equidistant to sub-lattice correlithm objects 2506b and 2506c in n-dimensional space 102, but sub-lattice correlithm object 2506b will be further away from sub-lattice correlithm object 2506c, as illustrated in FIG. 27B or 27C. The relationship between a Person A and six other people that Person A knows equally well may be represented by the hexagonal lattice correlithm object 2512 illustrated in FIG. 27D. If two people, such as Persons B and C, don't know each other, then sub-lattice correlithm objects 2506b and 2506c may be a standard distance apart from each other in n-dimensional space 102.

Moreover, multiple data models may be used to represent asymmetric degrees of relationships among people from the perspective of specific people within that group. For example, two people can know each other to different degrees such that a Person A may feel as though he knows Person B better than Person B feels they know Person A. The same may be true for the relationships between Persons A and C and/or Persons B and C. The asymmetric relationships between the same Persons A, B, and C can be modeled well using correlithm objects by creating one lattice correlithm object 2510 that models relationships with Persons B and C from Person A's perspective, another lattice correlithm object 2510 that models relationships with Persons A and C from Person B's perspective, and another lattice correlithm object 2510 that models relationships with Persons A and B from Person C's perspective.

Although these embodiments were described with respect to the relationships between people, it should be understood that a triangle lattice correlithm object 2510 and/or a hexagonal lattice correlithm object 2512 may be used to represent many different types of relationships between many different types of data elements.

Figure 28:
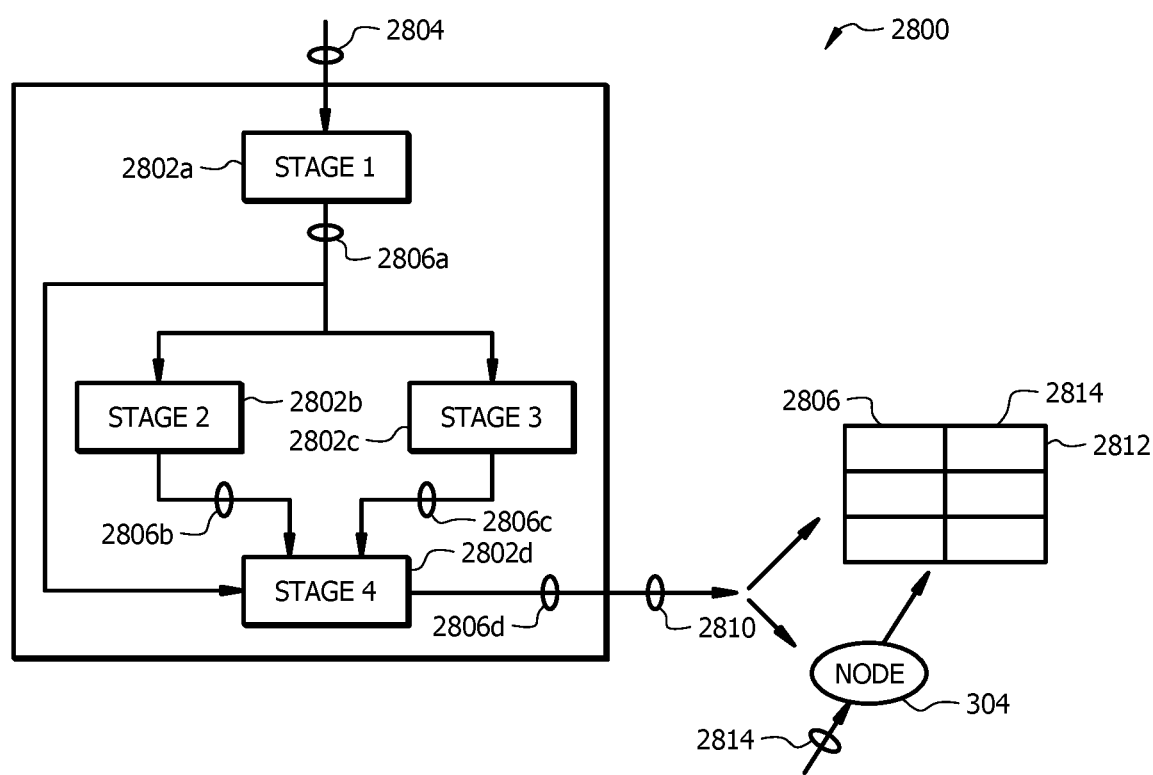
FIG. 28 illustrates one embodiment of a quadrilateral lattice correlithm object generator.

FIG. 28 illustrates one embodiment of a quadrilateral lattice correlithm object generator 2800 configured to generate a quadrilateral lattice correlithm object 2810 as output. Quadrilateral lattice correlithm object generator 2800 and its constituent components is implemented by lattice correlithm object engine 524, and any other suitable elements of computer architecture 500, described above with respect to FIG. 5. Quadrilateral lattice correlithm object generator 2800 comprises a first processing stage 2802a, a second processing stage 2802b, a third processing stage 2802c, and a fourth processing stage 2802d communicatively coupled to each other. First processing stage 2802a receives an input 2804 and outputs a first sub-lattice correlithm object 2806a that comprises an n-bit digital word wherein each bit has either a value of zero or one. In one embodiment, first processing stage 2802a generates the values of each bit randomly. Input 2804 comprises one or more parameters used to determine the characteristics of the lattice correlithm object 2810. For example, input 2804 may include a parameter for the number of dimensions, n, in the n-dimensional space 102 (e.g., 64, 128, 256, etc.) in which to generate the lattice correlithm object 2810. Input 2804 may also include a distance parameter, δ, that indicates a particular number of bits of the n-bit digital word (e.g., 4, 8, 16, etc.) that will be changed from one sub-lattice correlithm object 2806 to the next in the lattice correlithm object 2810. Although FIG. 28 illustrates only first processing stage 2802a receiving input 2804, it should be understood that second processing stage 2802b, third processing stage 2802c, and fourth processing stage 2802d may also receive input 2804 (or at least the information contained within input 2804).

In the examples described below, assume that n=64 such that each sub-lattice correlithm object 2806 of the lattice correlithm object 2810 is a 64-bit digital word. As discussed previously with regard to FIG. 9, the standard deviation is equal to $$\sqrt{\frac{n}{4}},$$

or four bits, for a 64-dimensional space 102. In one embodiment, the distance parameter, δ, is selected to equal the standard deviation. In this embodiment, the distance parameter is also four bits (e.g., one standard deviation). Although in the examples described below, the selected distance parameter is four bits, other distance parameters may be used in input 2804 depending on the particular structure and arrangement desired for quadrilateral lattice correlithm object 2810. In general, the fewer the number of bits that are changed between sub-lattice correlithm objects 2806, the tighter the correlation between those sub-lattice correlithm objects 2806; and the greater the number of bits that are changed between sub-lattice correlithm objects 2806, the looser the correlation between those sub-lattice correlithm objects 2806. Moreover, it is not necessary that each processing stage 2802 of quadrilateral correlithm object generator 2800 strictly change the exact number of bits identified by the distance parameter from one sub-lattice correlithm object 2806 to the next. Instead, the present disclosure contemplates some variance from the number of bits indicated by the distance parameter (e.g., a fewer or a greater number of bits being changed).

Second processing stage 2802b receives the first sub-lattice correlithm object 2806a and, for a plurality of bits of the first sub-lattice correlithm object 2806a up to the particular number of bits identified in the distance parameter, δ, changes the value from a zero to a one or from a one to a zero to generate a second sub-lattice correlithm object 2806b. In this example, four bit values are changed from the first sub-lattice correlithm object 2806a to generate the second sub-lattice correlithm object 2806b. The bits of the first sub-lattice correlithm object 2806a that are changed in value to generate the second sub-lattice correlithm object 2806b may be selected randomly from the n-bit digital word. The other bits of the n-bit digital word in second sub-lattice correlithm object 2806b remain the same values as the corresponding bits of the first sub-lattice correlithm object 2806a. By changing four bit values, the core of the first sub-lattice correlithm object 2806a overlaps in n-dimensional space 102 with the core of the second sub-lattice correlithm object 2806b.

Third processing stage 2802c receives the first sub-lattice correlithm object 2806a and, for a plurality of bits of the first sub-lattice correlithm object 2806a up to the particular number of bits identified in the distance parameter, δ, changes the value from a zero to a one or from a one to a zero to generate a third sub-lattice correlithm object 2806c. In this example, four bit values are changed from the first sub-lattice correlithm object 2806a to generate the third sub-lattice correlithm object 2806c. The bits of the first sub-lattice correlithm object 2806a that are changed in value to generate the third sub-lattice correlithm object 2806c may be selected randomly from the n-bit digital word. However, the bits of the first sub-lattice correlithm object 2806a that are changed in value by the third processing stage 2802c are different from the bits of the first sub-lattice correlithm object 2806a that are changed in value by the second processing stage 2802b. The other bits of the n-bit digital word in third sub-lattice correlithm object 2806c remain the same values as the corresponding bits of the first sub-lattice correlithm object 2806a. By changing four bit values, the core of the first sub-lattice correlithm object 2806a overlaps in n-dimensional space 102 with the core of the third sub-lattice correlithm object 2806c.

Fourth processing stage 2502d receives the second sub-lattice correlithm object 2506b and the third sub-lattice correlithm object 2506c, and modifies certain bits of the second sub-lattice correlithm object 2506b and the third sub-lattice correlithm object 2506c to generate a fourth sub-lattice correlithm object 2506d, as described below with respect to different embodiments.

General Quadrilateral Lattice Correlithm Object

In one embodiment, the fourth processing stage 2802d may receive the first sub-lattice correlithm object 2806a, the second sub-lattice correlithm object 2806b, and the third sub-lattice correlithm object 2806c. The fourth processing stage 2802d outputs a fourth correlithm object 2806d where each bit of the fourth sub-lattice correlithm object 2806d has a value that is based on the value of a corresponding bit of the first sub-lattice correlithm object 2806a that was not changed in the second sub-lattice correlithm object 2806b by the second processing stage 2802b and that was not changed in the third sub-lattice correlithm object 2806c by the third processing stage 2802c. The values of the bits of the first sub-lattice correlithm object 2806a that were changed in the second sub-lattice correlithm object 2806b and in the third sub-lattice correlithm object 2806c are further modified as follows. For each bit of the second sub-lattice correlithm object 2806b that was changed from the first sub-lattice correlithm object 2806a, the fourth processing stage 2802d changes from a zero to a one or from a one to a zero a portion of those bits and keeps the value the same as in the second sub-lattice correlithm object 2806b for a remaining portion of those bits. Thus, for example, if four bits were changed from the first sub-lattice correlithm object 2806a to the second sub-lattice correlithm object 2806b, then some or all of those four bits may be further changed when creating the fourth sub-lattice correlithm object 2806d. For each bit of the third sub-lattice correlithm object 2806c that was changed from the first sub-lattice correlithm object 2806a, the fourth processing stage 2802d changes the value from a zero to a one or from a one to a zero for a portion of those bits and keeps the value the same as in the third sub-lattice correlithm object 2806c for a remaining portion of those bits. Thus, for example, if four bits were changed from the first sub-lattice correlithm object 2806a to the third sub-lattice correlithm object 2806b, then some or all of those four bits may be further changed when creating the fourth sub-lattice correlithm object 2806d.

Figure 29A:
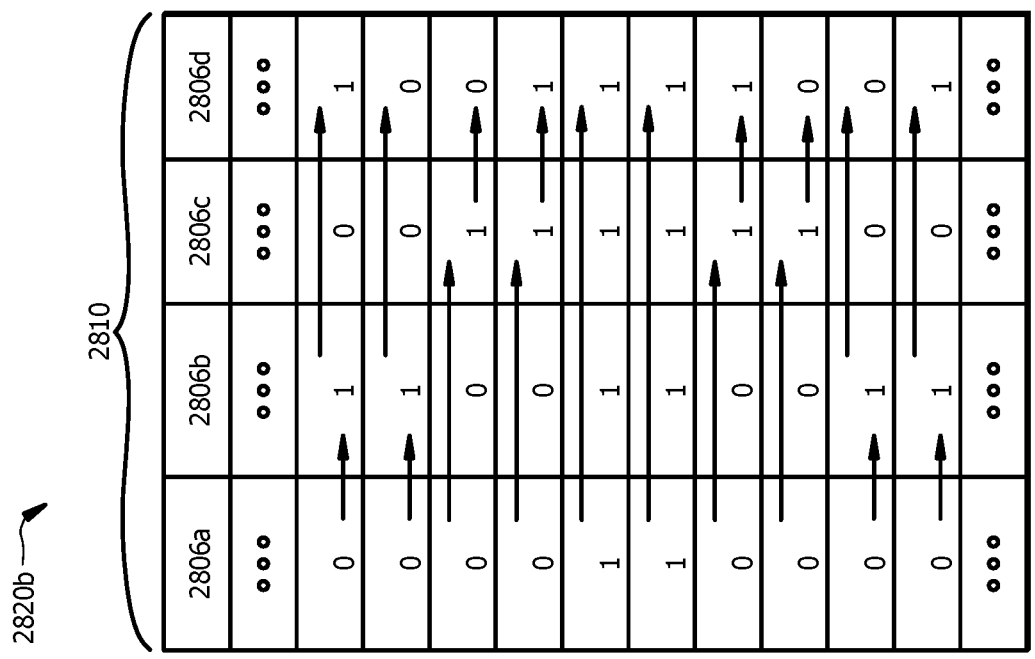
FIGS. 29A-B illustrate embodiments of bit value tables.

FIG. 29A illustrates a table 2820a that demonstrates the changes in bit values from one sub-lattice correlithm object 2806 to another sub-lattice correlithm object 2806. For example, the first column of table 2820a illustrates at least a portion of the bit values of the n-dimensional first sub-lattice correlithm object 2806a generated by first processing stage 2802a. The second column of table 2820a illustrates at least a portion of the bit values of the n-dimensional second sub-lattice correlithm object 2806b generated by second processing stage 2802b, with four randomly selected bits with values changed from a zero to a one, or from a one to a zero. The third column of table 2820a illustrates at least a portion of the bit values of the n-dimensional third sub-lattice correlithm object 2806c generated by third processing stage 2802c, with another four randomly selected bits with values changed from a zero to a one, or from a one to a zero. The bits of the first sub-lattice correlithm object 2806a that are changed in value to generate the third sub-lattice correlithm object 2806c may be selected randomly from the n-bit digital word. However, the bits of the first sub-lattice correlithm object 2806a that are changed in value to generate the third sub-lattice correlithm object 2802c are different from the bits of the first sub-lattice correlithm object 2806a that are changed in value to generate the second sub-lattice correlithm object 2806b.

The fourth column of table 2820a illustrates at least a portion of the bit values of the n-dimensional fourth sub-lattice correlithm object 2806d generated by fourth processing stage 2802d. For each bit of the second sub-lattice correlithm object 2806b that was changed from the first sub-lattice correlithm object 2806a, some of those bit values are changed from a zero to a one or from a one to a zero, and some of those bit values are kept the same as in the second sub-lattice correlithm object 2806b. For example, in table 2820b, four bits were changed from the first sub-lattice correlithm object 2806a to the second sub-lattice correlithm object 2806b, and of those four bits, one bit value is changed, and the other three bit values are kept the same as in the second sub-lattice correlithm object 2806b. For each bit of the third sub-lattice correlithm object 2806c that was changed from the first sub-lattice correlithm object 2806a, some of those bit values are changed from a zero to a one or from a one to a zero, and some of those bit values are kept the same as in the third sub-lattice correlithm object 2806c. For example, in table 2820b, four bits were changed from the first sub-lattice correlithm object 2806a to the third sub-lattice correlithm object 2806c, and of those four bits, three bit values are changed, and the other bit value is kept the same as in the third sub-lattice correlithm object 2806c.

Figure 30A:
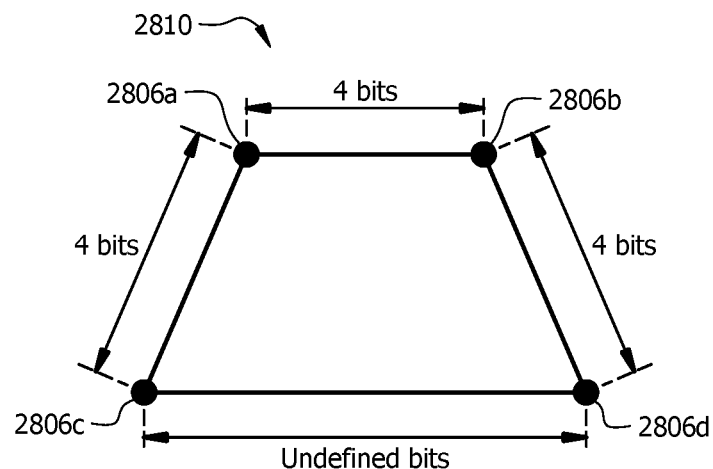
FIGS. 30A-B illustrate embodiments of lattice correlithm objects.

FIG. 30A illustrates one embodiment of a lattice correlithm object 2810 with a quadrilateral geometric shape and formed by first sub-lattice correlithm object 2806a, second sub-lattice correlithm object 2806b that is four bits away from first sub-lattice correlithm object 2806a in n-dimensional space 102, third sub-lattice correlithm object 2806c that is four bits away from first sub-lattice correlithm object 2806a in n-dimensional space 102, and fourth sub-lattice correlithm object 2806d. Fourth sub-lattice correlithm object 2806d may be an undefined number of bits away from second sub-lattice correlithm object 2806b and from third sub-lattice correlithm object 2806c. This is because the particular number and combination of bits that are changed by fourth processing stage 2802d when creating fourth sub-lattice correlithm object 2806d from first sub-lattice correlithm object 2806a, second sub-lattice correlithm object 2806b, and third sub-lattice correlithm object 2806c can vary.

Square Lattice Correlithm Object

In another embodiment, the fourth processing stage 2802d may receive the first sub-lattice correlithm object 2806a, the second sub-lattice correlithm object 2806b, and the third sub-lattice correlithm object 2806c. The fourth processing stage 2802d outputs a fourth correlithm object 2806d where each bit of the fourth sub-lattice correlithm object 2806d has a value that is based on the value of a corresponding bit of the first sub-lattice correlithm object 2806a that was not changed in the second sub-lattice correlithm object 2806b by the second processing stage 2802b and that was not changed in the third sub-lattice correlithm object 2806c by the third processing stage 2802c. The values of the bits of the first sub-lattice correlithm object 2806a that were changed in the second sub-lattice correlithm object 2806b and in the third sub-lattice correlithm object 2806c are further modified as follows. For each bit of the second sub-lattice correlithm object 2806b that was changed from the first sub-lattice correlithm object 2806a, the fourth processing stage 2802d changes from a zero to a one or from a one to a zero half of those bits and keeps the value the same as in the second sub-lattice correlithm object 2806b for the other half of those bits. Thus, for example, if four bits were changed from the first sub-lattice correlithm object 2806a to the second sub-lattice correlithm object 2806b, then two of those four bits are further changed when creating the fourth sub-lattice correlithm object 2806d, and the other two of those four bits remain the same value. For each bit of the third sub-lattice correlithm object 2806c that was changed from the first sub-lattice correlithm object 2806a, the fourth processing stage 2802d changes the value from a zero to a one or from a one to a zero for half of those bits and keeps the value the same as in the third sub-lattice correlithm object 2806c for the other half of those bits. Thus, for example, if four bits were changed from the first sub-lattice correlithm object 2806a to the third sub-lattice correlithm object 2806b, then two of those four bits are further changed when creating the fourth sub-lattice correlithm object 2806d, and the other two of those four bits remain the same value.

Figure 29B:
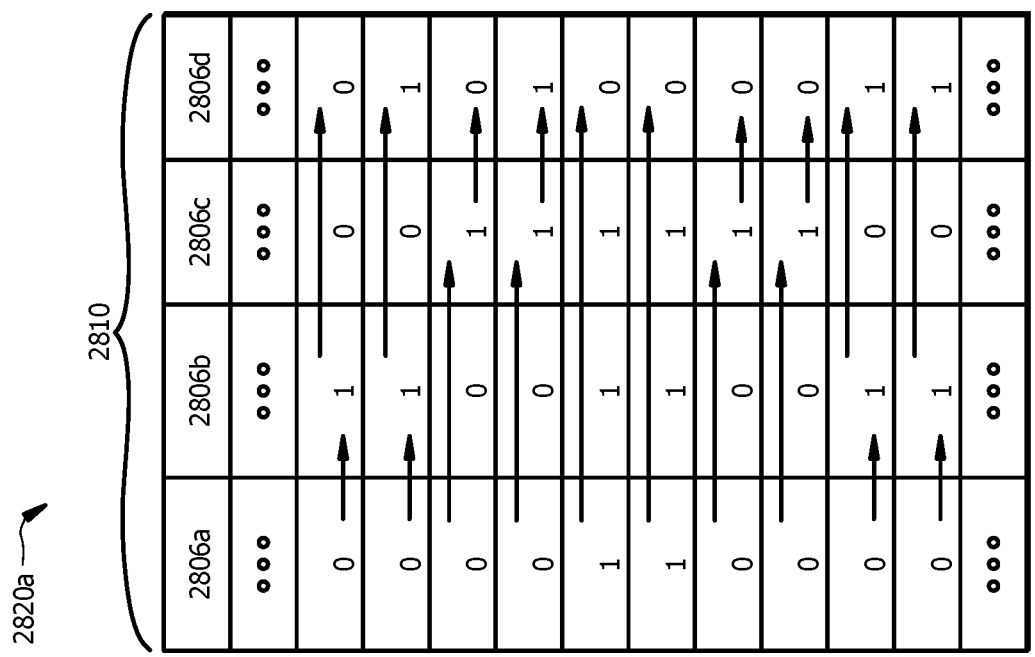

FIG. 29B illustrates a table 2820b that demonstrates the changes in bit values from one sub-lattice correlithm object 2806 to another sub-lattice correlithm object 2806. For example, the first column of table 2820a illustrates at least a portion of the bit values of the n-dimensional first sub-lattice correlithm object 2806a generated by first processing stage 2802a. The second column of table 2820a illustrates at least a portion of the bit values of the n-dimensional second sub-lattice correlithm object 2806b generated by second processing stage 2802b, with four randomly selected bits with values changed from a zero to a one, or from a one to a zero. The third column of table 2820a illustrates at least a portion of the bit values of the n-dimensional third sub-lattice correlithm object 2806c generated by third processing stage 2802c, with another four randomly selected bits with values changed from a zero to a one, or from a one to a zero. The bits of the first sub-lattice correlithm object 2806a that are changed in value to generate the third sub-lattice correlithm object 2806c may be selected randomly from the n-bit digital word. However, the bits of the first sub-lattice correlithm object 2806a that are changed in value to generate the third sub-lattice correlithm object 2802c are different from the bits of the first sub-lattice correlithm object 2806a that are changed in value to generate the second sub-lattice correlithm object 2806b.

The fourth column of table 2820b illustrates at least a portion of the bit values of the n-dimensional fourth sub-lattice correlithm object 2806d generated by fourth processing stage 2802d. For each bit of the second sub-lattice correlithm object 2806b that was changed from the first sub-lattice correlithm object 2806a, half of those bit values are changed from a zero to a one or from a one to a zero, and the other half of those bit values are kept the same as in the second sub-lattice correlithm object 2806b. For example, in table 2820b, four bits were changed from the first sub-lattice correlithm object 2806a to the second sub-lattice correlithm object 2806b, and of those four bits, two bit values are changed, and the other two bit values are kept the same as in the second sub-lattice correlithm object 2806b. For each bit of the third sub-lattice correlithm object 2806c that was changed from the first sub-lattice correlithm object 2806a, half of those bit values are changed from a zero to a one or from a one to a zero, and half of those bit values are kept the same as in the third sub-lattice correlithm object 2806c. For example, in table 2820b, four bits were changed from the first sub-lattice correlithm object 2806a to the third sub-lattice correlithm object 2806c, and of those four bits, two bit values are changed, and the other two bit values are kept the same as in the third sub-lattice correlithm object 2806c.

Figure 30B:
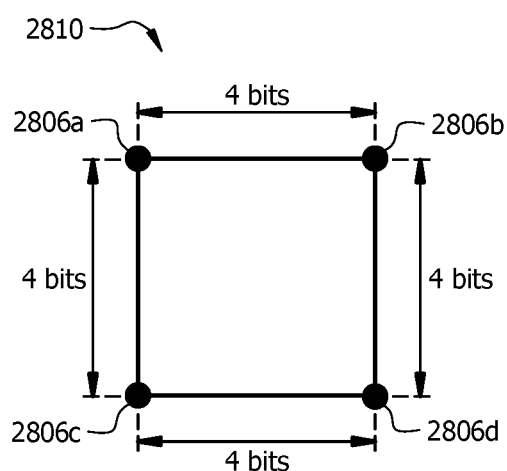

FIG. 30B illustrates one embodiment of a lattice correlithm object 2810 with a square geometric shape and formed by first sub-lattice correlithm object 2806a that is four bits away from each of second sub-lattice correlithm object 2806b and third sub-lattice correlithm object 2806c in n-dimensional space 102, and fourth sub-lattice correlithm object 2806d that is four bits away from each of second sub-lattice correlithm object 2806b and third sub-lattice correlithm object 2806c in n-dimensional space 102. This is because the particular bits that are changed by fourth processing stage 2802d when creating fourth sub-lattice correlithm object 2806d from second sub-lattice correlithm object 2506b and third sub-lattice correlithm object 2506c are specifically determined as described above.

FIG. 28 further illustrates a node 304 and a node table 2812 stored in memory 504. Node 304 receives the lattice correlithm object 2810, including each of the sub-lattice correlithm objects 2806, and further receives data elements 2814 in the form of real-world data elements or data represented by correlithm objects 104. Node table 2812 associates the data elements 2814 to the sub-lattice correlithm objects 2806 of lattice correlithm object 2810.

In a particular embodiment, lattice correlithm object 2810 may be used to represent data elements A, B, C, and D in a non-linear and/or multi-directional relationship. For example, the degree of relationships among four people may be captured using a lattice correlithm object 2810. In particular, a Person A may be represented by sub-lattice correlithm object 2806a; Person B may be represented by sub-lattice correlithm object 2806b; Person C may be represented by sub-lattice correlithm object 2806c, and Person D may be represented by sub-lattice correlithm object 2806d. The degree to which Person A knows Person B may be represented by the distance in n-dimensional space 102 between sub-lattice correlithm objects 2806a and 2806b. The degree to which Person A knows Person C may be represented by the distance in n-dimensional space 102 between sub-lattice correlithm objects 2806a and 2806c. The degree to which Person D knows Person B may be represented by the distance in n-dimensional space 102 between sub-lattice correlithm objects 2806d and 2806b. The degree to which Person D knows Person C may be represented by the distance in n-dimensional space 102 between sub-lattice correlithm objects 2806d and 2806c. If two people, such as Persons A and B, don't know each other, then sub-lattice correlithm objects 2806b and 2806c may be a standard distance apart from each other in n-dimensional space 102. The relative degree of relationships between Persons A, B, C, and D can be captured using a quadrilateral correlithm object 2810, as illustrated in FIGS. 30A and/or 30B.

Moreover, multiple data models may be used to represent asymmetric degrees of relationships among people from the perspective of specific people within that group. For example, two people can know each other to different degrees such that a Person A may feel as though he knows Person B better than Person B feels they know Person A. The same may be true for other relationships between and among Persons A, B, C, and D. The asymmetric relationships between the same Persons A, B, C, and D can be modeled well using correlithm objects by creating one lattice correlithm object 2810 that models relationships with Persons B, C, and D from Person A's perspective, another lattice correlithm object 2810 that models relationships with Persons A, C, and D from Person B's perspective, another lattice correlithm object 2810 that models relationships with Persons A, B, and D from Person C's perspective, and another lattice correlithm object 2810 that models relationships with Persons A, B, and C from Person D's perspective.

Although these embodiments were described with respect to the relationships among people, it should be understood that a quadrilateral lattice correlithm object 2810 may be used to represent many different types of relationships between many different types of data elements.

Figure 31B:
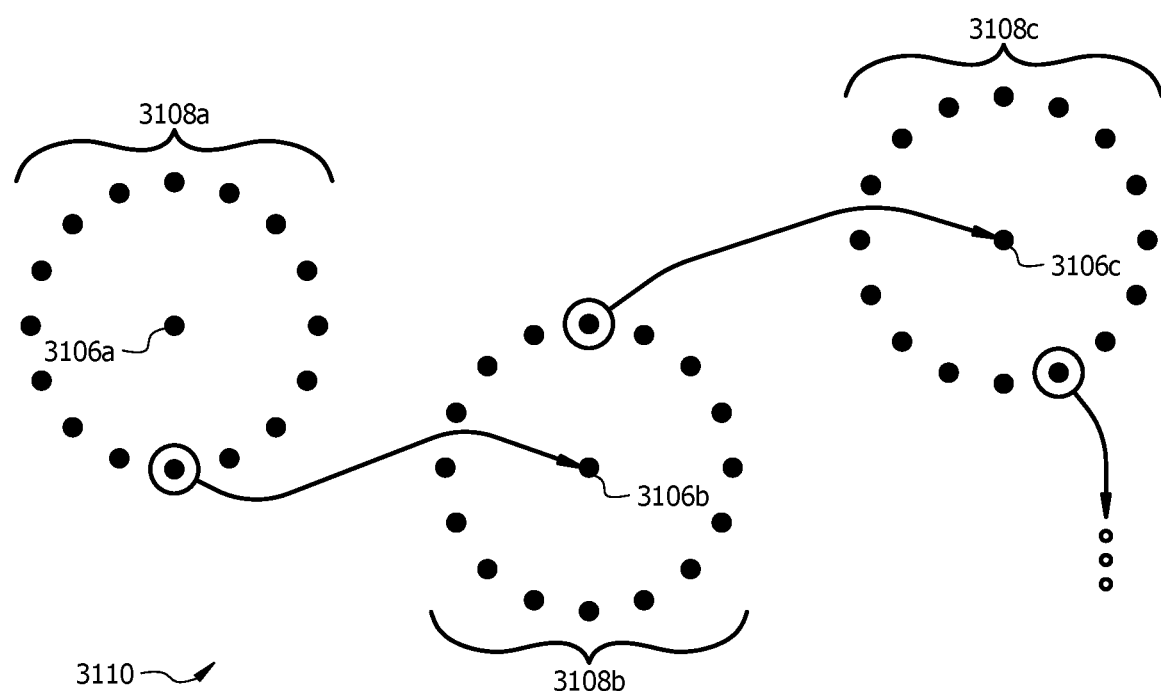
FIG. 31B illustrates one embodiment of an irregular lattice correlithm object.

FIG. 31 illustrates one embodiment of an irregular lattice correlithm object generator 3100 configured to generate an irregular lattice correlithm object 3110 as output. Irregular lattice correlithm object generator 3100 and its constituent components is implemented by lattice correlithm object engine 524, and any other suitable elements of computer architecture 500, described above with respect to FIG. 5. Irregular lattice correlithm object generator 3100 comprises a first processing stage 3102a, a second processing stage 3102b, a third processing stage 3102c, and a fourth processing stage 3102d communicatively coupled to each other. First processing stage 3102a receives an input 3104 and outputs a first sub-lattice correlithm object 3106a that comprises an n-bit digital word wherein each bit has either a value of zero or one. In one embodiment, first processing stage 3102a generates the values of each bit randomly. Input 3104 comprises one or more parameters used to determine the characteristics of the lattice correlithm object 3110. For example, input 3104 may include a parameter for the number of dimensions, n, in the n-dimensional space 102 (e.g., 64, 128, 256, etc.) in which to generate the lattice correlithm object 3110. Input 3104 may also include a distance parameter, δ, at indicates a particular number of bits of the n-bit digital word (e.g., 4, 8, 16, etc.) that will be changed from one sub-lattice correlithm object 3106 to the next in the lattice correlithm object 3110. Although FIG. 31 illustrates only first processing stage 3102a receiving input 3104, it should be understood that second processing stage 3102b, third processing stage 3102c, and fourth processing stage 3102d may also receive input 2504 (or at least the information contained within input 2504).

In the examples described below, assume that n=64 such that each sub-lattice correlithm object 3106 of the lattice correlithm object 3110 is a 64-bit digital word. As discussed previously with regard to FIG. 9, the standard deviation is equal to $$\sqrt{\frac{n}{4}},$$

or four bits, for a 64-dimensional space 102. In one embodiment, the distance parameter, δ, is selected to equal the standard deviation. In this embodiment, the distance parameter is also four bits (e.g., one standard deviation). Although in the examples described below, the selected distance parameter is four bits, other distance parameters may be used in input 3104 depending on the particular structure and arrangement desired for irregular lattice correlithm object 3110. In general, the fewer the number of bits that are changed between sub-lattice correlithm objects 3106, the tighter the correlation between those sub-lattice correlithm objects 3106; and the greater the number of bits that are changed between sub-lattice correlithm objects 3106, the looser the correlation between those sub-lattice correlithm objects 3106. Moreover, it is not necessary that each processing stage 3102 of irregular correlithm object generator 3100 strictly change the exact number of bits identified by the distance parameter from one sub-lattice correlithm object 3106 to the next. Instead, the present disclosure contemplates some variance from the number of bits indicated by the distance parameter (e.g., a fewer or a greater number of bits being changed).

Second processing stage 3102b receives the first sub-lattice correlithm object 3106a and generates a plurality of first cluster sub-lattice correlithm objects 3108a. FIG. 32 illustrates one embodiment of an irregular lattice correlithm object 3110 that comprises first sub-lattice correlithm object 3106a with a plurality of first cluster sub-lattice correlithm objects 3108a surrounding it in an n-dimensional sphere. Referring back to FIG. 31, each of the first cluster sub-lattice correlithm objects 3108a comprises an n-bit digital word, wherein each bit of each of the first cluster sub-lattice correlithm objects 3108a has a value that is based on a value of a corresponding bit of the first sub-lattice correlithm object 3106a and changed values for a particular number of bits identified by the distance parameter, δ. For example, for a plurality of bits of the first sub-lattice correlithm object 3106a up to the particular number of bits identified in the distance parameter, δ, the second processing stage 3102b changes the value from a zero to a one or from a one to a zero to generate each of the first cluster sub-lattice correlithm objects 3108a. In this example, four bit values are changed from the first sub-lattice correlithm object 3106a to generate each of the first cluster sub-lattice correlithm objects 3108a. The bits of the first sub-lattice correlithm object 3106a that are changed in value to generate each of the first cluster sub-lattice correlithm objects 3108a may be different and selected randomly from the n-bit digital word. The other bits of the n-bit digital word in each of the first cluster sub-lattice correlithm objects 3108a remain the same values as the corresponding bits of the first sub-lattice correlithm object 3106a. By changing four bit values, the core of first sub-lattice correlithm object 3106a overlaps in n-dimensional space with the core of each first cluster sub-lattice correlithm object 3108a.

Third processing stage 3102c receives one of the first cluster sub-lattice correlithm objects 3108a as a second sub-lattice correlithm object 3106b. The particular first cluster sub-lattice correlithm object 3108a received by third processing stage 3102c may be determined randomly by one or more components of irregular correlithm object generator 3100. Third processing stage 3102 uses the second sub-lattice correlithm object 3106b to generate a plurality of second cluster sub-lattice correlithm objects 3108b. FIG. 32 illustrates that one of the first cluster sub-lattice correlithm objects 3108a is selected (e.g., randomly) to be second sub-lattice correlithm object 3106b. Furthermore, FIG. 32 illustrates that irregular lattice correlithm object 3110 comprises second sub-lattice correlithm object 3106b with a plurality of second cluster sub-lattice correlithm objects 3108b surrounding it in an n-dimensional sphere. Referring back to FIG. 31, each of the second cluster sub-lattice correlithm objects 3108b comprises an n-bit digital word, wherein each bit of each of the second cluster sub-lattice correlithm objects 3108b has a value that is based on a value of a corresponding bit of the second sub-lattice correlithm object 3106b and changed values for a particular number of bits identified by the distance parameter, δ. For example, for a plurality of bits of the second sub-lattice correlithm object 3106b up to the particular number of bits identified in the distance parameter, δ, the third processing stage 3102c changes the value from a zero to a one or from a one to a zero to generate each of the second cluster sub-lattice correlithm objects 3108b. In this example, four bit values are changed from the second sub-lattice correlithm object 3106b to generate each of the second cluster sub-lattice correlithm objects 3108b. The bits of the second sub-lattice correlithm object 3106b that are changed in value to generate each of the second cluster sub-lattice correlithm objects 3108b may be different and selected randomly from the n-bit digital word. The other bits of the n-bit digital word in each of the second cluster sub-lattice correlithm objects 3108b remain the same values as the corresponding bits of the second sub-lattice correlithm object 3106b. By changing four bit values, the core of second sub-lattice correlithm object 3106b overlaps in n-dimensional space with the core of each second cluster sub-lattice correlithm object 3108b.

Fourth processing stage 3102d receives one of the second cluster sub-lattice correlithm objects 3108b as a third sub-lattice correlithm object 3106c. The particular second cluster sub-lattice correlithm object 3108b received by fourth processing stage 3102d may be determined randomly by one or more components of irregular correlithm object generator 3100. Fourth processing stage 3102 uses the third sub-lattice correlithm object 3106c to generate a plurality of third cluster sub-lattice correlithm objects 3108c. FIG. 32 illustrates that one of the second cluster sub-lattice correlithm objects 3108b is selected (e.g., randomly) to be third sub-lattice correlithm object 3106c. Furthermore, FIG. 32 illustrates that irregular lattice correlithm object 3110 comprises third sub-lattice correlithm object 3106c with a plurality of third cluster sub-lattice correlithm objects 3108c surrounding it in an n-dimensional sphere. Referring back to FIG. 31, each of the third cluster sub-lattice correlithm objects 3108c comprises an n-bit digital word, wherein each bit of each of the third cluster sub-lattice correlithm objects 3108c has a value that is based on a value of a corresponding bit of the third sub-lattice correlithm object 3106c and changed values for a particular number of bits identified by the distance parameter, δ. For example, for a plurality of bits of the third sub-lattice correlithm object 3106c up to the particular number of bits identified in the distance parameter, δ, the fourth processing stage 3102d changes the value from a zero to a one or from a one to a zero to generate each of the third cluster sub-lattice correlithm objects 3108c. In this example, four bit values are changed from the third sub-lattice correlithm object 3106c to generate each of the third cluster sub-lattice correlithm objects 3108c. The bits of the third sub-lattice correlithm object 3106c that are changed in value to generate each of the third cluster sub-lattice correlithm objects 3108c may be different and selected randomly from the n-bit digital word. The other bits of the n-bit digital word in each of the third cluster sub-lattice correlithm objects 3108c remain the same values as the corresponding bits of the third sub-lattice correlithm object 3106c. By changing four bit values, the core of third sub-lattice correlithm object 3106c overlaps in n-dimensional space with the core of each third cluster sub-lattice correlithm object 3108c.

Irregular lattice correlithm object generator 3100 may include any suitable number of additional processing stages 3102 to generate additional sub-lattice correlithm objects 3106, each with a plurality of cluster correlithm objects 3108 surrounding it in an n-dimensional sphere.

FIG. 31 further illustrates a node 304 and node table 3112 stored in memory 504. Node 304 receives the first sub-lattice correlithm object 3106a and first cluster correlithm objects 3108a, second sub-lattice correlithm object 3106b and second cluster correlithm objects 3108b, third sub-lattice correlithm object 3106c and third cluster correlithm objects 3108c, and so on. Node 304 further receives data elements 3114 in the form of real-world data or data represented by other correlithm objects 104 that are mapped to one or more sub-lattice correlithm objects 3106a-c and/or cluster correlithm objects 3108a-c in node table 3112.

In a particular embodiment, irregular lattice correlithm object 3110 may be used to represent multiple data elements that are clustered around a central data element in an n-dimensional sphere. Irregular lattice correlithm object 3110 may further be used to represent multiple n-dimensional spheres that are related to each other. For example, Person A may be represented by a sub-lattice correlithm object 3106a. Person A's friends may be represented by a plurality of cluster correlithm objects 3108a that surround sub-lattice correlithm object 3106a in an n-dimensional sphere. One of Person A's friends, Person B, may then be represented by a sub-lattice correlithm object 3106b and Person B's friends may be represented by a plurality of cluster correlithm objects 3108b. Similarly, one of Person B's friends, Person C, may then be represented by a sub-lattice correlithm object 3106c and Person C's friends may be represented by a plurality of cluster correlithm objects 3108c, and so on. In this way, the relationships of a large group of people may be captured using irregular lattice correlithm objects 3110. Although this embodiment was described with respect to the relationships among people, it should be understood that an irregular lattice correlithm object 3110 may be used to represent many different types of relationships between many different types of data elements.

FIG. 32A illustrates one embodiment of a bidirectional string correlithm object generator 3200 configured to generate a bidirectional string correlithm object 3210 as output. Bidirectional string correlithm object generator 3200 and its constituent components is implemented by string correlithm object engine 522, and any other suitable elements of computer architecture 500, described above with respect to FIG. 5. Bidirectional string correlithm object generator 3200 comprises a first processing stage 3202a communicatively and logically coupled to a second processing stage 3202b and a third processing stage 3202c. First processing stage 3202a receives an input 3204 and outputs a first sub-string correlithm object 3206a that comprises an n-bit digital word wherein each bit has either a value of zero or one. In one embodiment, first processing stage 3202a generates the values of each bit randomly. First sub-string correlithm object 3206a may also be referred to as a central sub-string correlithm object 3206a. Input 3204 comprises one or more parameters used to determine the characteristics of the bidirectional string correlithm object 3210. For example, input 3204 may include a parameter for the number of dimensions, n, in the n-dimensional space 102 (e.g., 64, 128, 256, etc.) in which to generate the bidirectional string correlithm object 3210. Input 3204 may also include a distance parameter, δ, that indicates a particular number of bits of the n-bit digital word (e.g., 4, 8, 16, etc.) that will be changed from one sub-string correlithm object 3206 to the next in the bidirectional string correlithm object 3210. Although FIG. 32A illustrates only first processing stage 3202a receiving input 3204, it should be understood that both second processing stage 3202b and third processing stage 3202c may also receive input 3204 (or at least the information contained within input 3204).

In the examples described below, assume that n=64 such that each sub-string correlithm object 3206 of the string correlithm object 3210 is a 64-bit digital word. As discussed previously with regard to FIG. 9, the standard deviation is equal to $$\sqrt{\frac{n}{4}},$$

or four bits, for a 64-dimensional space 102. In one embodiment, the distance parameter, δ, is selected to equal the standard deviation. In this embodiment, the distance parameter is also four bits (e.g., one standard deviation). Although in the examples described below, the selected distance parameter is four bits, other distance parameters may be used in input 3204 depending on the particular structure and arrangement desired for bidirectional string correlithm object 3210. In general, the fewer the number of bits that are changed between sub-string correlithm objects 3206, the tighter the correlation between those sub-string correlithm objects 3206; and the greater the number of bits that are changed between sub-string correlithm objects 3206, the looser the correlation between those sub-string correlithm objects 3206. Moreover, it is not necessary that each processing stage 3202 of bidirectional correlithm object generator 3200 strictly change the exact number of bits identified by the distance parameter from one sub-string correlithm object 3206 to the next. Instead, the present disclosure contemplates some variance from the number of bits indicated by the distance parameter (e.g., a fewer or a greater number of bits being changed).

Second processing stage 3202b receives the first sub-string correlithm object 3206a and, for each bit of the first sub-string correlithm object 3206a up to the particular number of bits identified in the distance parameter, δ, changes the value from a zero to a one or from a one to a zero to generate a second sub-string correlithm object 3206b. The bits of the first sub-string correlithm object 3206a that are changed in value for the second sub-string correlithm object 3206b are selected randomly from the n-bit digital word. The other bits of the n-bit digital word in second sub-string correlithm object 3206b remain the same values as the corresponding bits of the first sub-string correlithm object 3206a.

Third processing stage 3202c also receives the first sub-string correlithm object 3206a and, for each bit of the first sub-string correlithm object 3206a up to the particular number of bits identified in the distance parameter, δ, changes the value from a zero to a one or from a one to a zero to generate a third sub-string correlithm object 3206c. The bits of the first sub-string correlithm object 3206a that are changed in value for the third sub-string correlithm object 3206c are selected randomly from the n-bit digital word. The other bits of the n-bit digital word in third sub-string correlithm object 3206c remain the same values as the corresponding bits of the first sub-string correlithm object 3206a. Both the second sub-string correlithm object 3206b and the third sub-string correlithm object 3206c extend from the first sub-string correlithm object 3206a, also referred to as the central sub-string correlithm object 3206a, but in different n-dimensional directions. Thus, the resulting string correlithm object 3210 is referred to as a bidirectional string correlithm object 3210.

Figure 32B:
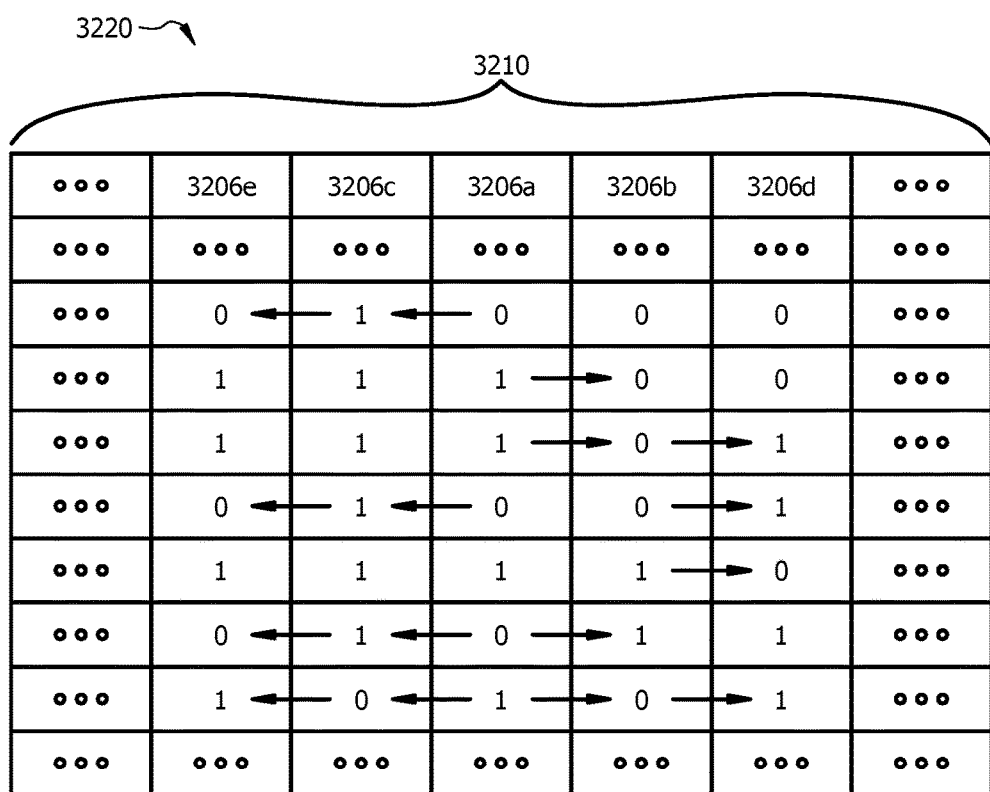
FIG. 32B illustrates one embodiment of a bit value table.

FIG. 32B illustrates a table 3220 that demonstrates the changes in bit values from a first sub-string correlithm object 3206a to a second sub-string correlithm object 3206b in one n-dimensional direction, and from first sub-string correlithm object 3206a to third sub-string correlithm object 3206c in another n-dimensional direction. In this example, assume that n=64 such that each sub-string correlithm object 3206 of the bidirectional string correlithm object 3210 is a 64-bit digital word. As discussed previously with regard to FIG. 9, the standard deviation is equal to $$\sqrt{\frac{n}{4}},$$

or four bits, for a 64-dimensional space 102. In one embodiment, the distance parameter, δ, is selected to equal the standard deviation. In this embodiment, the distance parameter is also four bits which means that four bits will be changed from each sub-string correlithm object 3206 to the next in the bidirectional string correlithm object 3210. In other embodiments where it is desired to create a tighter correlation among sub-string correlithm objects 3206, a distance parameter may be selected to be less than the standard deviation (e.g., distance parameter of three bits or less where standard deviation is four bits). In still other embodiments where it is desired to create a looser correlation among sub-string correlithm objects 3206, a distance parameter may be selected to be more than the standard deviation (e.g., distance parameter of five bits or more where standard deviation is four bits).

Table 3220 illustrates the first sub-string correlithm object 3206a in the middle column having four bit values that are changed, by second processing stage 3202b, from a zero to a one or from a one to a zero to generate second sub-string correlithm object 3206b in one n-dimensional direction. By changing four bit values, the core of the first sub-string correlithm object 3206a overlaps in 64-dimensional space with the core of the second sub-string correlithm object 3206b. Table 3220 also illustrates the first sub-string correlithm object 3206a having four bit values that are changed, by third processing stage 3202c, from a zero to a one or from a one to a zero to generate third sub-string correlithm object 3206c in another n-dimensional direction. By changing four bit values, the core of the first sub-string correlithm object 3206a *overlaps in* 64-dimensional space with the core of the third sub-string correlithm object 3206c.

Referring back to FIG. 32A, the second processing stage 3202b receives from itself the second sub-string correlithm object 3206b as feedback. For each bit of the second sub-string correlithm object 3206b up to the particular number of bits identified by the distance parameter, the second processing stage 3202b changes the value from a zero to a one or from a one to a zero to generate a fourth sub-string correlithm object 3206d. The bits of the second sub-string correlithm object 3206b that are changed in value for the fourth sub-string correlithm object 3206d are selected randomly from the n-bit digital word. The other bits of the n-bit digital word in fourth sub-string correlithm object 3206d remain the same values as the corresponding bits of the second sub-string correlithm object 3206b. Referring to table 3220 illustrated in FIG. 32B, the second sub-string correlithm object 3206b has four bit values that are changed, by second processing stage 3202b, from a zero to a one or from a one to a zero to generate fourth sub-string correlithm object 3206d.

Referring back to FIG. 32A, the third processing stage 3202c receives from itself the third sub-string correlithm object 3206c as feedback. For each bit of the third sub-string correlithm object 3206c up to the particular number of bits identified by the distance parameter, the third processing stage 3202c changes the value from a zero to a one or from a one to a zero to generate a fifth sub-string correlithm object 3206e. The bits of the third sub-string correlithm object 3206c that are changed in value for the fifth sub-string correlithm object 3206e are selected randomly from the n-bit digital word. The other bits of the n-bit digital word in fifth sub-string correlithm object 3206e remain the same values as the corresponding bits of the third sub-string correlithm object 3206c. Referring to table 3220 illustrated in FIG. 32B, the third sub-string correlithm object 3206c has four bit values that are changed, by third processing stage 3202c, from a zero to a one or from a one to a zero to generate fifth sub-string correlithm object 3206e.

Referring back to FIG. 32A, each of the second processing stage 3202b and third processing stage 3202c may successively output a subsequent sub-string correlithm object 3206 by changing bit values of the immediately prior sub-string correlithm object 3206 received as feedback, as described above. This process continues for a predetermined number of sub-string correlithm objects 3206 in the bidirectional string correlithm object 3210. Together, the sub-string correlithm objects 3206 form a bidirectional string correlithm object 3210 in which the first sub-string correlithm object 3206a is in the middle and the adjacent sub-string correlithm objects 3206 extend from first sub-string correlithm object 3206a in different n-dimensional directions. In one embodiment, each sub-string correlithm object 3206 is separated from an adjacent sub-string correlithm object 3206 in n-dimensional space 102 by a number of bits represented by the distance parameter, $\delta$.

Figure 33A:
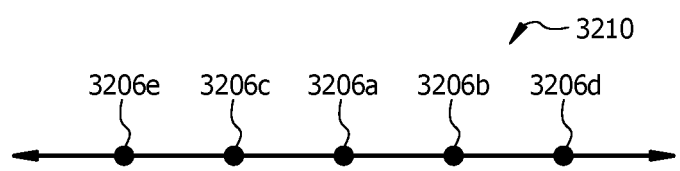
FIG. 33A illustrates one embodiment of a bidirectional string correlithm object.

FIG. 33A illustrates one embodiment of bidirectional string correlithm object 3210 that includes sub-string correlithm objects 3206 that extend in different n-dimensional directions from a central sub-string correlithm object 3206a. In particular, sub-string correlithm objects 3206b and 3206d extend in one n-dimensional direction from central sub-string correlithm object 3206a, and sub-string correlithm objects 3206c and 3206e extend in a different n-dimensional direction from central sub-string correlithm object 3206a. Although FIG. 33A illustrates bidirectional string correlithm object 3210 as a linear geometric shape, it should be understood that bidirectional string correlithm object 3210 need not be linear or even planar in geometry. Instead, pairs of sub-string correlithm objects 3206 of bidirectional string correlithm object 3210 may reside in different planes from each other in n-dimensional space 102. Moreover, the path between groups of sub-string correlithm objects 3206 of bidirectional string correlithm object 3210 may be non-linear in n-dimensional space 102.

FIG. 32A further illustrates a node 304 and a node table 3212 stored in memory 504. Node 304 receives the lattice correlithm object 3210, including each of the sub-lattice correlithm objects 3206, and further receives data elements 3214 in the form of real-world data elements or data represented by correlithm objects 104. Node table 3212 associates the data elements 3214 to the sub-lattice correlithm objects 3206 of lattice correlithm object 3210.

Figure 33B:
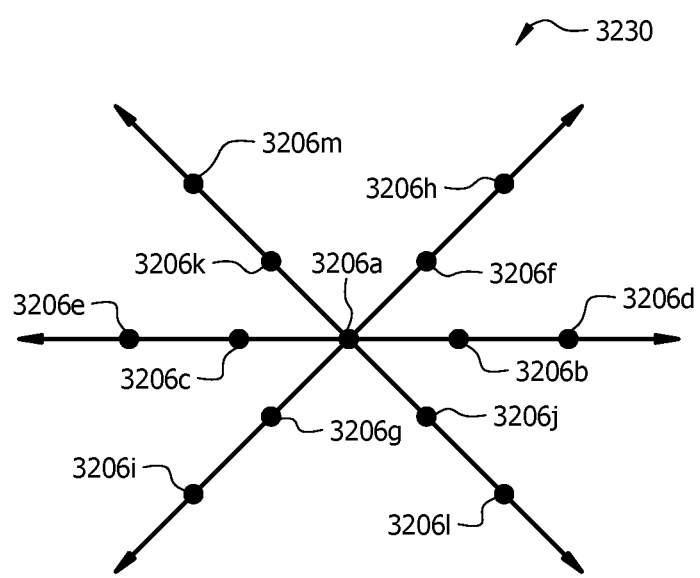
FIG. 33B illustrates one embodiment of intersecting multiple string correlithm objects.

FIG. 33B illustrates a special case of a bidirectional string correlithm object 3210 referred to as a multiple string correlithm object 3230. Similar to a bidirectional string correlithm object 3210, a multiple string correlithm object 3230 also has a central sub-string correlithm object 3206a from which other sub-string correlithm objects 3206 extend in different n-dimensional directions. Thus, in essence, a multiple string correlithm object 3230 includes multiple bidirectional string correlithm objects that extend in different n-dimensional directions from a common central sub-string correlithm object 3206a. Accordingly, a multiple string correlithm object 3230 has multiple string correlithm objects that intersect at the central correlithm object 3206a. In particular, as illustrated in FIG. 33B, multiple string correlithm object 3230 is similar to bidirectional sub-string correlithm object 3210 in that it has sub-string correlithm objects 3206b and 3206d extending in one n-dimensional direction from central sub-string correlithm object 3206a, and other sub-string correlithm objects 3206c and 3206e extending in another n-dimensional direction from central sub-string correlithm object 3206a. In addition, multiple string correlithm object 3230 has any number and combination of additional string correlithm objects that intersect at central sub-string correlithm object 3206a and extend in different n-dimensional directions. In particular, multiple string correlithm object 3230 has another string correlithm object that includes sub-string correlithm objects 3206f and 3206h extending in one n-dimensional direction from central sub-string correlithm object 3206a, and sub-string correlithm objects 3206g and 3206i extending in another n-dimensional direction from central sub-string correlithm object 3206a. Furthermore, multiple string correlithm object 3230 has still another string correlithm object that includes sub-string correlithm objects 3206j and 3206l extending in one n-dimensional direction from central sub-string correlithm object 3206a, and sub-string correlithm objects 3206k and 3206m extending in another n-dimensional direction from central sub-string correlithm object 3206a.

As with bidirectional string correlithm object 3210, it should be understood that multi-directional string correlithm object 3230 need not be linear or even planar in geometry. Instead, pairs of sub-string correlithm objects 3206 of multi-directional string correlithm object 3230 may reside in different planes from each other in n-dimensional space. Similarly, different string correlithm objects of multiple string correlithm object 3230 may reside in different planes from each other in n-dimensional space. Moreover, the path between groups of sub-string correlithm objects 3206 of multi-directional string correlithm object 3210 may be non-linear in n-dimensional space 102.

In one embodiment, bidirectional string correlithm object generator 3200 may be used to generate multiple string correlithm object 3230. In particular, referring back to FIG. 32A, first processing stage 3202a may be used to generate first sub-string correlithm object 3206a; second processing stage 3202b may be used to generate second sub-string correlithm object 3206b and fourth sub-string correlithm object 3206d; and third processing stage 3202c may be used to generate third sub-string correlithm object 3206c and fifth sub-string correlithm object 3206e, all as described above with respect to FIG. 32A. From this point, however, first sub-string correlithm object 3206a may be used to generate another string correlithm object. This is performed by again feeding first sub-string correlithm object 3206a to second processing stage 3202b and third processing stage 3202c which generate sub-string correlithm objects 3206f and 3206g, respectively, using the techniques described above with respect to FIG. 32A. Those sub-string correlithm objects 3206f and 3206g can themselves be fed back to second processing stage 3202b and third processing stage 3202c to generate sub-string correlithm objects 3206h and 3206i, respectively, also using the techniques described above with respect to FIG. 32A. This second bidirectional string correlithm object 3210 intersects with the first bidirectional string correlithm object 3210 at the central sub-string correlithm object 3206a.

Bidirectional string correlithm object generator 3200 may be used to generate any number and combination of additional bidirectional string correlithm objects 3210 that also intersect at central sub-string correlithm object 3206a. For example, first sub-string correlithm object 3206a can again be fed to second processing stage 3202b and third processing stage 3202c which generate sub-string correlithm objects 3206j and 3206k, respectively, using the techniques described above with respect to FIG. 32A. Those sub-string correlithm objects 3206j and 3206k can themselves be fed back to second processing stage 3202b and third processing stage 3202c to generate sub-string correlithm objects 3206l and 3206m, respectively, also using the techniques described above with respect to FIG. 32A. This third bidirectional string correlithm object 3210 intersects with the first and second bidirectional string correlithm objects 3210 at the central sub-string correlithm object 3206a.

In a particular embodiment, bidirectional string correlithm object 3210 may be used to represent data elements A, B, and C having non-linear and/or multi-directional relationships with each other. For example, a Person A may be related to a Person B that is a parent and to a Person C that is a child. Such a multi-directional relationship may be captured by a bidirectional string correlithm object 3210 where Person A is represented by a central sub-string correlithm object 3206a, Person B may be represented by sub-string correlithm object 3206b, and Person C may be represented by sub-string correlithm object 3206c, as illustrated in FIG. 33A. Moreover, a Person A may have many such multi-directional relationships that can be represented using multiple bidirectional string correlithm objects 3210 that each intersect at a Person A that is represented by a sub-string correlithm object 3206a, as illustrated in FIG. 33B. Although these embodiments were described with respect to the relationships between people, it should be understood that a bidirectional string correlithm object 3210 may be used to represent many different types of relationships between many different types of data elements.

Figure 34:
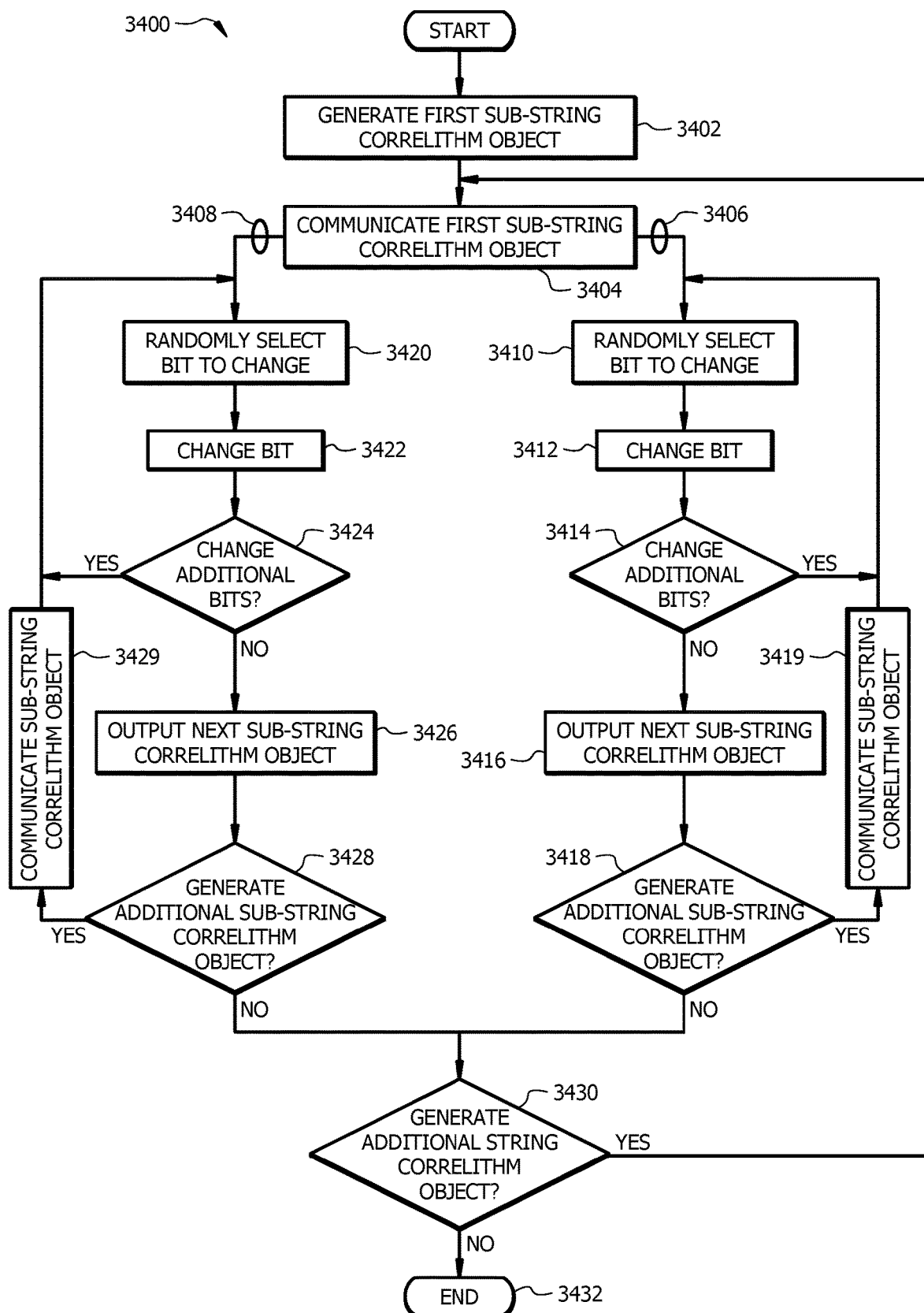
FIG. 34 illustrates an embodiment of a process for generating bidirectional string correlithm objects and intersecting multiple string correlithm objects.

FIG. 34 is a flowchart of an embodiment of a process 3400 for generating a bidirectional string correlithm object 3210 and/or a multiple string correlithm object 3230. At step 3402, a first sub-string correlithm object 3206a is generated, such as by a first processing stage 3202a of a bidirectional string correlithm object generator 3200. The first sub-string correlithm object 3206a comprises an n-bit digital word. At step 3404, the first sub-string correlithm object 3206a is communicated to the second processing stage 3202b in conjunction with extending the bidirectional string correlithm object 3210 in a first n-dimensional direction, as indicated by path 3406, and to a third processing stage 3202c in conjunction with extending the bidirectional string correlithm object 3210 in a second n-dimensional direction, as indicated by path 3408.

Referring to path 3406, execution proceeds to step 3410 where a bit of the n-bit digital word of the received sub-string correlithm object 3206 is randomly selected, and is changed at step 3412 from a zero to a one or from a one to a zero. Execution proceeds to step 3414 where it is determined whether to change additional bits in the n-bit digital word. In general, process 3400 will change a particular number of bits up to the distance parameter, S. In one embodiment, as described above with regard to FIGS. 32A-B, the distance parameter is four bits. If additional bits remain to be changed in the sub-string correlithm object 3206, then execution returns to step 3410. If all of the bits up to the particular number of bits in the distance parameter have already been changed, as determined at step 3414, then execution proceeds to step 3416 where the next sub-string correlithm object 3206 is output. The other bits of the n-bit digital word in that next sub-string correlithm object 3206 which is output at step 3416 remain the same values as the corresponding bits of the previous sub-string correlithm object 3206.

Execution proceeds to step 3418 where it is determined whether to generate additional sub-string correlithm objects 3206 of the bidirectional string correlithm object 3210 in the first n-dimensional direction. If so, execution proceeds to step 3419 where the newly created sub-string correlithm object 3406 is communicated as feedback to the second processing stage 3202b. Thereafter, execution returns back to step 3410 of path 3406 and the remainder of the process occurs again to change particular bits up to the number of bits in the distance parameter, δ. Each subsequent sub-string correlithm object 3206 is separated from the immediately preceding sub-string correlithm object 3206 in n-dimensional space 102 by a number of bits represented by the distance parameter, δ. If no more sub-string correlithm objects 3206 are to be generated for the bidirectional string correlithm object 3210 in the first n-dimensional direction in conjunction with path 3406, as determined at step 3418, then execution of process 3400 proceeds to step 3430.

Referring to path 3408, execution proceeds to step 3420 where a bit of the n-bit digital word of the received sub-string correlithm object 3206 is randomly selected, and is changed at step 3422 from a zero to a one or from a one to a zero. Execution proceeds to step 3424 where it is determined whether to change additional bits in the n-bit digital word. In general, process 3400 will change a particular number of bits up to the distance parameter, δ. In one embodiment, as described above with regard to FIGS. 32A-B, the distance parameter is four bits. If additional bits remain to be changed in the sub-string correlithm object 3206, then execution returns to step 3420. If all of the bits up to the particular number of bits in the distance parameter have already been changed, as determined at step 3424, then execution proceeds to step 3426 where the next sub-string correlithm object 3206 is output. The other bits of the n-bit digital word in that next sub-string correlithm object 3206 which is output at step 3426 remain the same values as the corresponding bits of the previous sub-string correlithm object 3206.

Execution proceeds to step 3428 where it is determined whether to generate additional sub-string correlithm objects 3206 of the bidirectional string correlithm object 3210 in the second n-dimensional direction. If so, execution proceeds to step 3429 wherein the newly created sub-string correlithm object 3406 is communicated as feedback to the third processing stage 3202c. Thereafter, execution returns back to step 3420 of path 3408 and the remainder of the process occurs again to change particular bits up to the number of bits in the distance parameter, S. Each subsequent sub-string correlithm object 3206 is separated from the immediately preceding sub-string correlithm object 3206 in n-dimensional space 102 by a number of bits represented by the distance parameter, S. If no more sub-string correlithm objects 3206 are to be generated for the bidirectional string correlithm object 3210 in the second n-dimensional direction in conjunction with path 3408, as determined at step 3428, then execution of process 3400 proceeds to step 3430.

At step 3430, it is determined whether to generate additional bidirectional string correlithm objects, such as to form a multiple string correlithm object 3230 with a common central sub-string correlithm object 3206a. If so, then execution returns to step 3404 where the first sub-string correlithm object 3206a is again communicated to a second processing stage 3202b in conjunction with following a first path 3406, and further communicated to a third processing stage 3202c in conjunction with following a second path 3408. Execution of the steps associated with paths 3406 and 3408 proceed as described above. Any number and combination of additional bidirectional string correlithm objects 3210 may be formed as a part of a multiple string correlithm object 3230 based on the outcome of the decision step 3430. If no further bidirectional string correlithm objects 3210 are to be formed as part of the multiple string correlithm object 3230, as determined at decision step 3430, then execution terminates at step 3432.

Figure 35:
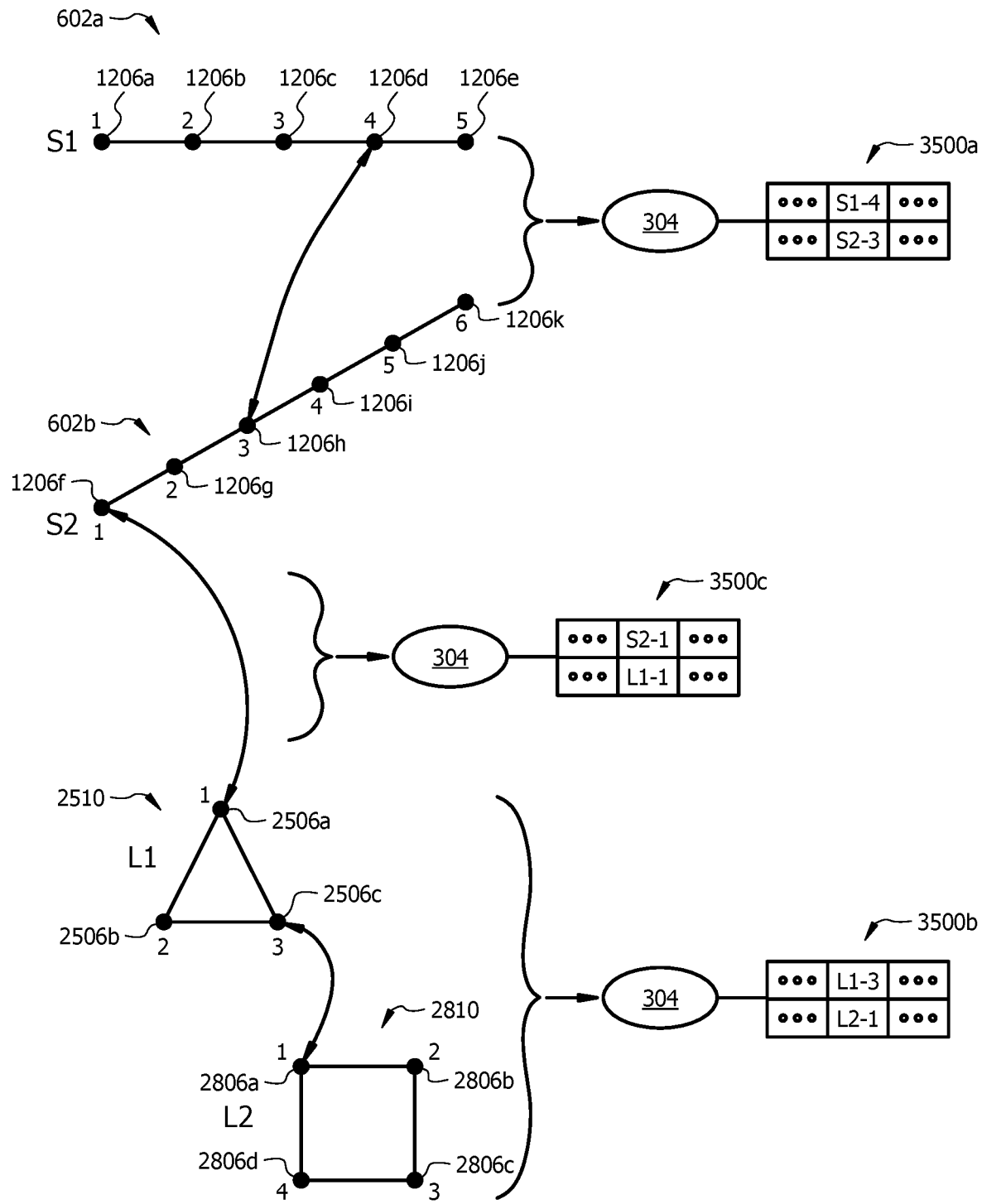
FIG. 35 illustrates embodiments of link nodes.

FIG. 35 illustrates how a first string correlithm object 602a can be linked to a second string correlithm object 602b. The first string correlithm object 602a includes a first plurality of sub-string correlithm objects 1206a-e. For ease of reference, first string correlithm object 602a is referred to as "S1" and first plurality of sub-string correlithm objects 1206a-e are referred to as "S1-1", "S1-2", "S1-3", "S1-4", and "S1-5". Second string correlithm object 602b includes a second plurality of sub-string correlithm objects 1206f-k. For ease of reference, second string correlithm object 602b is referred to as "S2" and second plurality of sub-string correlithm objects 1206f-k are referred to as "S2-1", "S2-2", "S2-3", "S2-4", and "S2-5", and "S2-6". The sub-string correlithm objects 1206a-e and 1206f-k embody an ordering, sequencing, and distance relationships to each other in n-dimensional space 102.

In one embodiment, sub-string correlithm objects 1206a-e of first string correlithm object 602a and sub-string correlithm objects 1206f-k of second string correlithm object 602b can each be represented by a digital word of one length, n. In another embodiment, sub-string correlithm objects 1206a-e of first string correlithm object 602a can each be represented by a digital word of one length, n, and sub-string correlithm objects 1206f-k of second string correlithm object 602b can each be represented by a digital word of a different length, m. Each of the second plurality of sub-string correlithm objects 1206f-k are unrelated to each of the first plurality of sub-string correlithm objects 1206a-e, in n-dimensional space 102. For example, in a particular embodiment, none of the first plurality of sub-string correlithm objects 1206a-e has a bit value in common with any of the second plurality of sub-string correlithm objects 1206f-k.

A node 304 receives first string correlithm object 602a and second string correlithm object 602b and links at least one sub-string correlithm object 1206a-e with at least one sub-string correlithm object 1206f-k. Because node 304 links together one sub-string correlithm object 1206 with another, it may be referred to as a "link" node 304. A node table 3500a stored in memory 504 associates at least one of the first plurality of sub-string correlithm objects 1206a-e with at least one of the second plurality of sub-string correlithm objects 1206f-k. For example, as illustrated in FIG. 35, node table 3500 associates sub-string correlithm object 1206d, also referred to as "S1-4", of first string correlithm object 602a with sub-string correlithm object 1206h, also referred to as "S2-3", of second string correlithm object 602b.

FIG. 35 further illustrates how a first lattice correlithm object 2510 can be linked to a second lattice correlithm object 2810. The first lattice correlithm object 2510 includes a first plurality of sub-lattice correlithm objects 2506a-c. For ease of reference, first lattice correlithm object 2510 is referred to as "L1" and first plurality of sub-lattice correlithm objects 2506a-c are referred to as "L1-1", "L1-2", and "L1-3". Second lattice correlithm object 2810 includes a second plurality of sub-lattice correlithm objects 2806a-d. For ease of reference, second lattice correlithm object 2810 is referred to as "L2" and second plurality of sub-lattice correlithm objects 2806a-d are referred to as "L2-1", "L2-2", "L2-3", and "L2-4". The sub-lattice correlithm objects 2506a-c and 2806a-d embody an ordering, sequencing, and distance relationships to each other in n-dimensional space 102.

In one embodiment, sub-lattice correlithm objects 2506a-c of first lattice correlithm object 2510 and sub-string correlithm objects 2806a-d of second lattice correlithm object 2810 can each be represented by a digital word of one length, n. In another embodiment, sub-lattice correlithm objects 2506a-c of first lattice correlithm object 2510 can each be represented by a digital word of one length, n, and sub-lattice correlithm objects 2806a-d of second lattice correlithm object 2810 can each be represented by a digital word of a different length, m. Each of the second plurality of sub-lattice correlithm objects 2806a-d are unrelated to each of the first plurality of sub-lattice correlithm objects 2506a-c, in n-dimensional space 102. For example, in a particular embodiment, none of the first plurality of sub-lattice correlithm objects 2506a-c has a bit value in common with any of the second plurality of sub-lattice correlithm objects 2806a-d.

A node 304 receives first lattice correlithm object 2510 and second lattice correlithm object 2810 and links at least one sub-lattice correlithm object 2506a-c with at least one sub-lattice correlithm object 2806a-d. A node table 3500b stored in memory 504 associates at least one of the first plurality of sub-lattice correlithm objects 2506a-c with at least one of the second plurality of sub-lattice correlithm objects 2806a-d. For example, as illustrated in FIG. 35, node table 3500b associates sub-lattice correlithm object 2506c, also referred to as "L1-3", of first lattice correlithm object 2510 with sub-lattice correlithm object 2806a, also referred to as "L2-1", of second lattice correlithm object 2810.

A node 304 may also link together a string correlithm object 602 with a lattice correlithm object 2510 or 2810. In this embodiment, none of the sub-string correlithm objects 1206 of the string correlithm object 602 has a bit value in common with any of the sub-lattice correlithm objects 2506 or 2806 of lattice correlithm objects 2510 or 2810. For example, as illustrated in FIG. 35, a node table 3500c stored in memory 504 associates sub-string correlithm object 1206f of second sub-string correlithm object 602b, also referred to as "S2-1", with sub-lattice correlithm object 2506a of lattice correlithm object 2510, also referred to as "L1-1". Although the description above is detailed with respect to linking string correlithm objects 602, lattice correlithm objects 2510, and lattice correlithm objects 2810 among and between each other, it should be understood that a link node 3400 may be used to link any combination of string correlithm objects 602, bidirectional string correlithm objects 3210, multiple intersect string correlithm objects 3230, triangle lattice correlithm objects 2510, hexagonal lattice correlithm objects 2512, quadrilateral lattice correlithm objects 2810, and irregular lattice correlithm objects 3110 among and between each other.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

To aid the Patent Office, and any readers of any patent issued on this application in interpreting the claims appended hereto, applicants note that they do not intend any of the appended claims to invoke 35 U.S.C. § 112(f) as it exists on the date of filing hereof unless the words "means for" or "step for" are explicitly used in the particular claim.

The invention claimed is:

1. A device configured to emulate a lattice correlithm object generator, comprising:
    a first processing stage that outputs a first sub-lattice correlithm object comprising an n-bit digital word, wherein each bit of the n-bit digital word comprises a value of zero or one;
    a second processing stage communicatively coupled to the first processing stage and that:
        receives the first sub-lattice correlithm object from the first processing stage;
        receives a distance parameter representing a distance in n-dimensional space between adjacent sub-lattice correlithm objects, the distance parameter identifying a particular number of bits;
        for a plurality of bits of the first sub-lattice correlithm object up to the particular number of bits identified by the distance parameter, changes the value from a zero to a one or from a one to a zero; and
        outputs a second sub-lattice correlithm object comprising an n-bit digital word, wherein each bit of the second sub-lattice correlithm object has a value that is based on the value of a corresponding bit of the first sub-lattice correlithm object and the changed values for the particular number of bits identified by the distance parameter; and
    a third processing stage communicatively coupled to the second processing stage and that:
        receives the second sub-lattice correlithm object from the second processing stage;
        for each bit of the second sub-lattice correlithm object that was changed from the first sub-lattice correlithm object up to half of the number of bits identified by the distance parameter, changes the value from a zero to a one or from a one to a zero;
        for each bit of the second sub-lattice correlithm object that is the same from the first sub-lattice correlithm object up to half of the number of bits identified by the distance parameter, changes the value from a zero to a one or from a one to a zero;
        outputs a third sub-lattice correlithm object comprising an n-bit digital word, wherein each bit of the third sub-lattice correlithm object has a value that is based on the value of a corresponding bit of the second sub-lattice correlithm object and the changed values.

2. The device of claim 1, wherein the third processing stage further:
    receives the third sub-lattice correlithm object as feedback from the third processing stage;
    for each bit of the third sub-lattice correlithm object that is different from the first sub-lattice correlithm object up to half of the number of bits identified by the distance parameter, changes the value from a zero to a one or from a one to a zero;
    for each bit of the third sub-lattice correlithm object that is the same from the first sub-lattice correlithm object up to half of the number of bits identified by the distance parameter, changes the value from a zero to a one or from a one to a zero; and
    outputs a fourth sub-lattice correlithm object comprising an n-bit digital word, wherein each bit of the fourth sub-lattice correlithm object has a value that is based on the value of a corresponding bit of the third sub-lattice correlithm object and the changed values.

3. The device of claim 1, wherein the first processing stage receives a dimension parameter as an input, the dimension parameter identifying the number of dimensions, n, in the n-bit digital word for each sub-lattice correlithm object.

4. The device of claim 1, wherein the first sub-lattice correlithm object, the second sub-lattice correlithm object, and the third sub-lattice correlithm object form a lattice correlithm object in which the first sub-lattice correlithm object, the second sub-lattice correlithm object, and the third sub-lattice correlithm object are equidistant from each other in n-dimensional space.

5. The device of claim 1, wherein the distance parameter corresponds to one standard deviation of the n-dimensional space.

6. The device of claim 1, wherein the third processing stage successively outputs a subsequent sub-lattice correlithm object based on changing bit values of the immediately prior sub-lattice correlithm object received as feedback.

7. The device of claim 1, wherein the bits of the first sub-lattice correlithm object that are changed in value for the second sub-lattice correlithm object are selected randomly from the n-bit digital word.

8. The device of claim 1, wherein:
    the first sub-lattice correlithm object has a first core;
    the second sub-lattice correlithm object has a second core; and
    the first core overlaps in n-dimensional space with the second core.

9. A method for generating a lattice correlithm object, comprising:

outputting at a first processing stage a first sub-lattice correlithm object comprising an n-bit digital word, wherein each bit of the n-bit digital word comprises a value of zero or one;

receiving the first sub-lattice correlithm object from the first processing stage at a second processing stage;

receiving at the second processing stage a distance parameter representing a distance in n-dimensional space between adjacent sub-lattice correlithm objects, the distance parameter identifying a particular number of bits;

for a plurality of bits of the first sub-lattice correlithm object up to the particular number of bits identified by the distance parameter, changing the value from a zero to a one or from a one to a zero;

outputting a second sub-lattice correlithm object comprising an n-bit digital word, wherein each bit of the second sub-lattice correlithm object has a value that is based on the value of a corresponding bit of the first sub-lattice correlithm object and the changed values for the particular number of bits identified by the distance parameter;

receiving the second sub-lattice correlithm object from the second processing stage at a third processing stage;

for each bit of the second sub-lattice correlithm object that was changed from the first sub-lattice correlithm object up to half of the number of bits identified by the distance parameter, changing the value from a zero to a one or from a one to a zero;

for each bit of the second sub-lattice correlithm object that is the same from the first sub-lattice correlithm object up to half of the number of bits identified by the distance parameter, changing the value from a zero to a one or from a one to a zero;

outputting a third sub-lattice correlithm object comprising an n-bit digital word, wherein each bit of the third sub-lattice correlithm object has a value that is based on the value of a corresponding bit of the second sub-lattice correlithm object and the changed values.

10. The method of claim 9, further comprising:

receiving at the third processing stage the third sub-lattice correlithm object as feedback;

for each bit of the third sub-lattice correlithm object that is different from the first sub-lattice correlithm object up to half of the number of bits identified by the distance parameter, changing the value from a zero to a one or from a one to a zero;

for each bit of the third sub-lattice correlithm object that is the same from the first sub-lattice correlithm object up to half of the number of bits identified by the distance parameter, changing the value from a zero to a one or from a one to a zero; and outputting a fourth sub-lattice correlithm object comprising an n-bit digital word, wherein each bit of the fourth sub-lattice correlithm object has a value that is based on the value of a corresponding bit of the third sub-lattice correlithm object and the changed values.

11. The method of claim 9, further comprising receiving at the first processing stage a dimension parameter as an input, the dimension parameter identifying the number of dimensions, n, in the n-bit digital word for each sub-lattice correlithm object.

12. The method of claim 9, wherein the first sub-lattice correlithm object, the second sub-lattice correlithm object, and the third sub-lattice correlithm object form a lattice correlithm object in which the first sub-lattice correlithm object, the second sub-lattice correlithm object, and the third sub-lattice correlithm object are equidistant from each other in n-dimensional space.

13. The method of claim 9, wherein the distance parameter corresponds to one standard deviation of the n-dimensional space.

14. The method of claim 9, wherein the bits of the first sub-lattice correlithm object that are changed in value for the second sub-lattice correlithm object are selected randomly from the n-bit digital word.

15. A device configured to emulate a triangular lattice correlithm object generator, comprising:

a first processing stage that outputs a first sub-lattice correlithm object comprising an n-bit digital word, wherein each bit of the n-bit digital word comprises a value of zero or one;

a second processing stage communicatively coupled to the first processing stage and that:

receives the first sub-lattice correlithm object from the first processing stage;

receives a distance parameter representing a distance in n-dimensional space between adjacent sub-lattice correlithm objects, the distance parameter identifying a particular number of bits;

for a plurality of bits of the first sub-lattice correlithm object up to the particular number of bits identified by the distance parameter, changes the value from a zero to a one or from a one to a zero; and outputs a second sub-lattice correlithm object comprising an n-bit digital word, wherein each bit of the second sub-lattice correlithm object has a value that is based on the value of a corresponding bit of the first sub-lattice correlithm object and the changed values for the particular number of bits identified by the distance parameter; and a third processing stage communicatively coupled to the second processing stage and that:

receives the second sub-lattice correlithm object from the second processing stage;

for a plurality of bits of the second sub-lattice correlithm object up to the particular number of bits identified by the distance parameter, changes the value from a zero to a one or from a one to a zero; and outputs a third sub-lattice correlithm object comprising an n-bit digital word, wherein each bit of the third sub-lattice correlithm object has a value that is based on the value of a corresponding bit of the second sub-lattice correlithm object and the changed values.

16. The device of claim 15, wherein the third processing stage further:

receives the third sub-lattice correlithm object as feedback from the third processing stage;

for a plurality of bits of the third sub-lattice correlithm object up to the particular number of bits identified by the distance parameter, changes the value from a zero to a one or from a one to a zero; and outputs a fourth sub-lattice correlithm object comprising an n-bit digital word, wherein each bit of the fourth sub-lattice correlithm object has a value that is based on the value of a corresponding bit of the third sub-lattice correlithm object and the changed values.

17. The device of claim 15, wherein the first processing stage receives a dimension parameter as an input, the dimension parameter identifying the number of dimensions, n, in the n-bit digital word for each sub-lattice correlithm object.

18. The device of claim 15, wherein the first sub-lattice correlithm object, the second sub-lattice correlithm object, and the third sub-lattice correlithm object form a lattice correlithm object in which the first sub-lattice correlithm object, the second sub-lattice correlithm object, and the third sub-lattice correlithm object are equidistant from each other in n-dimensional space.

19. The device of claim 15, wherein the distance parameter corresponds to one standard deviation of the n-dimensional space.

20. The device of claim 15, wherein the third processing stage successively outputs a subsequent sub-lattice correlithm object based on changing bit values of the immediately prior sub-lattice correlithm object received as feedback.

21. The device of claim 15, wherein the bits of the first sub-lattice correlithm object that are changed in value for the second sub-lattice correlithm object are selected randomly from the n-bit digital word.

22. The device of claim 15, wherein:
the first sub-lattice correlithm object has a first core;
the second sub-lattice correlithm object has a second core; and
the first core overlaps in n-dimensional space with the second core.

23. A device configured to emulate a triangular lattice correlithm object generator, comprising:
a first processing stage that outputs a first sub-lattice correlithm object comprising an n-bit digital word, wherein each bit of the n-bit digital word comprises a value of zero or one;
a second processing stage communicatively coupled to the first processing stage and that:
receives the first sub-lattice correlithm object from the first processing stage;
receives a distance parameter representing a distance in n-dimensional space between adjacent sub-lattice correlithm objects, the distance parameter identifying a particular number of bits;
for a plurality of bits of the first sub-lattice correlithm object up to the particular number of bits identified by the distance parameter, changes the value from a zero to a one or from a one to a zero; and
outputs a second sub-lattice correlithm object comprising an n-bit digital word, wherein each bit of the second sub-lattice correlithm object has a value that is based on the value of a corresponding bit of the first sub-lattice correlithm object and the changed values for the particular number of bits identified by the distance parameter; and a third processing stage communicatively coupled to the second processing stage and that:
receives the second sub-lattice correlithm object from the second processing stage;
for each bit of the second sub-lattice correlithm object that was changed from the first sub-lattice correlithm object, changes the value from a zero to a one or from a one to a zero;
for each bit of the second sub-lattice correlithm object that is the same from the first sub-lattice correlithm object up to the number of bits identified by the distance parameter, changes the value from a zero to a one or from a one to a zero; and
outputs a third sub-lattice correlithm object comprising an n-bit digital word, wherein each bit of the third sub-lattice correlithm object has a value that is based on the value of a corresponding bit of the second sub-lattice correlithm object and the changed values.

24. The device of claim 23, wherein the third processing stage further:
receives the third sub-lattice correlithm object as feedback from the third processing stage;
for particular bits of the third sub-lattice correlithm object, changes the value from a zero to a one or from a one to a zero; and
outputs a fourth sub-lattice correlithm object comprising an n-bit digital word, wherein each bit of the fourth sub-lattice correlithm object has a value that is based on the value of a corresponding bit of the third sub-lattice correlithm object and the changed values.

25. The device of claim 23, wherein the first processing stage receives a dimension parameter as an input, the dimension parameter identifying the number of dimensions, n, in the n-bit digital word for each sub-lattice correlithm object.

26. The device of claim 23, wherein the distance parameter corresponds to one standard deviation of the n-dimensional space.

27. The device of claim 23, wherein the third processing stage successively outputs a subsequent sub-lattice correlithm object based on changing bit values of the immediately prior sub-lattice correlithm object received as feedback.

28. The device of claim 23, wherein:
the first sub-lattice correlithm object has a first core;
the second sub-lattice correlithm object has a second core; and
the first core overlaps in n-dimensional space with the second core.

* * * * *